(12) United States Patent
Tsai et al.

(10) Patent No.: US 12,171,083 B2
(45) Date of Patent: Dec. 17, 2024

(54) VARIABLE-PART LIQUID COOLING PUMPING UNIT

(71) Applicant: Cooler Master Co., Ltd., New Taipei (TW)

(72) Inventors: Shui-fa Tsai, New Taipei (TW); Tsung-wei Lin, New Taipei (TW)

(73) Assignee: Cooler Master Co., Ltd., Taipei (TW)

( * ) Notice: Subject to any disclaimer, the term of this patent is extended or adjusted under 35 U.S.C. 154(b) by 507 days.

(21) Appl. No.: 17/408,464

(22) Filed: Aug. 22, 2021

(65) Prior Publication Data
US 2023/0056832 A1 Feb. 23, 2023

(51) Int. Cl.
*F28F 3/12* (2006.01)
*F04D 1/00* (2006.01)
*F04D 29/42* (2006.01)
*F04D 29/44* (2006.01)
*G06F 1/20* (2006.01)
*H05K 7/20* (2006.01)

(52) U.S. Cl.
CPC .......... H05K 7/20272 (2013.01); F04D 1/00 (2013.01); F04D 29/4293 (2013.01); F04D 29/445 (2013.01); F28F 3/12 (2013.01); G06F 1/20 (2013.01); *F28F 2250/08* (2013.01)

(58) Field of Classification Search
CPC ............. F04D 29/4293; H05K 7/20272; F28F 2250/08
See application file for complete search history.

(56) References Cited

U.S. PATENT DOCUMENTS

| 9,441,640 | B2 * | 9/2016 | Park | F04D 29/586 |
|---|---|---|---|---|
| 10,866,031 | B2 * | 12/2020 | Pan | F28F 13/06 |
| 2016/0338223 | A1 * | 11/2016 | Tsai | F28F 13/06 |
| 2016/0363967 | A1 * | 12/2016 | Tsai | H05K 7/20272 |
| 2017/0192471 | A1 * | 7/2017 | Tsai | H01L 23/473 |
| 2017/0347487 | A1 * | 11/2017 | Rudnicki | F28F 13/12 |
| 2018/0139865 | A1 * | 5/2018 | Draht | H01L 23/473 |
| 2018/0340744 | A1 * | 11/2018 | Tsai | F28D 15/00 |
| 2019/0053403 | A1 * | 2/2019 | Lin | H01L 23/427 |
| 2019/0239388 | A1 * | 8/2019 | Tsai | H05K 7/20254 |
| 2020/0117253 | A1 | 4/2020 | Tsai et al. | |
| 2020/0240417 | A1 * | 7/2020 | Shen | F04D 13/066 |
| 2020/0344912 | A1 * | 10/2020 | Lai | H05K 7/20272 |

(Continued)

FOREIGN PATENT DOCUMENTS

| CN | 106981462 A | 7/2017 |
|---|---|---|
| TW | M454562 U | 6/2013 |

*Primary Examiner* — Paul Alvare

(57) ABSTRACT

A variable-part liquid cooling pumping unit, including a water block set, flow guiding plate, and water block cover of a water block unit, and a chamber body of a pump housing assembly of a pump unit is provided. The chamber body includes an impeller cavity inlet, flow adjusting disc, impeller cavity, and impeller cavity outlet opening. Inlet and outlet ports are positioned on a same side. More than one water block unit and pump unit are provided and interchangeable. During operation, working fluid is sucked via the inlet port through the impeller cavity inlet, pass the flow adjusting disc, into the impeller cavity, to a plurality of curved blades of an impeller of a rotor assembly unit. From there, the working fluid travels through the impeller cavity outlet opening, flow guiding plate, and water block set, before exiting through the flow guiding plate, and outlet port.

8 Claims, 34 Drawing Sheets

(56) References Cited

U.S. PATENT DOCUMENTS

2022/0065267 A1\* 3/2022 Tsai .................... F04D 29/5806
2022/0373275 A1\* 11/2022 Mostafavi Yazdi ...... F28F 3/12
2023/0025258 A1\* 1/2023 Tsai ..................... F04D 29/586
2023/0056832 A1\* 2/2023 Tsai .................... F04D 29/4293

\* cited by examiner

VARIABLE-PART LIQUID COOLING PUMPING UNIT

TECHNICAL FIELD

Example embodiments relate generally to the field of heat transfer and, more particularly, to liquid cooling pumping units.

BACKGROUND

During operation of electric and electronic elements, devices and systems, the heat generated thereby, for example, by CPUs, processing units, or graphic boards, must be dissipated quickly and efficiently to keep operating temperature within manufacturer recommended ranges, under, at times, challenging operating conditions. As these elements, devices and systems increase in functionality and applicability, so does the power requirements thereof and this in turn increases cooling requirements.

Several techniques have been developed for extracting heat from electric and electronic elements, devices and systems. One such technique is a liquid-cooling system, whereby a water block unit is in thermal contact with the elements, devices and/or systems, transporting heat away therefrom, and then working fluid, circulating inside of a cooling loop system incorporating the water block unit, flows over the water block unit by a rotor assembly unit, removing heat therefrom. Heat is transferred from the heat source to the water block unit, the water block unit to the working fluid, and the working fluid to the environment by a radiator.

Generally, a maximum operating temperature of electric and electronic elements, devices and systems is defined and an appropriate liquid-cooling system dependent on a water block unit, radiator, and pump unit is provided. Pump efficiency, is determined by head and flow rate, in addition to working fluid properties, impeller design and motor speed. Given a same water block unit and radiator, when a required head is beyond the specifications of one pump, a new bigger and heavier or more than one pump is employed, increasing costs. When pump efficiency is negatively influenced by horizontal or vertical positioning of a pump, a new pump is employed which is not negatively influenced by the required positioning, also increasing costs. Given a same pump unit and radiator, when a required heat source area changes a new pump having a desired heat source area for transporting heat away is employed, increasing costs. In all scenarios, one or more new pumps are required, and pump specification variability through convenient interchangeability of parts with regard to time and mounted parts required, and customization are lacking.

SUMMARY

In an embodiment, a variable-part liquid cooling pumping unit comprising a water block unit and a pump unit is provided. The water block unit comprises a water block set, a water block cover assembled to the water block set, and a flow guiding plate. The pump unit comprises a chamber body mounted to and communicating with the water block cover opposite the water block set. The chamber body comprises an impeller cavity having a diameter and a flow adjusting disc opposite the mounted water block cover. The flow adjusting disc is configured to decrease turbulence of a working liquid flowing into the impeller cavity. The flow guiding plate is assembled to and communicating with and between the water block set and water block cover opposite the mounted chamber body, respectively. The rotor assembly unit is assembled to the chamber body opposite the water block cover. The rotor assembly unit is configured to increase a pressure and a flow of a working liquid flowing through the water block unit. An inlet port and an outlet port of the liquid cooling pumping unit is positioned on a same side of and plane as the pump housing assembly, parallel to planes of the flow guiding plate and rotor assembly unit, respectively.

In certain embodiments, the rotor assembly unit comprises a stator assembly, an impeller, and a rotor housing. The impeller comprises a plurality of curved blades, mounted to a shaft. The rotor housing comprises a stator cavity and an impeller annular cavity opposite the stator cavity. The stator assembly drives the impeller. The stator assembly is mounted in the stator cavity, and the impeller is mounted in the impeller annular cavity opposite the plurality of curved blades. When the rotor assembly unit is assembled to the chamber body, the plurality of curved blades is assembled and rotatable in the impeller cavity of the chamber body.

In certain embodiments, the water block set comprises a water block base and a fin plate. The water block base comprises a base cavity comprising a width, including heat transfer surface features thereon. The fin plate comprises a longitudinal split fin opening therethrough, positioned longitudinally on the heat transfer surface features. The working fluid flows through the longitudinal split fin opening and through the heat transfer surface features. The water block set is in direct or indirect contact with a heat source opposite the base cavity.

In an embodiment, the pump housing assembly is a first pump housing assembly, whereby the inlet and outlet ports are integrally formed with the chamber body. The inlet and outlet ports are configured for mounting of at least one of a spout, or conduit, or any combination of the foregoing thereto. During operation, working fluid is sucked via the inlet port, into the impeller cavity and through the chamber body, water block cover, and flow guiding plate, respectively, and into, throughout and out of the water block set, before exiting through the flow guiding plate, water block cover and outlet port, respectively.

In certain embodiments of the first pump housing assembly, the chamber body further comprises a water block cover surface opposite the impeller cavity, an impeller cavity inlet, an impeller cavity outlet opening, and a chamber body outlet opening. The impeller cavity inlet communicates with the inlet port and impeller cavity, the impeller cavity outlet opening communicates with the impeller cavity and water block cover, and the chamber body outlet opening communicates with the water block cover and outlet port. During operation, working fluid is sucked via the inlet port, into the impeller cavity via the impeller cavity inlet and through the chamber body via the impeller cavity outlet opening, and through the water block cover, and flow guiding plate, respectively, and into, throughout and out of the water block set, before exiting through the flow guiding plate, and water block cover, respectively, and through the chamber body via the chamber body outlet opening, to the outlet port.

In certain embodiments of the first pump housing assembly, the water block cover comprises a flow guiding plate surface having a funnel-shaped indentation therein, a chamber body surface opposite the flow guiding plate surface, a water block inlet through hole, and a water block outlet through hole. The water block inlet through hole communicates with the impeller cavity outlet opening and flow guiding plate, and the water block outlet through hole communicates with the flow guiding plate and outlet port. The water block inlet through hole is disposed at a narrowest end of the funnel-shaped indentation, and the water block outlet through hole is disposed near to the water block inlet through hole. During operation, working fluid is sucked via the inlet port, into the impeller cavity, through the chamber body, and through the water block cover via the water block inlet through hole, and through the flow guiding plate, and into, throughout and out of the water block set, before exiting through the flow guiding plate, and through the water block cover via the water block outlet through hole, and through the chamber body, to the outlet port.

In certain embodiments of the first pump housing assembly, the mounting of the impeller cavity outlet opening and chamber body outlet opening to the water block inlet through hole and water block outlet through hole, respectively, is via corresponding annular wall and shouldered protrusions, respectively.

In certain embodiments, the flow guiding plate comprises a water block surface, a water block cover mounting surface having a funnel-shaped outlined wall protruding therefrom, opposite the water block surface, a longitudinal split through hole, disposed at a widest end of the funnel-shaped outlined wall, and a flow guiding plate outlet, disposed near to a narrowest end of the funnel-shaped outlined wall. The funnel-shaped outlined wall communicates with the water block inlet through hole, the longitudinal split through hole communicates with the water block set and water block inlet through hole, and the flow guiding plate outlet communicates with the water block set and water block outlet through hole. The funnel-shaped outlined wall corresponds to the funnel-shaped indentation, and the longitudinal split through hole corresponds to the longitudinal split fin opening. During operation, working fluid is sucked via the inlet port, into the impeller cavity, through the chamber body, and water block cover, respectively, and through the flow guiding plate via within the funnel-shaped outlined walls through the longitudinal split through hole, and into, throughout and out of the water block set, before exiting through the flow guiding plate via the flow guiding plate outlet, and through the water block cover, and through the chamber body, to the outlet port.

In certain embodiments of the first pump housing assembly, the water block unit is a first water block unit and the width of the base cavity is a first width and the pump unit is a first pump unit and the diameter of the impeller cavity is a first diameter, whereby the first width is shorter than the first diameter.

In certain embodiments of the first pump housing assembly, the water block unit is a second water block unit and the width of the base cavity is a second width and the pump unit is a second pump unit and the diameter of the impeller cavity is a second diameter. In certain embodiments, the second width is longer than the first width and equal to or longer than the second diameter and the second water block unit is interchangeable with the first water block unit, whereby the first pump unit is mounted thereto. In certain embodiments, the second diameter is longer than the first diameter and the second width is shorter than the second diameter and the second pump unit is interchangeable with the first pump unit and mounted to the first water block unit. During operation, working fluid is sucked via the inlet port, into the impeller cavity and through the chamber body, water block cover, and flow guiding plate, respectively, and into, throughout and out of the water block set, and through the flow guiding plate, water block cover, and chamber body, to the outlet port.

In an embodiment, the pump housing assembly is a second pump housing assembly, whereby the inlet and outlet ports are integrally formed with the water block cover. The inlet and outlet ports are configured for mounting of at least one of a spout, or conduit, or any combination of the foregoing thereto. The second pump housing assembly is interchangeable with the first pump housing assembly. During operation, working fluid is sucked via the inlet port, into the impeller cavity and through the chamber body, water block cover, and flow guiding plate, respectively, and into, throughout and out of the water block set, before exiting through the flow guiding plate, to the outlet port.

In certain embodiments of the second pump housing assembly, the chamber body further comprises a water block cover surface opposite the impeller cavity, an impeller cavity inlet opening, and an impeller cavity outlet opening. The impeller cavity inlet opening communicates with the water block cover and impeller cavity, and the impeller cavity outlet opening communicates with the impeller cavity and water block cover. During operation, working fluid is sucked via the inlet port, into the impeller cavity via the impeller cavity inlet opening and through the chamber body via the impeller cavity outlet opening, and through the water block cover, and flow guiding plate, respectively, and into, throughout and out of the water block set, before exiting through the flow guiding plate, to the outlet port.

In certain embodiments of the second pump housing assembly, the water block cover comprises a flow guiding plate surface having a diversion indentation and a funnel-shaped indentation therein, respectively, a chamber body surface opposite the flow guiding plate surface, a cover diversion opening, and a water block inlet through hole. The cover diversion opening communicates with the inlet port and impeller cavity inlet opening, and the water block inlet through hole communicates with the impeller cavity outlet opening and flow guiding plate. The cover diversion opening is disposed at a centric end of the diversion indention near to the inlet port, and the water block inlet through hole is disposed at a narrowest end of the funnel-shaped indentation near to the outlet port. During operation, working fluid is sucked via the inlet port, into the impeller cavity via the cover diversion opening, through the chamber body, and through the water block cover via the water block inlet through hole, and through the flow guiding plate, and into, throughout and out of the water block set, before exiting through the flow guiding plate, to the outlet port.

In certain embodiments of the second pump housing assembly, the mounting of the impeller cavity outlet opening and chamber body outlet opening to the water block inlet through hole and water block outlet through hole, respectively, is via corresponding annular wall protrusions and shouldered indentations, respectively.

In the embodiments, a most efficient pump housing assembly may be selected under horizontal or vertical positioning via mounting between the protrusions and/or indentations of the openings and/or through holes of the chamber body and water block cover, respectively, for greatest pump efficiency.

In certain embodiments of the second pump housing assembly, the flow guiding plate comprises a water block surface, a water block cover mounting surface having a diversion outlined wall and a funnel-shaped outlined wall protruding therefrom, respectively, opposite the water block surface, a longitudinal split through hole, disposed at a widest end of the funnel-shaped outlined wall, and a flow guiding plate outlet, disposed near to a narrowest end of the funnel-shaped outlined wall. The funnel-shaped outlined wall communicates with the cover diversion opening and water block inlet through hole, the longitudinal split through hole communicates with the water block set and water block inlet through hole, and the flow guiding plate outlet communicates with the water block set and outlet port. The diversion outlined wall corresponds to the diversion indentation and the funnel-shaped outlined wall corresponds to the funnel-shaped indentation. The longitudinal split through hole corresponds to the longitudinal split fin opening. During operation, working fluid is sucked via the inlet port, into the impeller cavity via the diversion outlined wall, through the chamber body, and water block cover, respectively, and through the flow guiding plate via within the funnel-shaped outlined walls through the longitudinal split through hole, and into, throughout and out of the water block set, before exiting through the flow guiding plate via the flow guiding plate outlet, to the outlet port.

In an embodiment, the pump housing assembly is a third pump housing assembly, whereby the inlet and outlet ports are integrally formed with the water block cover. The inlet and outlet ports are configured for mounting of at least one of a spout, or conduit, or any combination of the foregoing thereto. The third pump housing assembly is interchangeable with the first pump housing assembly or the second pump housing assembly. During operation, working fluid is sucked via the inlet port, into the impeller cavity and through the chamber body, water block cover, and flow guiding plate, respectively, and into, throughout and out of the water block set, before exiting through the flow guiding plate, to the outlet port.

In certain embodiments of the third pump housing assembly, the chamber body further comprises a water block cover surface opposite the impeller cavity, an impeller cavity inlet opening, and an impeller cavity outlet opening. The impeller cavity inlet opening communicates with the water block cover and impeller cavity, and the impeller cavity outlet opening communicates with the impeller cavity and water block cover. During operation, working fluid is sucked via the inlet port, into the impeller cavity via the impeller cavity inlet opening and through the chamber body via the impeller cavity outlet opening, and through the water block cover, and flow guiding plate, respectively, and into, throughout and out of the water block set, before exiting through the flow guiding plate, to the outlet port.

In certain embodiments of the third pump housing assembly, the water block cover comprises a flow guiding plate surface having a diversion indentation and a funnel-shaped indentation therein, respectively, a chamber body surface opposite the flow guiding plate surface, a cover diversion opening, and a water block inlet through hole. The cover diversion opening communicates with the inlet port and impeller cavity inlet opening, and the water block inlet through hole communicates with the impeller cavity outlet opening and flow guiding plate. The cover diversion opening is disposed at a centric end of the diversion indention near to the inlet port, and the water block inlet through hole is disposed at a narrowest end of the funnel-shaped indentation near to the outlet port. During operation, working fluid is sucked via the inlet port, into the impeller cavity via the cover diversion opening, through the chamber body, and through the water block cover via the water block inlet through hole, and through the flow guiding plate, and into, throughout and out of the water block set, before exiting through the flow guiding plate, to the outlet port.

In certain embodiments of the third pump housing assembly, the mounting of the impeller cavity outlet opening and chamber body outlet opening to the water block inlet through hole and water block outlet through hole, respectively, is via corresponding annular wall and shouldered protrusions, respectively.

In certain embodiments of the third pump housing assembly, the flow guiding plate comprises a water block surface, a water block cover mounting surface having a diversion outlined wall and a funnel-shaped outlined wall protruding therefrom, respectively, opposite the water block surface, a longitudinal split through hole, disposed at a widest end of the funnel-shaped outlined wall, and a flow guiding plate outlet, disposed near to a narrowest end of the funnel-shaped outlined wall. The funnel-shaped outlined wall communicates with the cover diversion opening and water block inlet through hole, the longitudinal split through hole communicates with the water block set and water block inlet through hole, and the flow guiding plate outlet communicates with the water block set and outlet port. The diversion outlined wall corresponds to the diversion indentation and the funnel-shaped outlined wall corresponds to the funnel-shaped indentation. The longitudinal split through hole corresponds to the longitudinal split fin opening. During operation, working fluid is sucked via the inlet port, into the impeller cavity via the diversion outlined wall, through the chamber body, and water block cover, respectively, and through the flow guiding plate via within the funnel-shaped outlined walls through the longitudinal split through hole, and into, throughout and out of the water block set, before exiting through the flow guiding plate via the flow guiding plate outlet, to the outlet port.

In certain embodiments of the third pump housing assembly, the water block unit is a third water block unit and the width of the base cavity is a third width and the pump unit is a third pump unit and the diameter of the impeller cavity is a third diameter, whereby the third width is shorter than the third diameter.

In certain embodiments of the third pump housing assembly, the water block unit is a fourth water block unit and the width of the base cavity is a fourth width and the pump unit is a fourth pump unit and the diameter of the impeller cavity is a fourth diameter. In certain embodiments, the fourth width is longer than the third width and equal to or longer than the fourth diameter and the fourth water block unit is interchangeable with the third water block unit, whereby the third pump unit is mounted thereto. In certain embodiments, the fourth diameter is longer than the third diameter and the fourth width is shorter than the fourth diameter and the fourth pump unit is interchangeable with the third pump unit and mounted to the third water block unit. During operation, working fluid is sucked via the inlet port, into the impeller cavity and through the chamber body, water block cover, and flow guiding plate, respectively, and into, throughout and out of the water block set, and through the flow guiding plate, to the outlet port.

In the embodiments, the impeller cavity inlet, impeller cavity, and impeller cavity outlet opening of the pump housing assembly contribute to the positional ability of the inlet and outlet ports to be on the same side of and plane as the pump housing assembly. Thus, more than one pump housing assembly, more than one water block unit, and more than one pump unit, can be interchangeably mounted within the variable-part liquid cooling pumping unit.

In certain embodiments, the pump housing assembly, flow guiding plate, and rotor assembly unit comprises at least one of a metal, plastic, or metal coated material, or any combination of the foregoing.

In certain embodiments, the water block set comprises at least one of an aluminum, copper, aluminum-alloy, or copper-alloy material, or any combination of the foregoing.

BRIEF DESCRIPTION OF THE DRAWINGS

Unless specified otherwise, the accompanying drawings illustrate aspects of the innovative subject matter described herein. Referring to the drawings, wherein like reference numerals indicate similar parts throughout the several views, several examples of water block unit systems incorporating aspects of the presently disclosed principles are illustrated by way of example, and not by way of limitation.

DETAILED DESCRIPTION

Figure 1A:
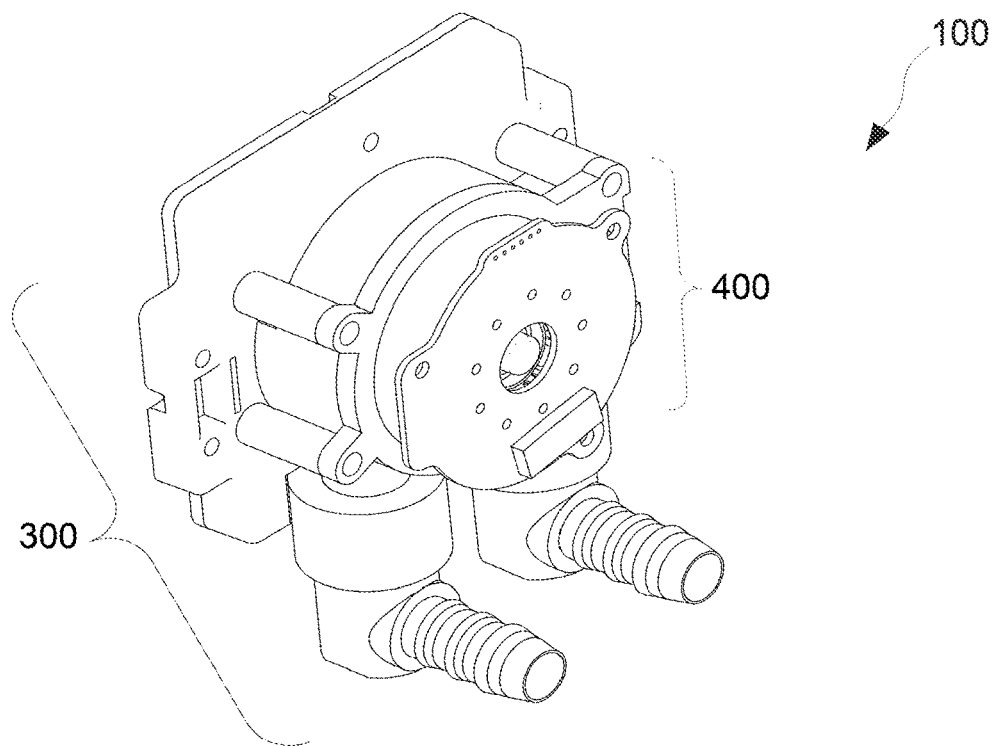
FIG. 1A depicts a representation of an embodiment of a variable-part liquid cooling pumping unit.

The following describes various principles related to variable-part liquid cooling systems by way of reference to specific examples of water block units and rotor assembly units, including specific arrangements and examples of water block units, pump units, and flow guiding plates embodying innovative concepts. More particularly, but not exclusively, such innovative principles are described in relation to selected examples of water block covers and chamber bodies and well-known functions or constructions are not described in detail for purposes of succinctness and clarity. Nonetheless, one or more of the disclosed principles can be incorporated in various other embodiments of water block covers and chamber bodies to achieve any of a variety of desired outcomes, characteristics, and/or performance criteria.

Thus, variable-part liquid cooling pumping units having attributes that are different from those specific examples discussed herein can embody one or more of the innovative principles, and can be used in applications not described herein in detail. Accordingly, embodiments of variable-part liquid cooling pumping units not described herein in detail also fall within the scope of this disclosure, as will be appreciated by those of ordinary skill in the relevant art following a review of this disclosure.

Example embodiments as disclosed herein are directed to variable-part liquid cooling systems, wherein a water block unit is in thermal contact with electric and/or electronic elements, devices and/or systems, transporting heat away therefrom, and then working fluid, circulating inside of a cooling loop system incorporating the water block unit via fluid conduits, flows over the water block unit by a pump unit, removing heat therefrom. The heated working fluid is output from the variable-part liquid cooling system and may be input to a radiator. Next, the heated working fluid may flow to and through the radiator, whereby, the radiator may have a plurality of heat fins thereon for increased heat dissipation. Then the working fluid may flow from the radiator to the variable-part liquid cooling systems to once again begin the cooling loop. Although the cooling loop includes a variable-part liquid cooling system, more than one variable-part liquid cooling system may be coupled to the radiator. In this manner, multiple variable-part liquid cooling systems and/or a larger heat generating area may be cooled. Each of the variable-part liquid cooling systems may be adjacently configured in rows or differently, allowing for design flexibility enabling application-specific configurations.

The variable-part liquid cooling system may be configured within a chassis or as part of an electric or electronics system that includes heat generating devices to be cooled. The variable-part liquid cooling system includes at least one liquid-based cooling loop, and may further comprise one or more fans. The one or more fans may be coupled to the back end of a radiator via a fastener (e.g., bolts, screws, an adhesive material, etc.) at structural portions of the radiator, transporting air through the radiator to an air plenum or to an outside of the chassis or electric or electronics system.

In an embodiment, a variable-part liquid cooling pumping unit comprising a water block unit having a water block set, flow guiding plate, and water block cover, and a pump unit having a pump housing assembly is provided. The pump housing assembly comprises an impeller cavity inlet, flow adjusting disc, impeller cavity, and impeller cavity outlet opening. Inlet and outlet ports are positioned on a same side of and plane as the pump housing assembly. More than one more than one pump housing assembly, more than one water block unit, and more than one pump unit are provided and interchangeable, respectively. During operation, working fluid is sucked via the inlet port through the impeller cavity inlet pass the flow adjusting disc into the impeller cavity to a plurality of curved blades of an impeller of the rotor assembly unit. From there, the working fluid travels through the impeller cavity outlet opening, flow guiding plate, and water block set, before exiting through the flow guiding plate, and outlet port. The disposition, design and functional efficiency of the impeller cavity inlet, impeller cavity, and impeller cavity outlet opening, along with the flow adjusting disc being configured to decrease turbulence of the working liquid flowing into the impeller cavity and the interrelated features of the water block cover, contribute to the positional ability of the inlet and outlet ports to be on the same side of and plane as the pump housing assembly. More than one pump housing assembly, more than one water block unit, and more than one pump unit can be interchangeably mounted within the variable-part liquid cooling pumping unit, respectively. Also, pump efficiency is not negatively influenced by horizontal or vertical positioning of a pump via the selectivity of choosing the most efficient pump housing assembly based on the disposition of the water block inlet through hole and water block outlet through hole or cover diversion opening and water block inlet through hole, respectively, and the mounting of the impeller cavity outlet opening and chamber body outlet opening to the water block inlet through hole and water block outlet through hole, respectively, or the impeller cavity inlet opening and impeller cavity outlet opening to the cover diversion opening and water block inlet through hole, respectively, via corresponding annular wall and shouldered protrusions, respectively, or corresponding annular wall protrusions and shouldered indentations, respectively.

Figure 1B:
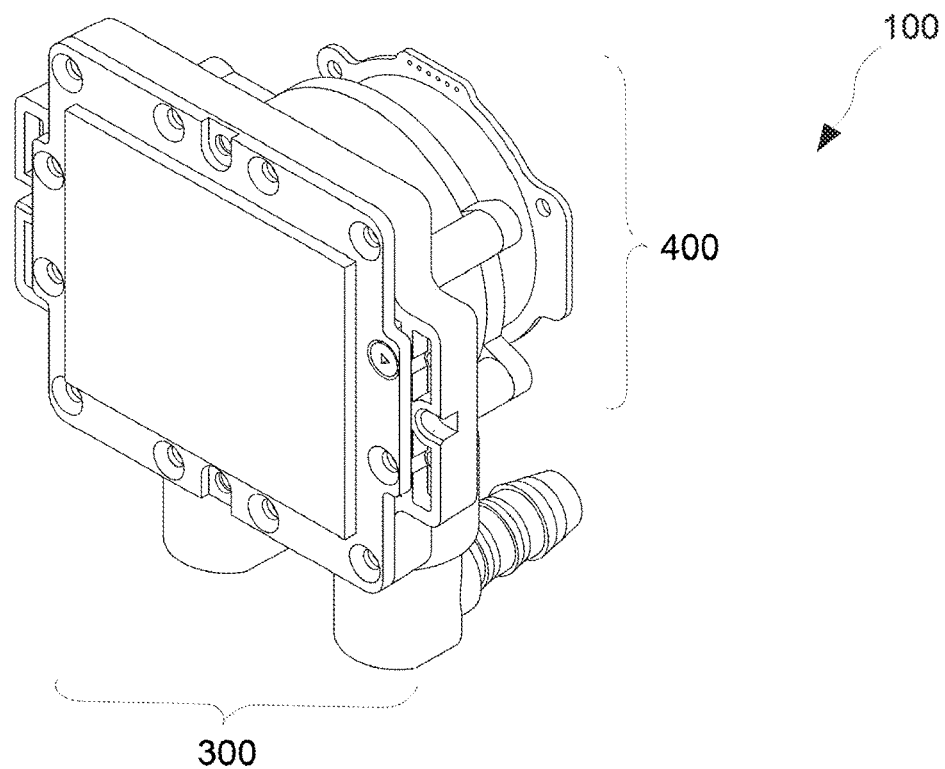
FIG. 1B depicts another representation of the embodiment of the variable-part liquid cooling pumping unit of FIG. 1A.
Figure 2A:
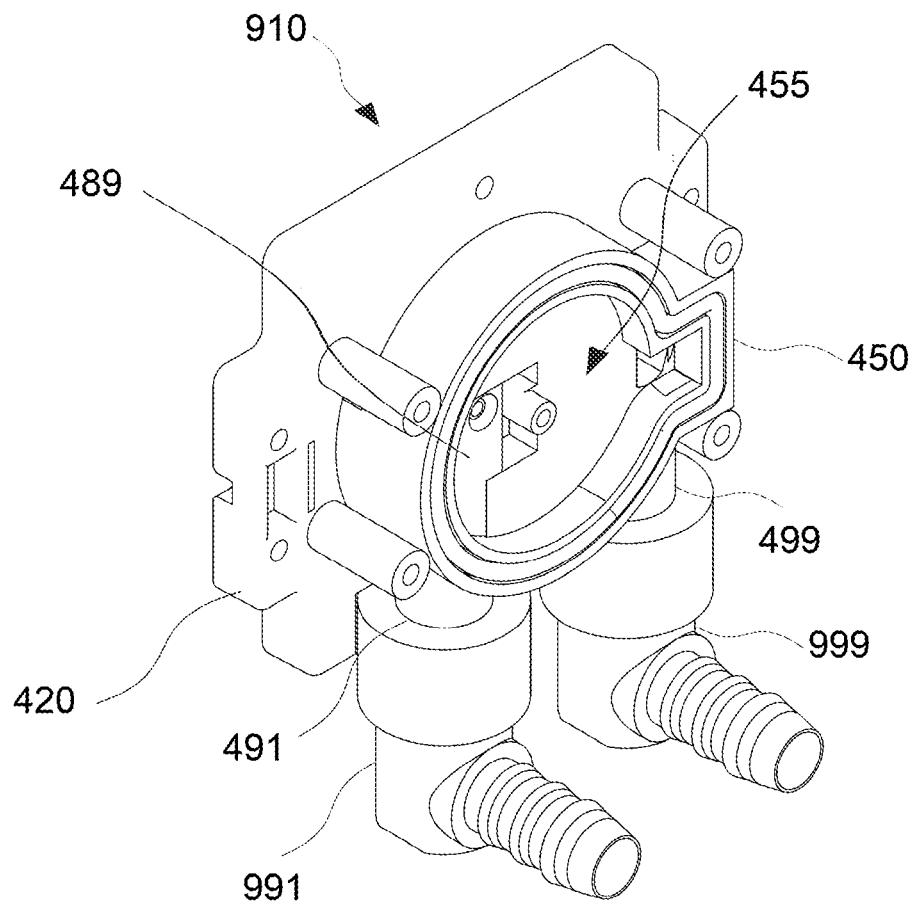
FIG. 2A depicts a representation of an embodiment of a pump housing assembly mounted to a water block unit of FIG. 1A.
Figure 2B:
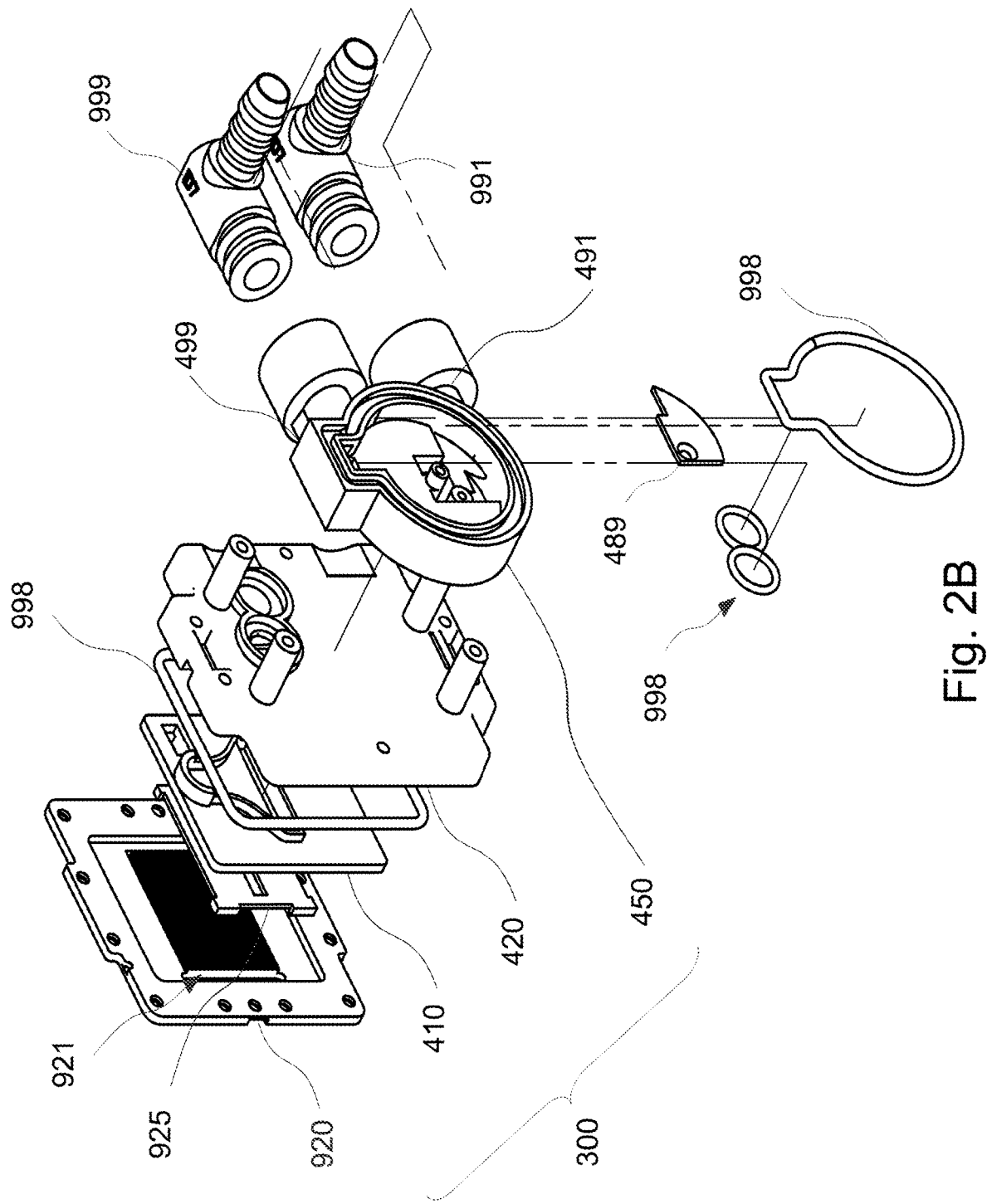
FIG. 2B depicts an exploded view of the embodiment of the pump housing assembly mounted to the water block unit of FIG. 2A.
Figure 2C:
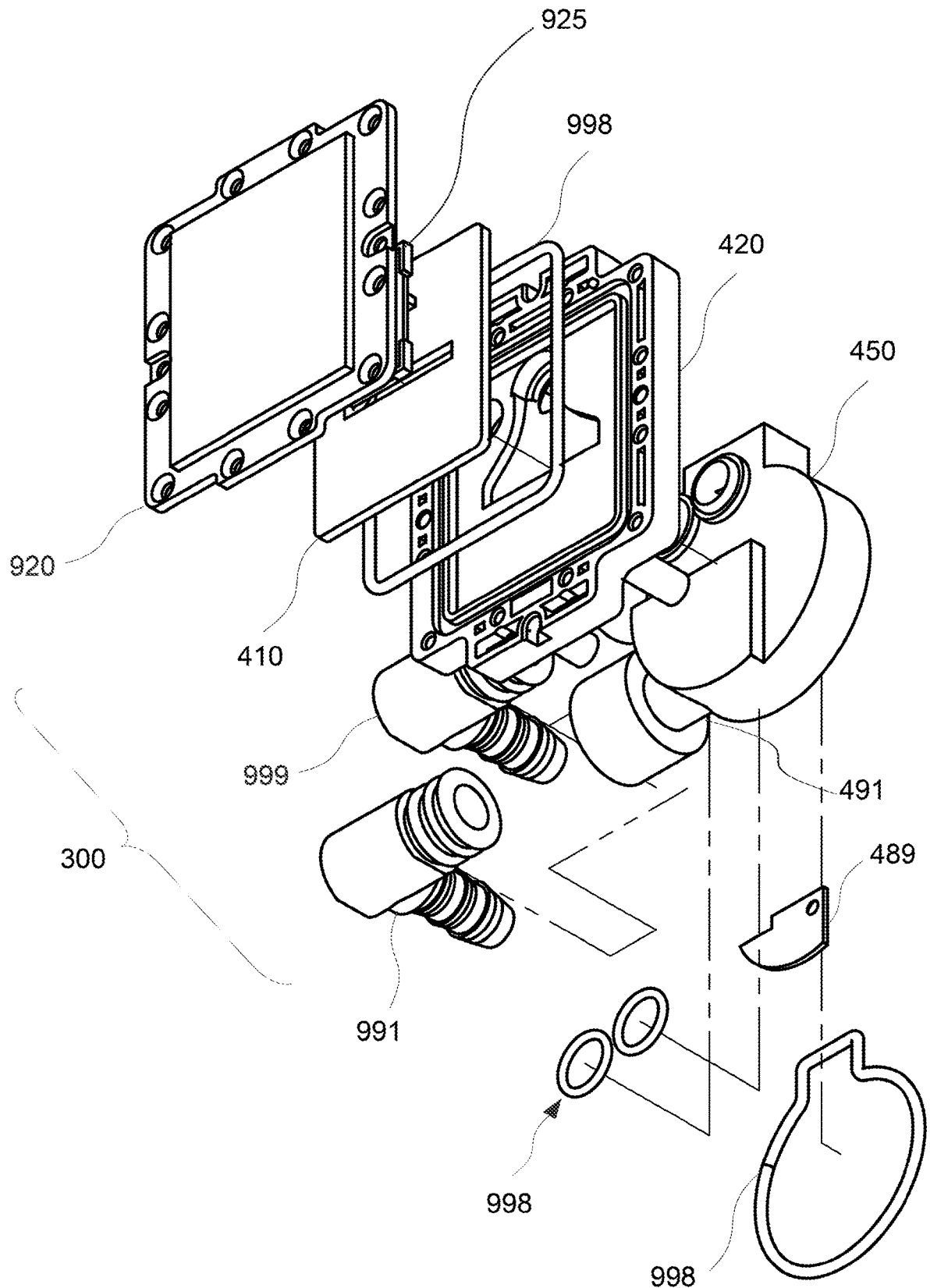
FIG. 2C depicts another exploded view of the embodiment of the pump housing assembly mounted to the water block unit of FIG. 2A.

FIGS. 1A and 1B depict representations of an embodiment of a variable-part liquid cooling pumping unit 100, respectively. FIG. 2A depicts a representation and FIGS. 2B and 2C depict exploded views of an embodiment of a pump housing assembly 400 mounted to a water block unit 300 of the variable-part liquid cooling pumping unit 100, respectively.

In the embodiments, a variable-part liquid cooling pumping unit 100, 101, 102, 500, 701, 103 comprising a water block unit 300, 301, 600, 800 and a pump unit 400, 401, 200, 201, 202 mounted to the water block unit 300, 301, 600, 800 is provided. The water block unit 300, 301, 600, 800 comprises a water block set 910, 911, a water block cover 420, 421, 720, 120 assembled to the water block set 910, 911, and a flow guiding plate 410, 710, 110. The pump unit 400, 401, 200, 201, 202 comprises a chamber body 450, 448, 750, 150, 149 mounted to and communicating with the water block cover 420, 421, 720, 120 opposite the water block set 910, 911. The chamber body 450, 448, 750, 150, 149 comprises an impeller cavity 455, 755, 155 having a diameter and a flow adjusting disc 489, 789, 189 opposite the mounted water block cover 420, 421, 720, 120. The flow adjusting disc 489, 789, 189 is configured to decrease turbulence of a working liquid flowing into the impeller cavity 455, 755, 155. The flow guiding plate 410, 710, 110 is assembled to and communicating with and between the water block set 910, 911 and water block cover 420, 421, 720, 120 opposite the mounted chamber body 450, 448, 750, 150, 149, respectively. The rotor assembly unit 200 is assembled to the chamber body 450, 448, 750, 150, 149 opposite the water block cover 420, 421, 720, 120. The rotor assembly unit 200 is configured to increase a pressure and a flow of a working liquid flowing through a water block unit 300, 301, 600, 800. An inlet port 491, 490, 791, 191 and an outlet port 499, 498, 799, 199 of the liquid cooling pumping unit is positioned on a same side and plane as the pump housing assembly 400, 401, 700, 900, parallel to planes of the flow guiding plate 410, 710, 110 and rotor assembly unit 200, respectively.

Figure 3A:
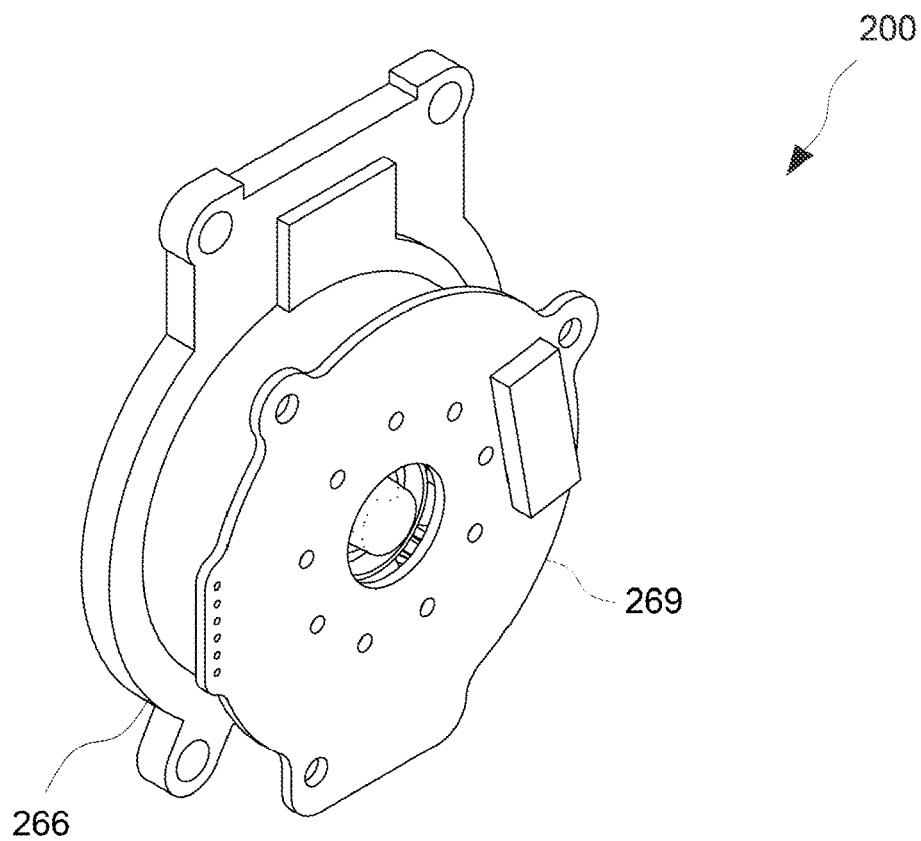
FIG. 3A depicts a representation of an embodiment of a rotor assembly unit of FIG. 1A.
Figure 3B:
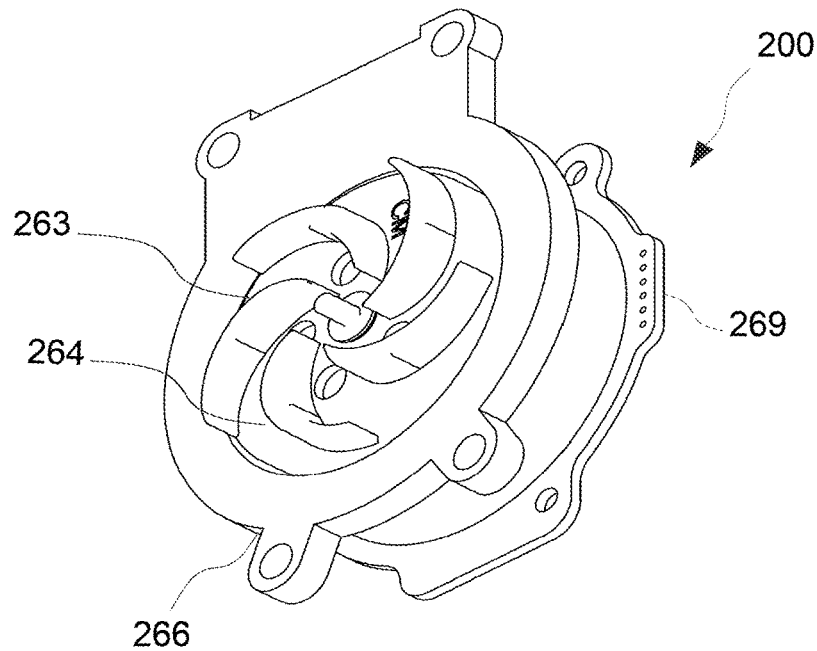
FIG. 3B depicts another representation of the embodiment of the rotor assembly unit of FIG. 3A.
Figure 3C:
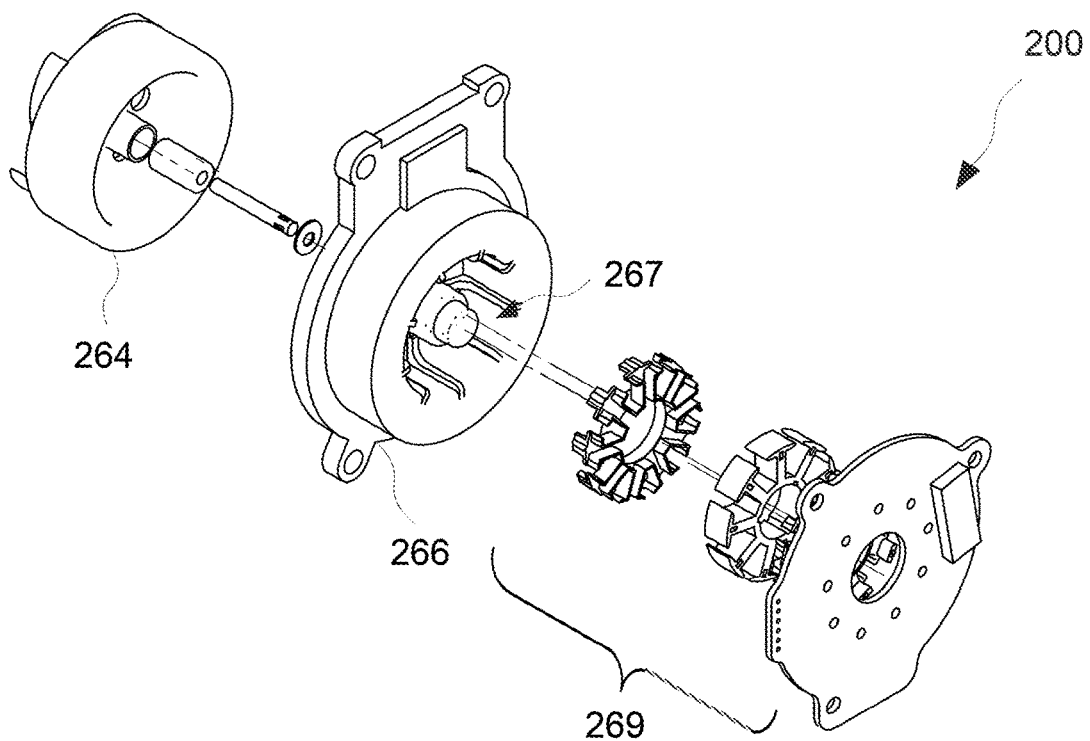
FIG. 3C depicts an exploded view of the embodiment of the rotor assembly unit of FIG. 3A.
Figure 3D:
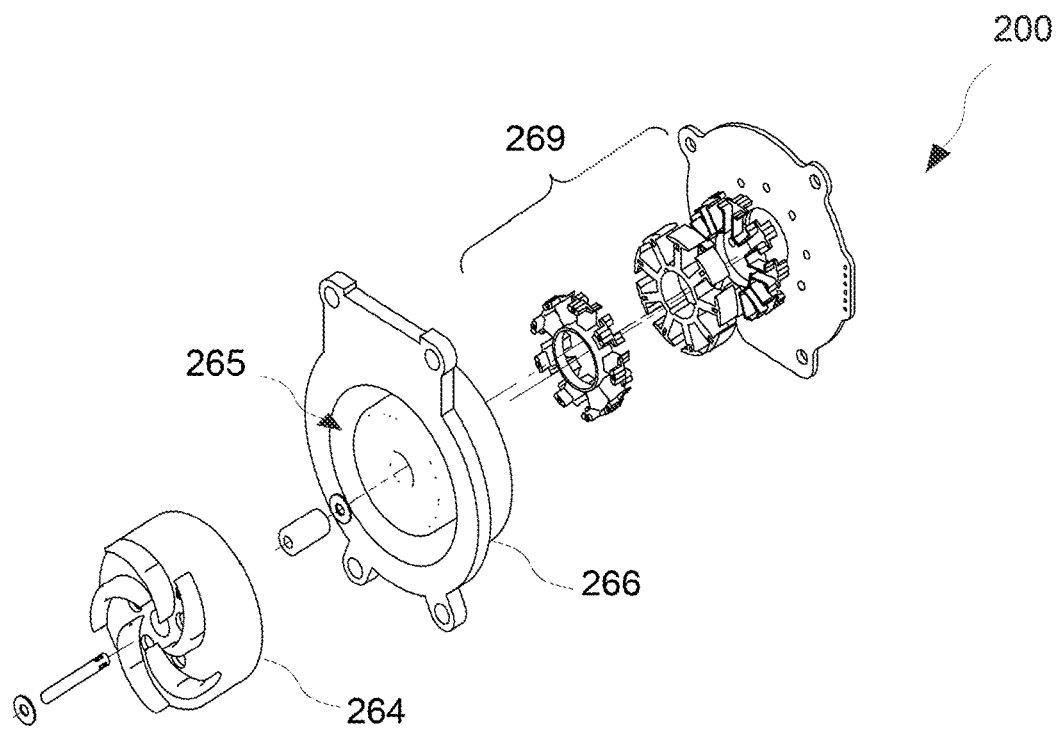
FIG. 3D depicts another exploded view of the embodiment of the rotor assembly unit of FIG. 3A.
Figure 4:
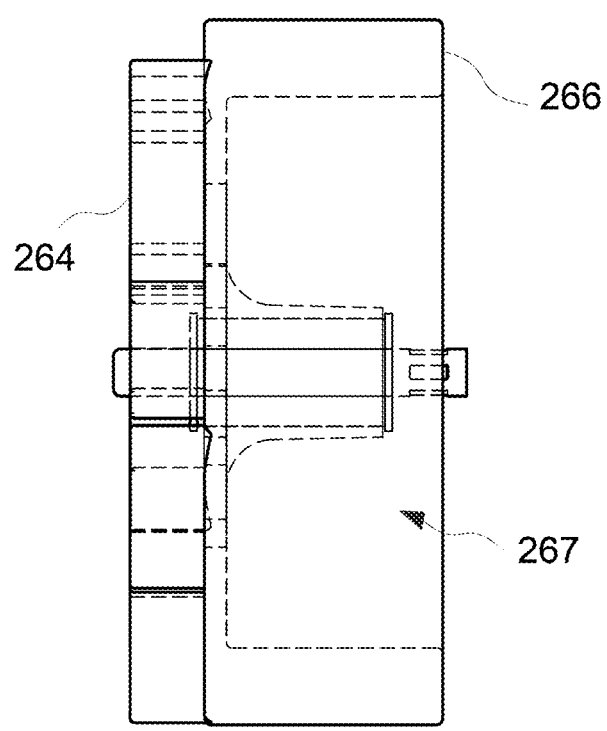
FIG. 4 depicts a cross-sectional view of the embodiment of a rotor assembly unit without a stator assembly of FIG. 1A.
Figure 5A:
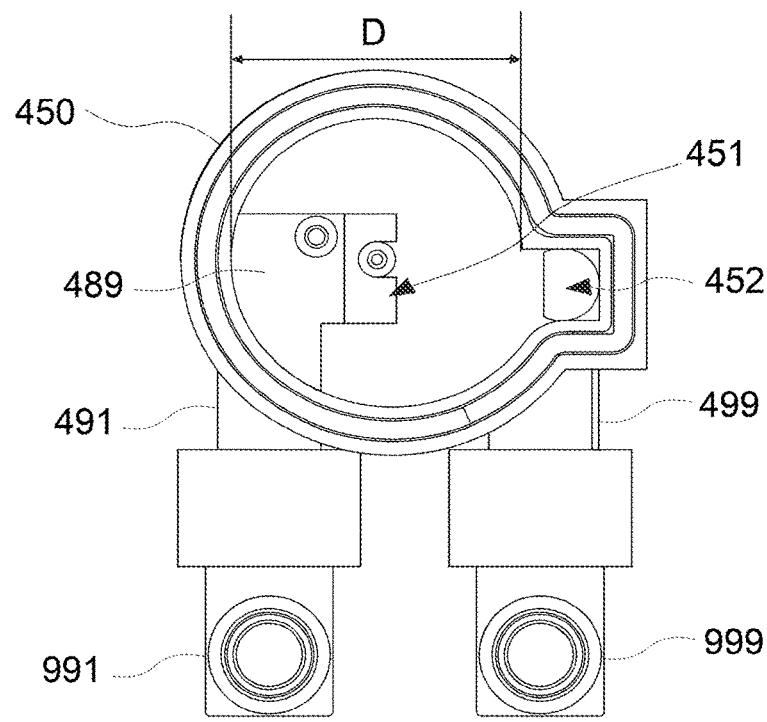
FIG. 5A depicts a representation of an embodiment of a chamber body having a flow adjusting disc of FIG. 1A.
Figure 5B:
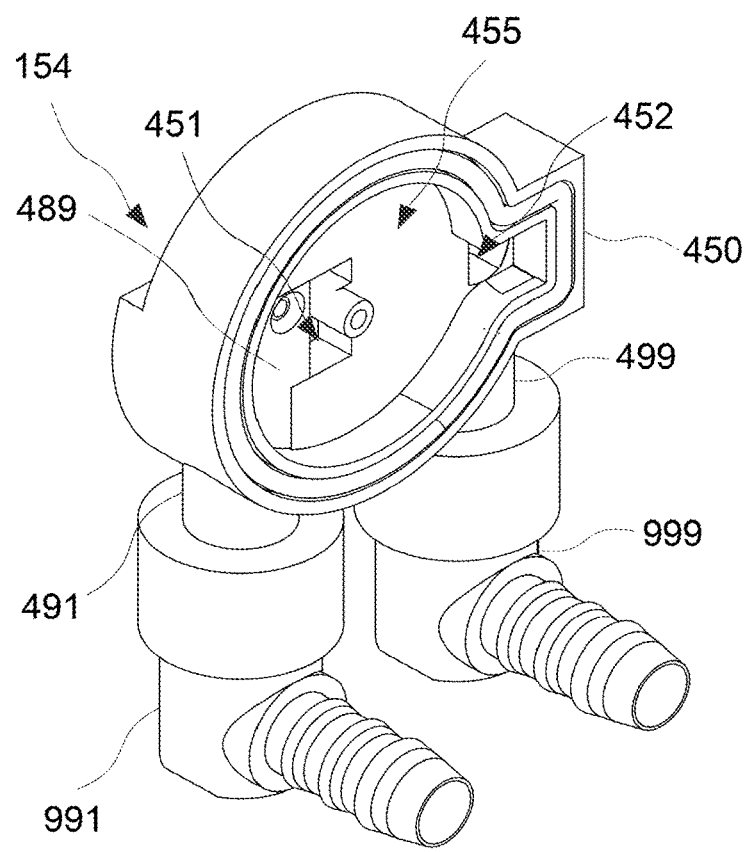
FIG. 5B depicts another representation of the embodiment of the chamber body having the flow adjusting disc of FIG. 5A.
Figure 5C:
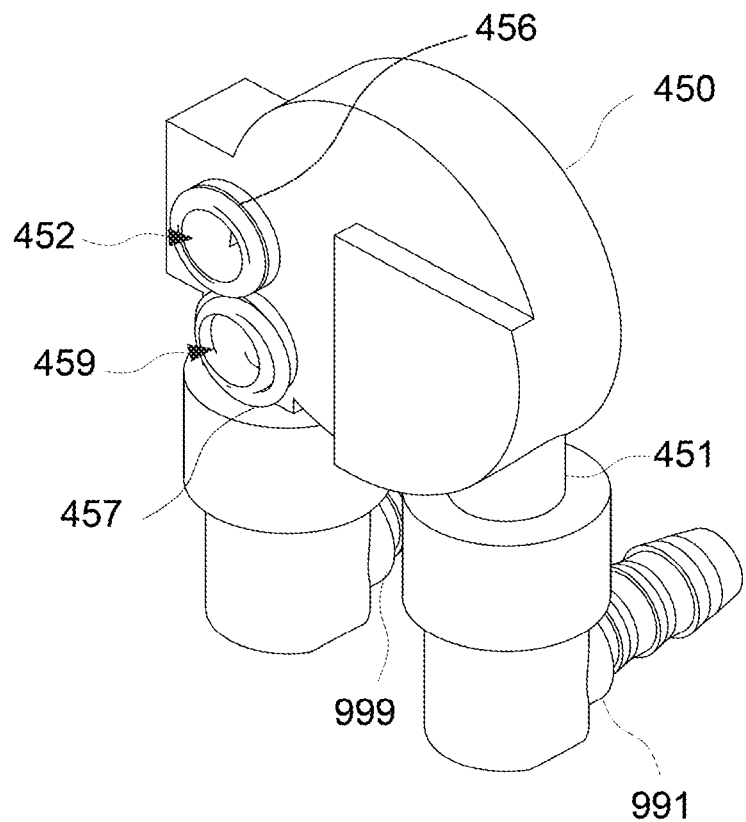
FIG. 5C depicts yet another representation of the embodiment of the chamber body having the flow adjusting disc of FIG. 5A.
Figure 6:
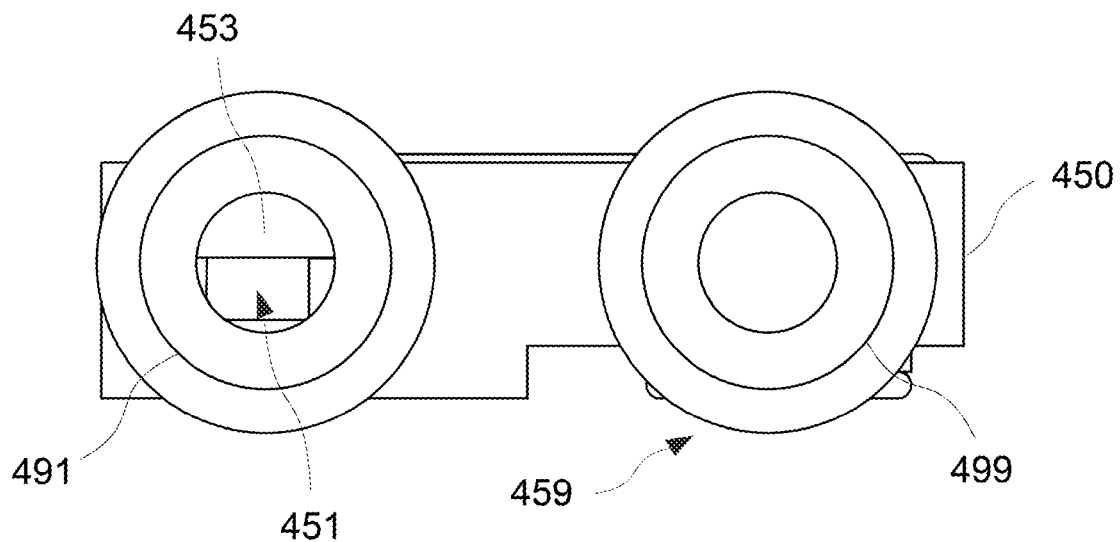
FIG. 6 depicts another representation of the embodiment of the chamber body without spouts of FIG. 5A.
Figure 7A:
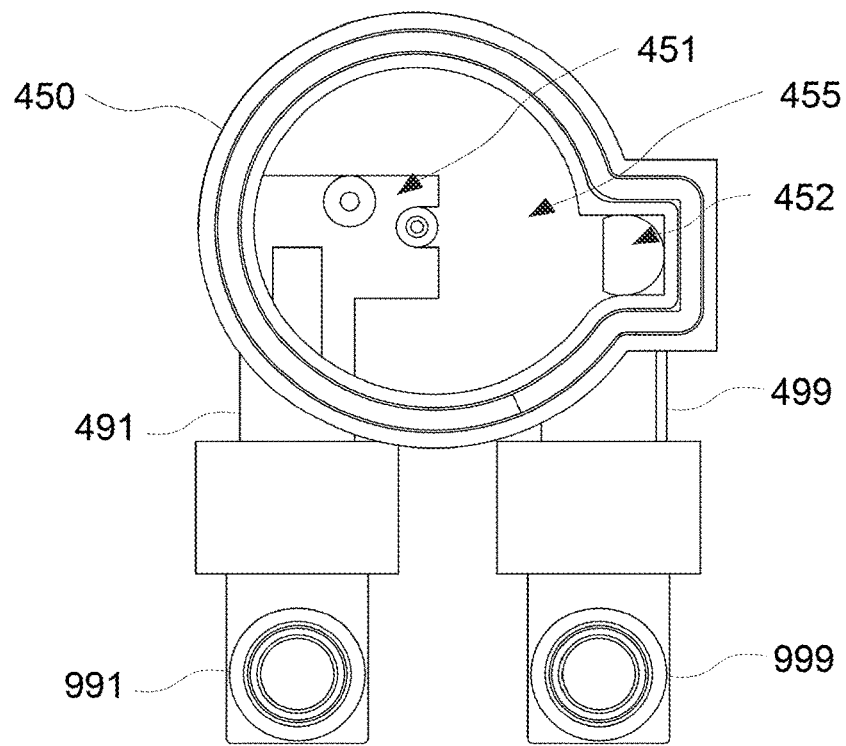
FIG. 7A depicts a representation of an embodiment of a chamber body without a flow adjusting disc of FIG. 1A.
Figure 7B:
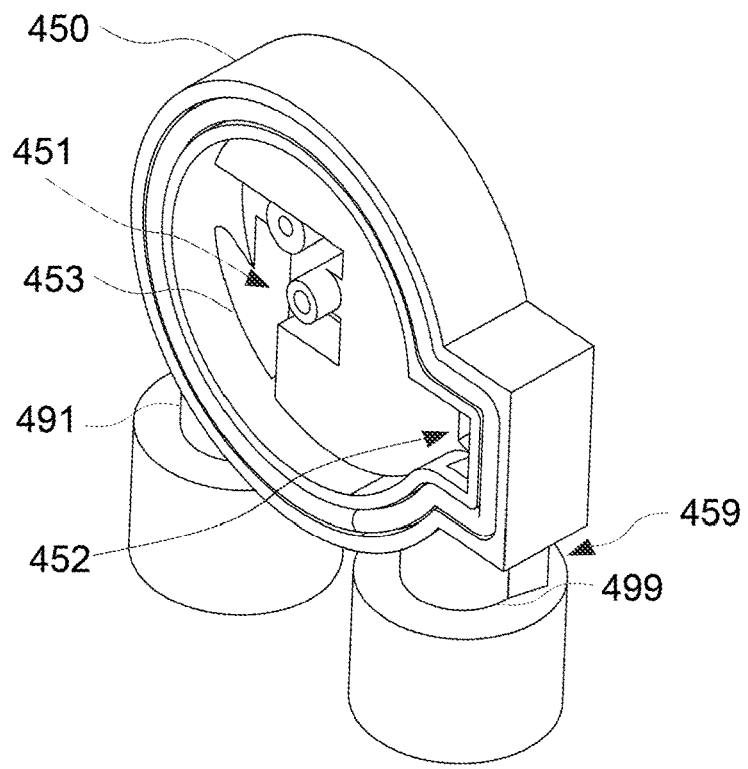
FIG. 7B depicts another representation of the embodiment of the chamber body without the flow adjusting disc of FIG. 7A.

In the embodiments, the rotor assembly unit 200 comprises a stator assembly 269, an impeller 264, and a rotor housing 266. FIGS. 3A and 3B depict representations and 3C and 3D depict exploded views of an embodiment of a rotor assembly unit 200 of the variable-part liquid cooling pumping unit 100, 101, 102, 500, 701, 103, respectively. FIG. 4 depicts a cross-sectional view of the embodiment of a rotor assembly unit 200 without a stator assembly 269 of the variable-part liquid cooling pumping unit 100, 101, 102, 500, 701, 103. The impeller 264 comprises a plurality of curved blades 263, mounted to a shaft. The rotor housing 266 comprises a stator cavity 267 and an impeller annular cavity 265 opposite the stator cavity 267. The stator assembly 269 drives the impeller 264. The stator assembly 269 is mounted in the stator cavity 267, and the impeller 264 is mounted in the impeller annular cavity 265 opposite the plurality of curved blades 263. When the rotor assembly unit 200 is assembled to the chamber body 450, 448, 750, 150, 149, the plurality of curved blades 263 is mounted and rotatable in the impeller cavity 455, 755, 155 of the chamber body 450, 448, 750, 150, 149.

In the embodiments, the rotor assembly unit 200, chamber body 450, 448, 750, 150, 149, water block cover 420, 421, 720, 120 and water block set 910, 911 are secured together and sealingly attached by bolts (not shown). However, those of ordinary skill in the relevant art may readily appreciate that other convenient fastening means may also be used and the embodiments are not limited thereto. Additionally, sealants, in the form of annular or non-annular gaskets 998 may be configured at the connections between the rotor assembly unit 200, chamber body 450, 448, 750, 150, 149, water block cover 420, 421, 720, 120 and water block set 910, 911, respectively, forming liquid tight connections.

In the embodiments, the water block set 910, 911 comprises a water block base 920 and a fin plate 925. The water block base 920 comprises a base cavity 922 comprising a width, including heat transfer surface features 921 thereon. The fin plate 925 comprises a longitudinal split fin opening 924 therethrough, positioned longitudinally on the heat transfer surface features 921. The working fluid flows through the longitudinal split fin opening 924 and through the heat transfer surface features 921. The water block set 910, 911 is in direct or indirect contact with a heat source opposite the base cavity 922. As an example and not to be limiting, the heat source may be any one or more of CPUs, GPUs, and/or other processing units.

Referring to FIGS. 1A to 2C, in an embodiment, the pump housing assembly 400, 401, 700, 900 is a first pump housing assembly 400, whereby the inlet and outlet ports 491, 499 are integrally formed with the chamber body 450. The inlet and outlet ports 491, 499 are configured for mounting, as an example, with mounting clips 997, of at least one of a spout 991, 999, or conduit, or any combination of the foregoing thereto. During operation, working fluid is sucked via the inlet port 491, into the impeller cavity 455 and through the chamber body 450, water block cover 420, and flow guiding plate 410, respectively, and into, throughout and out of the water block set 910, before exiting through the flow guiding plate 410, water block cover 420 and outlet port 499, respectively.

In certain embodiments of the first pump housing assembly 400, the chamber body 450 further comprises a water block cover surface 354 opposite the impeller cavity 455, an impeller cavity inlet 451, an impeller cavity outlet opening 452, and a chamber body outlet opening 459. FIGS. 5A, 5B and 5C, 6, and 7A and 7B depict representations of an embodiment of a chamber body 450 having a flow adjusting disc 489, not having spouts 991, 999, and not having a flow adjusting disc 489 of the variable-part liquid cooling pumping unit 100, respectively. The impeller cavity inlet 451 communicates with the inlet port 491 and impeller cavity 455, the impeller cavity outlet opening 452 communicates with the impeller cavity 455 and water block cover 420, and the chamber body outlet opening 459 communicates with the water block cover 420 and outlet port 499. The impeller cavity 455 has a diameter D. During operation, working fluid is sucked via the inlet port 491, into the impeller cavity 455 via the impeller cavity inlet 451, and through the chamber body 450 via the impeller cavity outlet opening 452, and through the water block cover 420, and flow guiding plate 410, respectively, and into, throughout and out of the water block set 910, before exiting through the flow guiding plate 410, and water block cover 420, respectively, and through the chamber body 450 via the chamber body outlet opening 459, to the outlet port 499.

In certain embodiments of the first pump housing assembly 400, the chamber body 450 further comprises an impeller cavity ledge 453 disposed overhanging between the inlet port 491 and impeller cavity inlet 451. The impeller cavity ledge 452 is configured to decrease turbulence of a working liquid flowing into the impeller cavity inlet 451.

Figure 8A:
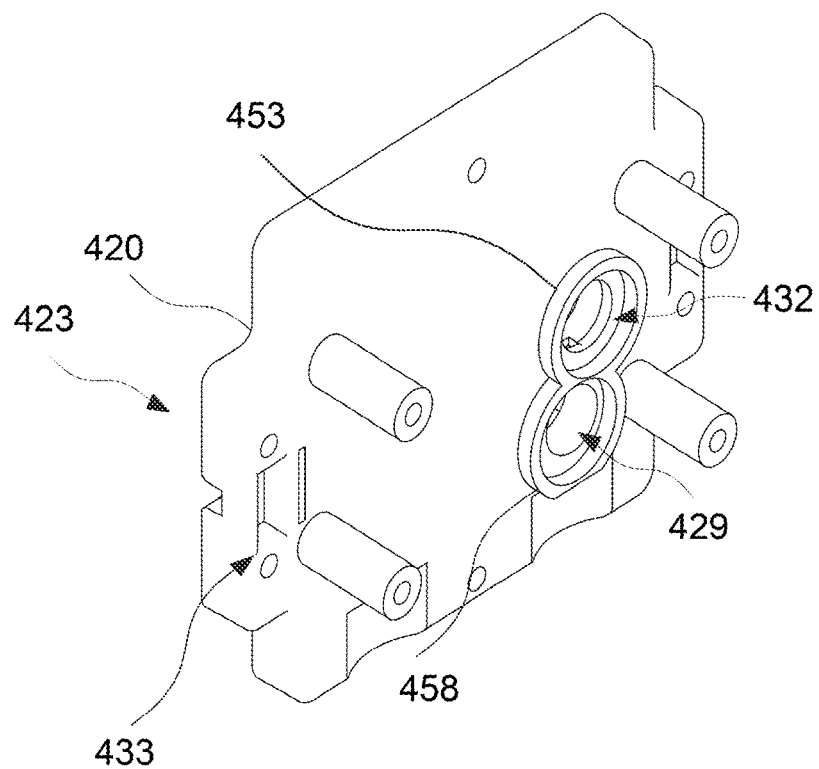
FIG. 8A depicts a representation of an embodiment of a water block cover of FIG. 1A.
Figure 8B:
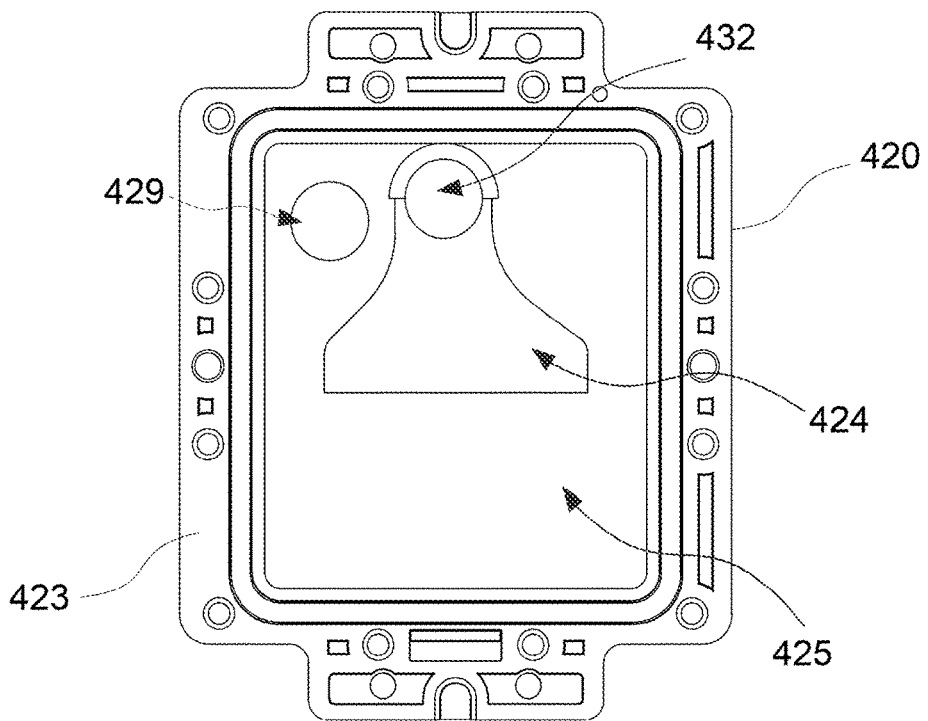
FIG. 8B depicts another representation of the embodiment of the water block cover of FIG. 8A.
Figure 8C:
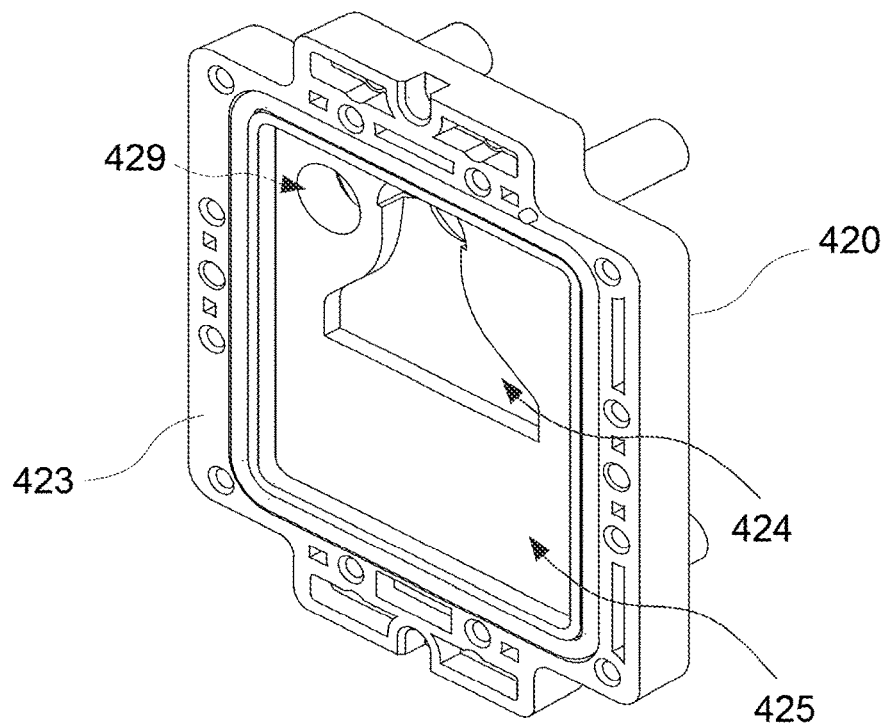
FIG. 8C depicts yet another representation of the embodiment of the water block cover of FIG. 8A.

In certain embodiments of the first pump housing assembly 400, the water block cover 420 comprises a flow guiding plate surface 423 having a cover cavity 425 having a funnel-shaped indentation 424 therein, a chamber body surface 433 opposite the flow guiding plate surface 423, a water block inlet through hole 432, and a water block outlet through hole 429. FIGS. 8A, 8B and 8C depict representations of an embodiment of a water block cover 420 of the variable-part liquid cooling pumping unit 100, respectively. The water block inlet through hole 432 communicates with the impeller cavity outlet opening 452 and flow guiding plate 410 and the water block outlet through hole 429 communicates with the flow guiding plate 410 and outlet port 499. The water block inlet through hole 432 is disposed at a narrowest end of the funnel-shaped indentation 424 and the water block outlet through hole 429 is disposed near to the water block inlet through hole 432. During operation, working fluid is sucked via the inlet port 491 into the impeller cavity 455 through the chamber body 450, and through the water block cover 420 via the water block inlet through hole 432, and through the flow guiding plate 410, and into, throughout and out of the water block set 910, before exiting through the flow guiding plate 410, and through the water block cover 420 via the water block outlet through hole 429, and through the chamber body 450, to the outlet port 499.

In certain embodiments, the mounting of the impeller cavity outlet opening 452 and chamber body outlet opening 459 to the water block inlet through hole 432 and water block outlet through hole 429, respectively, is via corresponding annular wall and shouldered protrusions 456, 457 and 453, 458, respectively.

Figure 9:
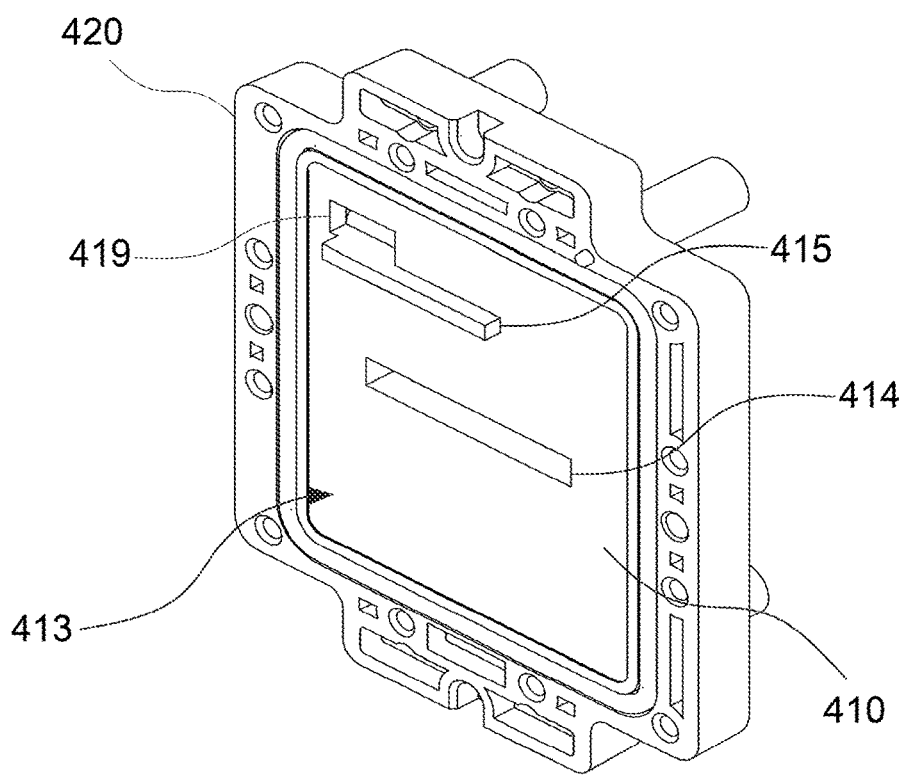
FIG. 9 depicts a representation of an embodiment of a water block cover and a flow guiding plate of FIG. 1A.
Figure 10:
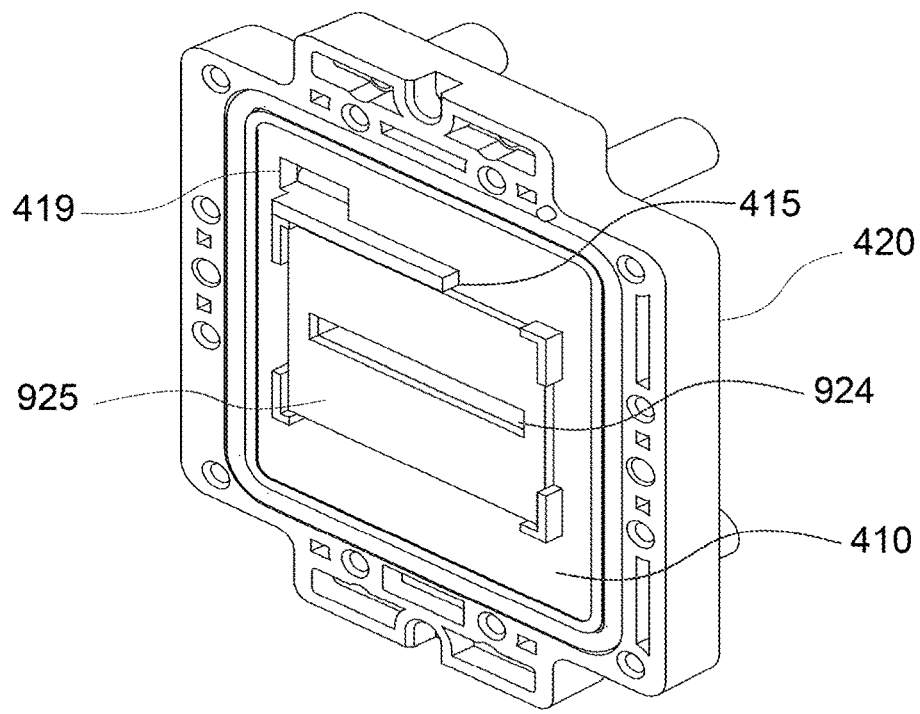
FIG. 10 depicts a representation of an embodiment of a water block cover, flow guiding plate, and fin plate of FIG. 1A.
Figure 11:
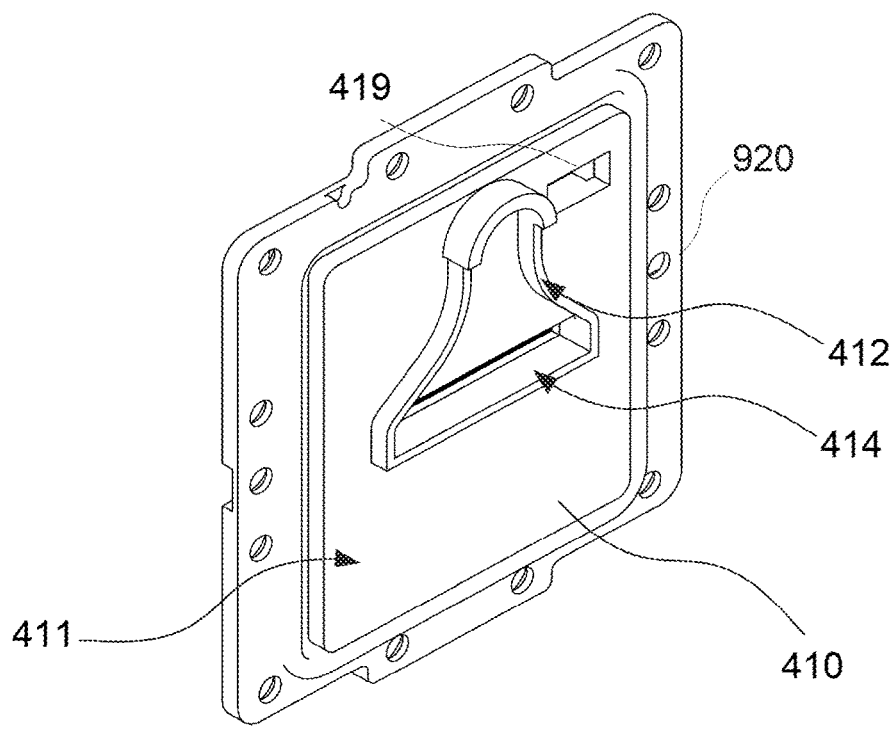
FIG. 11 depicts a representation of an embodiment of a water block set and a flow guiding plate of FIG. 1A.
Figure 12:
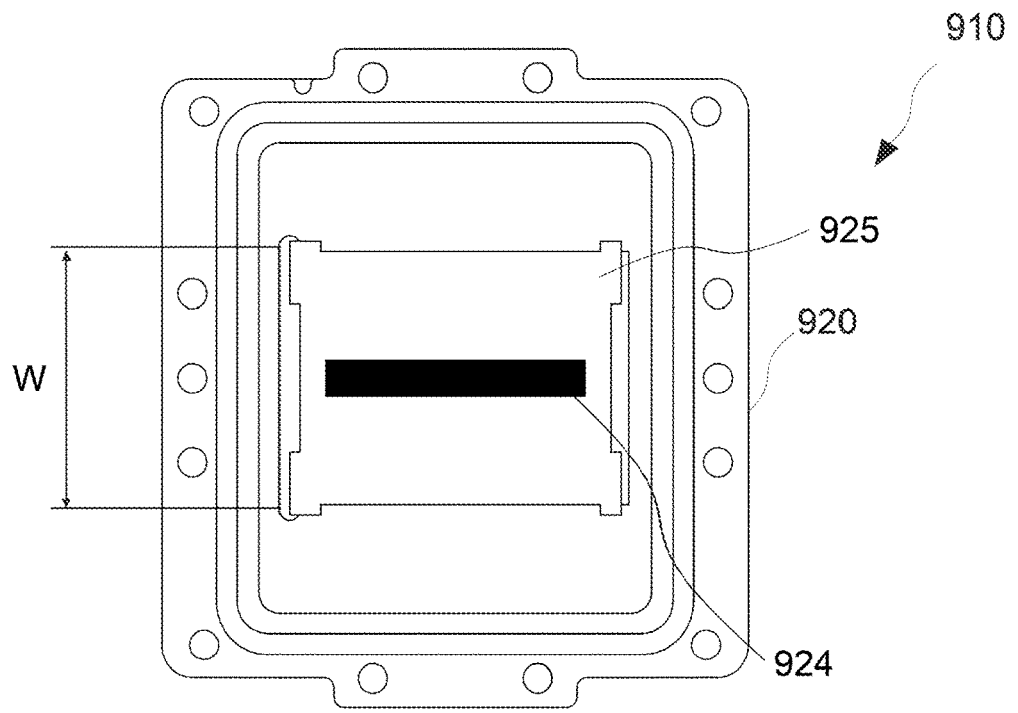
FIG. 12 depicts a representation of an embodiment of a water block set of FIG. 1A.
Figure 13:
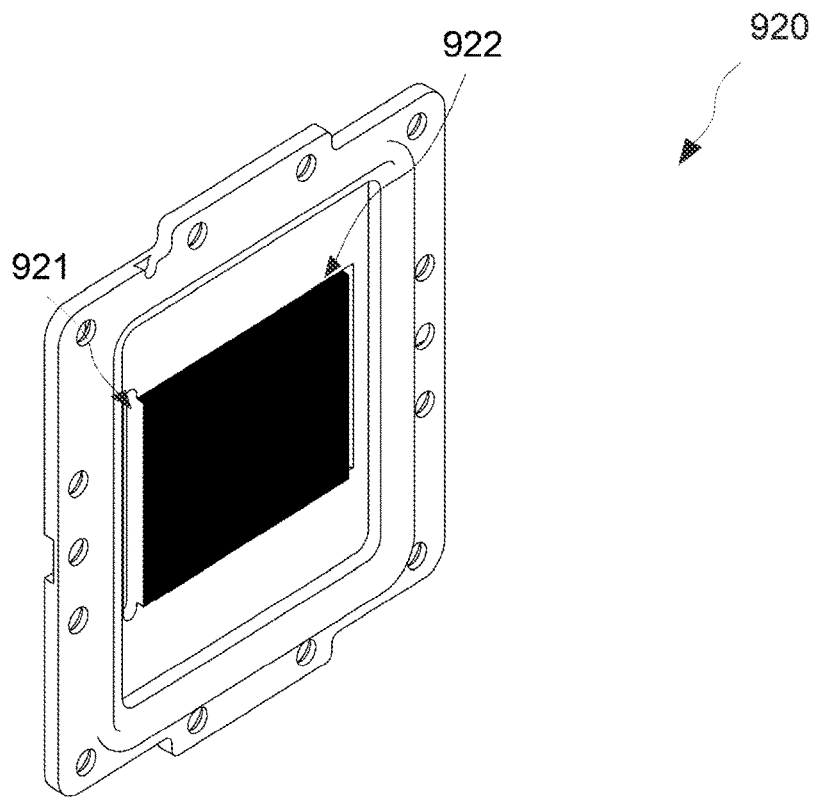
FIG. 13 depicts a representation of an embodiment of a water block set without a fin plate of FIG. 1A.

In certain embodiments of the first pump housing assembly 400, the flow guiding plate 410 comprises a water block surface 413, a water block cover mounting surface 411 having a funnel-shaped outlined wall 412 protruding therefrom, opposite the water block surface 41, a longitudinal split through hole 414, disposed at a widest end of the funnel-shaped outlined wall 412, and a flow guiding plate outlet 419, disposed near to a narrowest end of the funnel-shaped outlined wall 412. FIGS. 9 and 10 depict representations of an embodiment of the water block cover 420 and a flow guiding plate 410, and the water block cover 420, the flow guiding plate 410, and a fin plate 925 of the variable-part liquid cooling pumping unit 100, respectively. FIGS. 11, 12 and 13 depict representations of an embodiment of a water block set 910 and the flow guiding plate 410, the water block set 910, and the water block set 910 without a fin plate 925 of the variable-part liquid cooling pumping unit 100, respectively. The funnel-shaped outlined wall 412 communicates with the water block inlet through hole 432, the longitudinal split through hole 414, communicates with the water block set 910 and water block inlet through hole 432, and the flow guiding plate outlet 419 communicates with the water block set 910 and water block outlet through hole 429. The funnel-shaped outlined wall 412 corresponds to the funnel-shaped indentation 424 and the longitudinal split through hole 414 corresponds to the longitudinal split fin opening 924. The base cavity 922 including heat transfer surface features 921 has a width W.

During operation, working fluid is sucked via the inlet port 491 into the impeller cavity 455 through the chamber body 450 and water block cover 420, respectively, and through the flow guiding plate 410 via within the funnel-shaped outlined wall 412, through the longitudinal split through hole 414, and into, throughout and out of the water block set 910, 911, before exiting through the flow guiding plate 410 via the flow guiding plate outlet 419 and through the water block cover 420, and through the chamber body 450, to the outlet port 499.

In certain embodiments of the first pump housing assembly 400, the flow guiding plate 410 further comprises a fin plate aligner 415 configured for alignment of the longitudinal split through hole 414 of the flow guiding plate 410 to the longitudinal split fin opening 924 of the fin plate 925.

In certain embodiments, like elements and features of the variable-part liquid cooling pumping unit 100 comprising the water block unit 300 and pump unit 400, is as described previously in the embodiments of the variable-part liquid cooling pumping unit 100, 101, 102, 500, 701, 103 comprising the water block unit 300, 301, 600, 800 and a pump unit 400, 401, 200, 201, 202, as an example and not to be limiting, such as the water block set 910, 911 and rotor assembly unit 200, and for sake of brevity, will not be repeated hereafter.

Those of ordinary skill in the relevant art may readily appreciate that alignment of the longitudinal split through hole 414, 714, 114 of the flow guiding plate 410, 710, 110 to the longitudinal split fin opening 924 of the fin plate 925 may comprise one or more fin plate aligners 415, no fin plate aligner, and/or one or more fin plate aligners of different shapes and sizes, as long as the longitudinal split through hole 414, 714, 114 is aligned to the longitudinal split fin opening 924.

In certain embodiments, the water block unit 300, 301, 600, 800 is a first water block unit 300 and the width of the base cavity 922 is a first width (W) and the pump unit 400, 401, 200, 201, 202 is a first pump unit 400 and the diameter of the impeller cavity 455 is a first diameter (D), whereby the first width (W) is shorter than the first diameter (D).

Figure 14A:
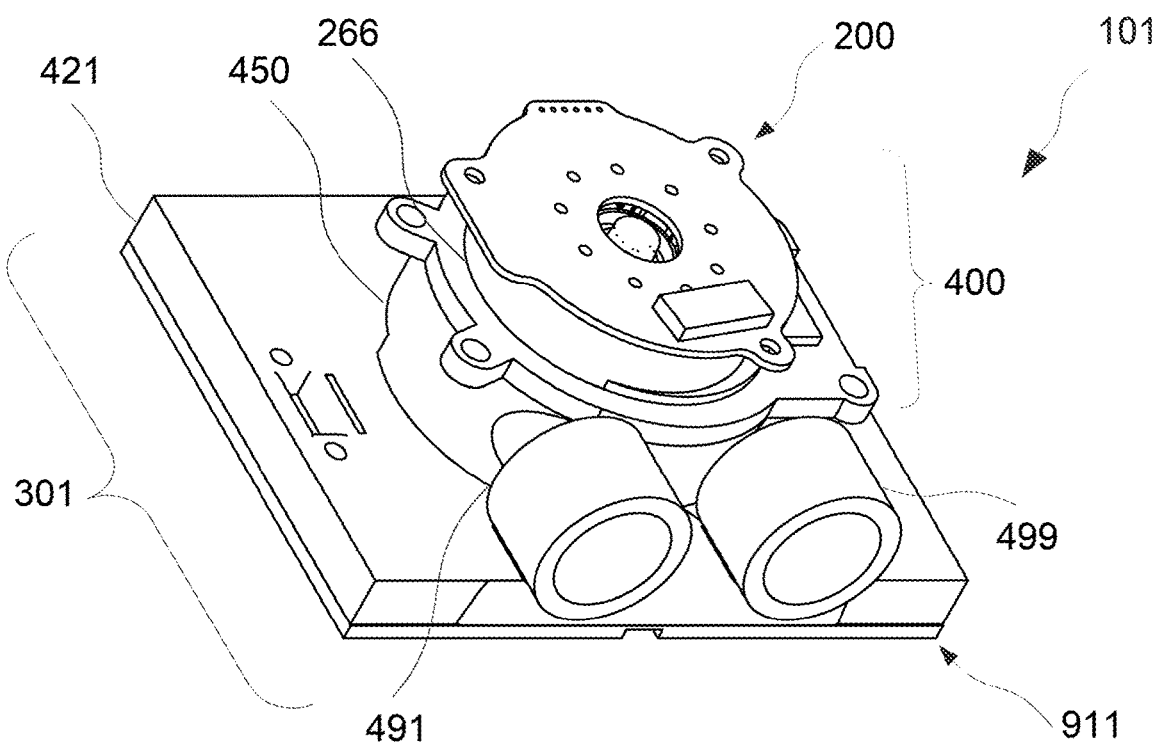
FIG. 14A depicts a representation of an alternative embodiment of a variable-part liquid cooling pumping unit.
Figure 14B:
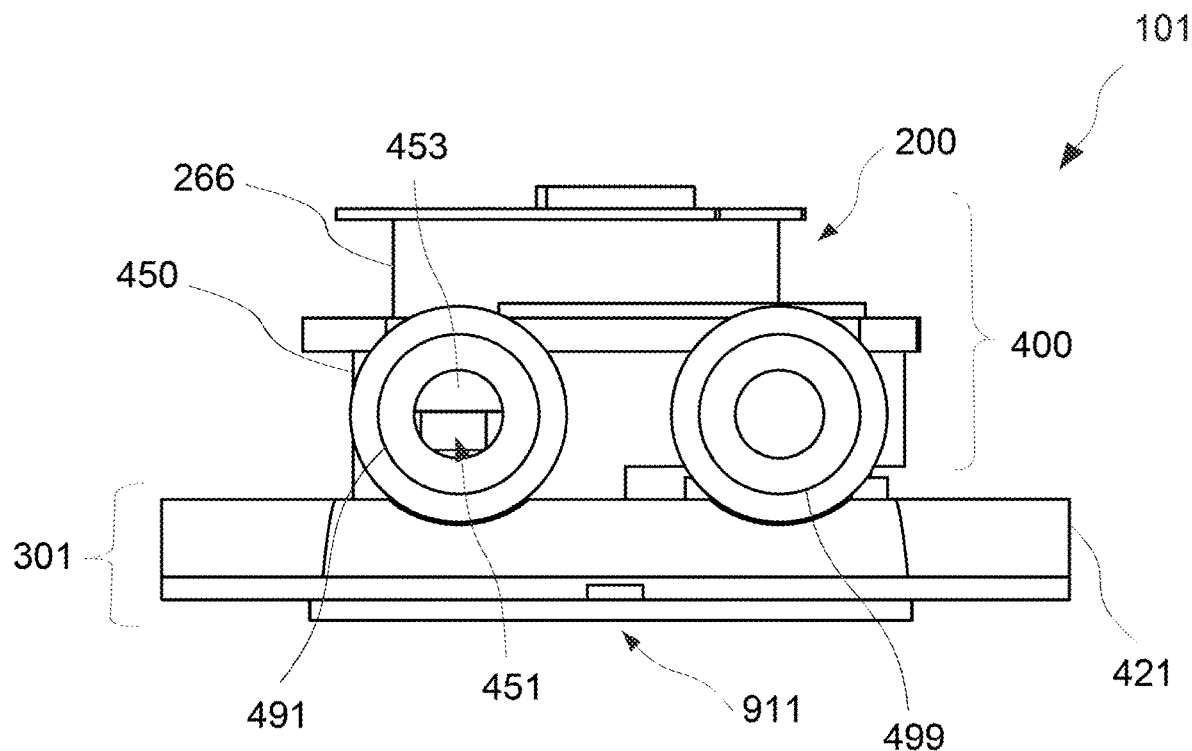
FIG. 14B depicts another representation of the alternative embodiment of the variable-part liquid cooling pumping unit of FIG. 14A.

FIGS. 14A and 14B depict representations of an alternative embodiment of a variable-part liquid cooling pumping unit 101. Referring to FIGS. 14A and 14B, and referring to FIGS. 3A to 7B and FIGS. 8A to 13, in an alternative embodiment, the water block unit 300, 301, 600, 800 is a second water block unit 301, and the width of the base cavity (not shown) is a second width, whereby the dimension thereof is greater than the dimension of the water block unit 300, 600, 800, and the pump unit 400, 401, 200, 201, 202 is a second pump unit 400 and the diameter of the impeller cavity 455 is a second diameter. In certain embodiments, the width of the water block unit 301 perpendicular to the widest end of the funnel-shaped indentation 424 and funnel-shaped outlined wall 412, longitudinal split through hole 414 and longitudinal split fin opening 924 of the water block unit 300, 600, 800 is uniformly elongated from a center thereof on both sides. The second width is longer than the first width and equal to or longer than the second diameter. A volume of a base cavity (not shown) including the heat transfer surface features (not shown) thereon is thus increased, increasing the area of the water block set 911 in direct or indirect contact with a heat source opposite the base cavity (not shown), as an example and not to be limiting, a heat source of a larger dimension. The second water block unit 301 is interchangeable with the water block unit 300 and the pump unit 400 is mounted to the second water block unit 301. During operation, working fluid is sucked via the inlet port 491 into the impeller cavity 455 through the chamber body 450 and water block cover 421, respectively, and through the flow guiding plate (not shown) via within the funnel-shaped outlined wall (not shown), through the longitudinal split through hole (not shown), and into, throughout and out of the water block set 911, before exiting through the flow guiding plate (not shown) via the flow guiding plate outlet (not shown) and through the water block cover 421, and through the chamber body 450, to the outlet port 499.

In certain embodiments, like elements and features of the variable-part liquid cooling pumping unit 101 comprising the water block unit 301 and pump unit 400, is as described previously in the embodiments of the variable-part liquid cooling pumping unit 100, 101, 102, 500, 701, 103 comprising the water block unit 300, 600, 800 and pump unit 400, 401, 200, 201, 202, as an example and not to be limiting, such as the chamber body 450 and rotor assembly unit 200, and elongated water block cover 420, flow guiding plate 410, and water block set 910, 911 having the base cavity 922 including heat transfer surface features 921 thereon, and for sake of brevity, will not be repeated hereafter.

In certain embodiments, the water block unit 301 is rectangular-shaped and a width thereof is uniformly elongated from a center thereof on both sides. Those of ordinary skill in the relevant art may readily appreciate that a dimension of the water block unit 301 may be uniformly elongated from a center thereof on both and/or all sides and the shape thereof may be non-rectangular-shaped, and the embodiments are not limited thereto. As long as the second water block unit 301 is interchangeable with the water block unit 300 and the pump unit 400 is mounted to the second water block unit 301, whereby the impeller cavity outlet opening 452 and chamber body outlet opening 459 is mounted to the water block inlet through hole (not shown) and water block outlet through hole (not shown). Those of ordinary skill in the relevant art may also readily appreciate that a dimension of the pump unit 401 may be greater than the dimension of the pump unit 400, 401, 200, 201, 202, and the embodiments are not limited thereto.

In certain embodiments, the water block unit 300, 301, 600, 800 is a first water block unit 300 and the width of the base cavity 922 is a first width (W) and the pump unit 400, 401, 200, 201, 202 is a first pump unit 400 and the diameter of the impeller cavity 455 is a first diameter (D), whereby the first width (W) is shorter than the first diameter (D).

Figure 15:
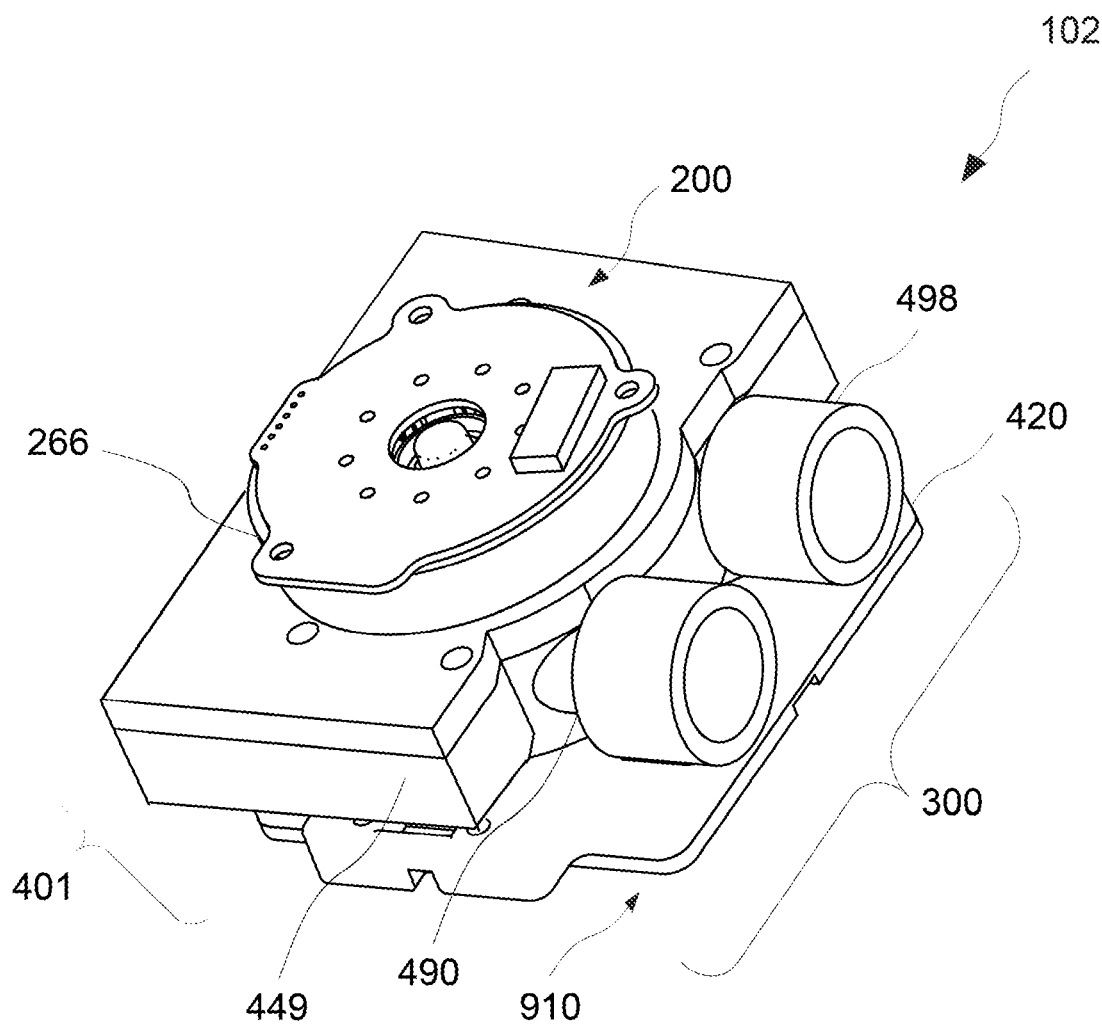
FIG. 15 depicts a representation of another alternative embodiment of a variable-part liquid cooling pumping unit.

FIG. 15 depicts a representation of another alternative embodiment of a variable-part liquid cooling pumping unit 102. Referring to FIG. 15, and referring to FIGS. 8A to 13, and FIGS. 3A to 7B, in another alternative embodiment, the pump unit 400, 401, 200, 201, 202 is a second pump unit 401, and the diameter of the impeller cavity is a second diameter, whereby the dimension thereof is greater than the dimension of the pump unit 400, 200, 201, and the water block unit 300, 301, 600, 800 is a second water block unit 300, and the width of the base cavity 922 is a second width.

In certain embodiments, the diameters of the rotor assembly unit 202 and chamber body 449 (diameter D) are proportionally enlarged from a center thereof in all directions. The second diameter is longer than the first diameter and the second width is shorter than the second diameter. The diameters of the impeller cavity (not shown) of the chamber body 451 and an impeller (not shown) of the rotor assembly unit 202, as an example, and not to be limiting, are thus increased, increasing a volume of working fluid which is sucked via the inlet port 492 into the impeller cavity (not shown) through the chamber body 449. The second pump unit 401 is interchangeable with the pump unit 400 and the pump unit 401 is mounted to the water block unit 300, whereby an angle of the inner channel of the impeller cavity outlet opening (not shown) and an angle of the inner channel of the chamber body outlet opening connector (not shown) are modified, respectively, such that the impeller cavity outlet opening (not shown) and chamber body outlet opening (not shown) are configured for mounting to the water block inlet through hole 432 and water block outlet through hole 429, respectively. Those of ordinary skill in the relevant art may readily appreciate that the modification may be designed and configured for smooth and efficient flowability and minimal turbulence and the embodiments are not limited thereto.

During operation, working fluid is sucked via the inlet port 490 into the impeller cavity (not shown) through the chamber body 449 and water block cover 420, respectively, and through the flow guiding plate 410 via within the funnel-shaped outlined wall 412, through the longitudinal split through hole 114, and into, throughout and out of the water block set 910, before exiting through the flow guiding plate 410 via the flow guiding plate outlet 419 and through the water block cover 420, and through the chamber body 449, to the outlet port 498.

In certain embodiments, like elements and features of the variable-part liquid cooling pumping unit 102 comprising the water block unit 300 and pump unit 401, is as described previously in the embodiments of the variable-part liquid cooling pumping unit 100, 101, 102, 500, 701, 103 comprising the water block unit 300, 600, 800 and pump unit 400, 200, 201, as an example and not to be limiting, such as the water block cover 420, flow guiding plate 410 and water block set 910, and chamber body 450 and rotor assembly unit 200, and for sake of brevity, will not be repeated hereafter.

Figure 16A:
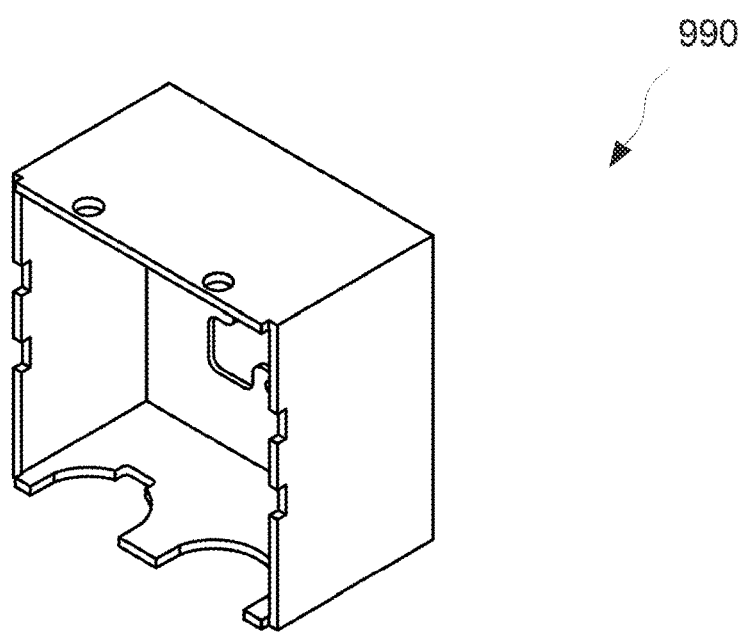
FIG. 16A depicts a representation of an embodiment of a casing of a variable-part liquid cooling pumping unit.
Figure 16B:
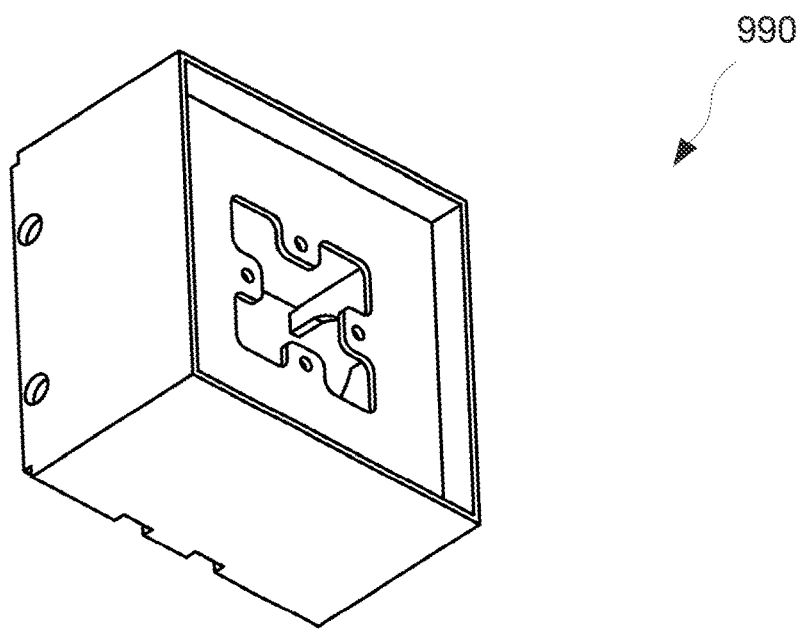
FIG. 16B depicts another representation of the embodiment of the casing of FIG. 16A.

In some embodiments, the variable-part liquid cooling pumping unit 100, 101, 102, 500, 701, 103 further comprises a casing 990. FIGS. 16A and 16B depict a representation of an embodiment of a casing 990 of a variable-part liquid cooling pumping unit 100, 101, 102, 500, 701, 103. The casing 990 is mounted to the variable-part liquid cooling pumping unit 100, 101, 102, 500, 701, 103, encompassing the rotor assembly unit 200 and pump housing assembly 400, 401, 700, 900, and a portion of the water block set 910, 911, respectively. The casing 990 comprises a plurality of cut outs and is made of non-transparent material; however, the embodiments are not limited thereto. In alternative embodiments, the casing 990 or area(s) of the casing 990 may comprise non-transparent, and/or transparent or translucent material(s) for aesthetic and/or viewing features.

Figure 17A:
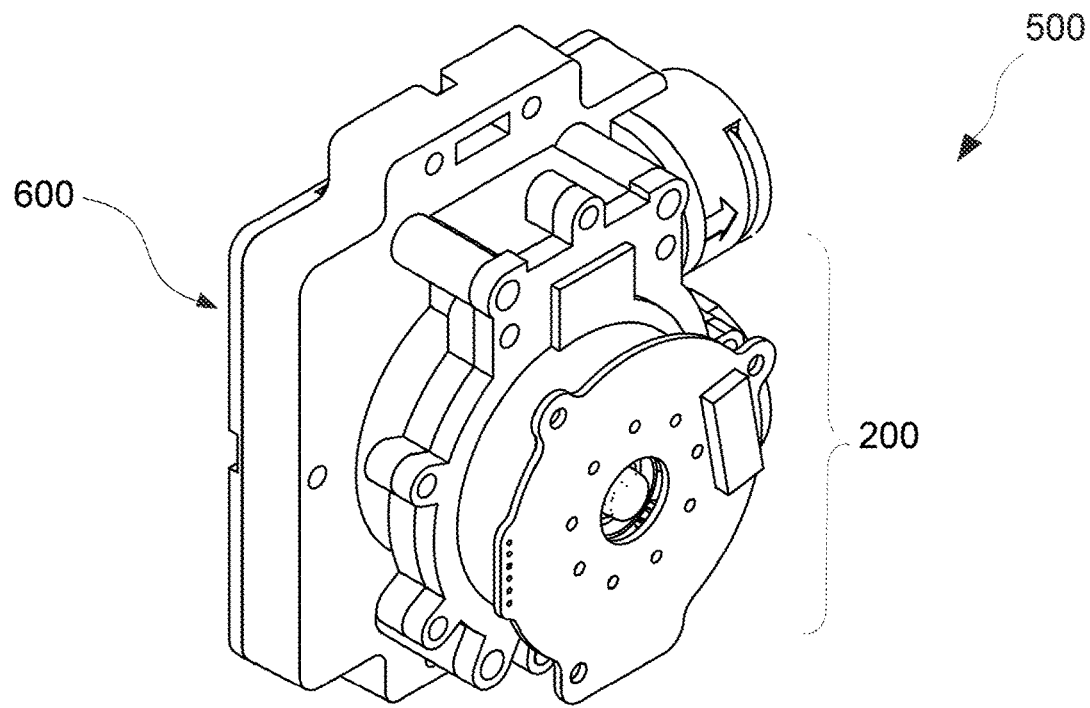
FIG. 17A depicts a representation of an embodiment of an alternative variable-part liquid cooling pumping unit.
Figure 17B:
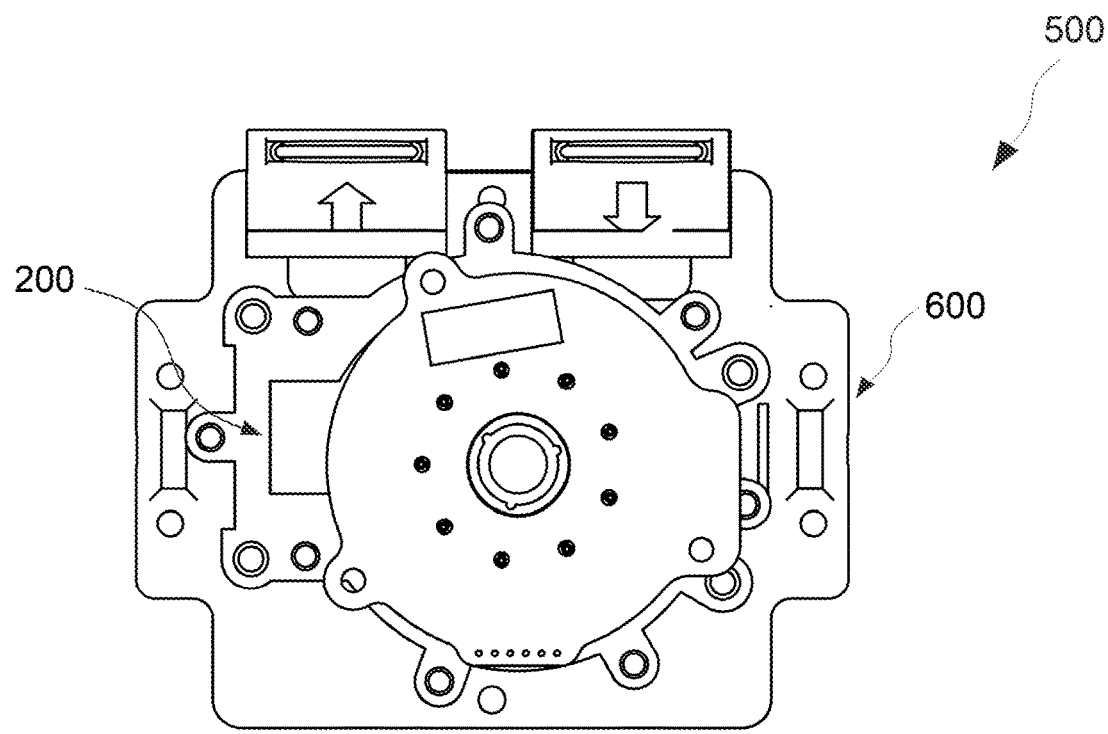
FIG. 17B depicts another representation of the embodiment of the alternative variable-part liquid cooling pumping unit of FIG. 17A.
Figure 18A:
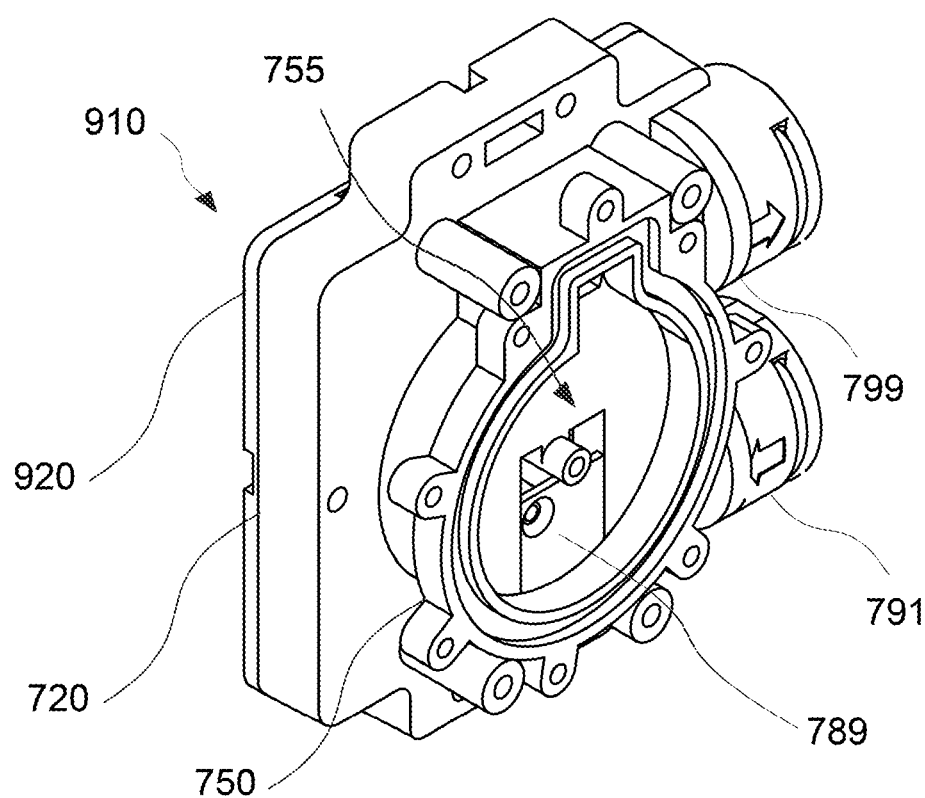
FIG. 18A depicts a representation of an embodiment of an alternative pump housing assembly mounted to a water block unit of FIG. 17A.
Figure 18B:
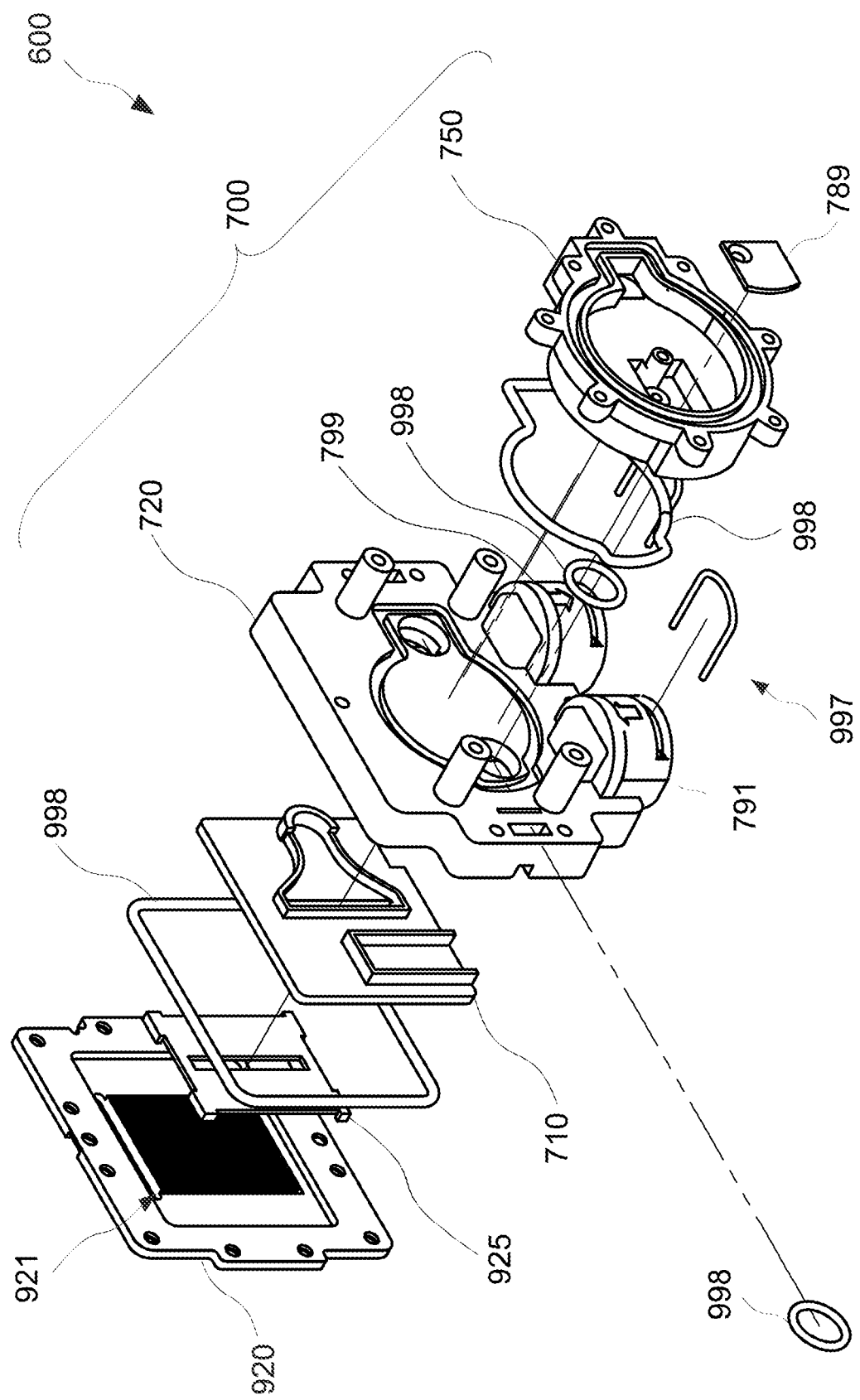
FIG. 18B depicts an exploded view of the embodiment of the alternative pump housing assembly mounted to the water block unit of FIG. 18A.
Figure 19A:
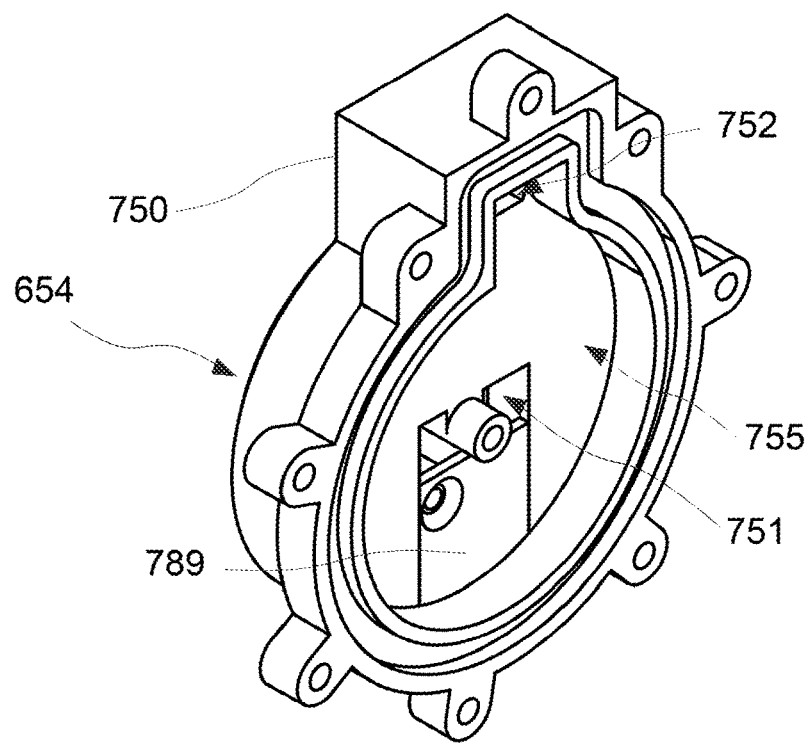
FIG. 19A depicts a representation of an embodiment of an alternative chamber body having an alternative flow adjusting disc of FIG. 17A.
Figure 19B:
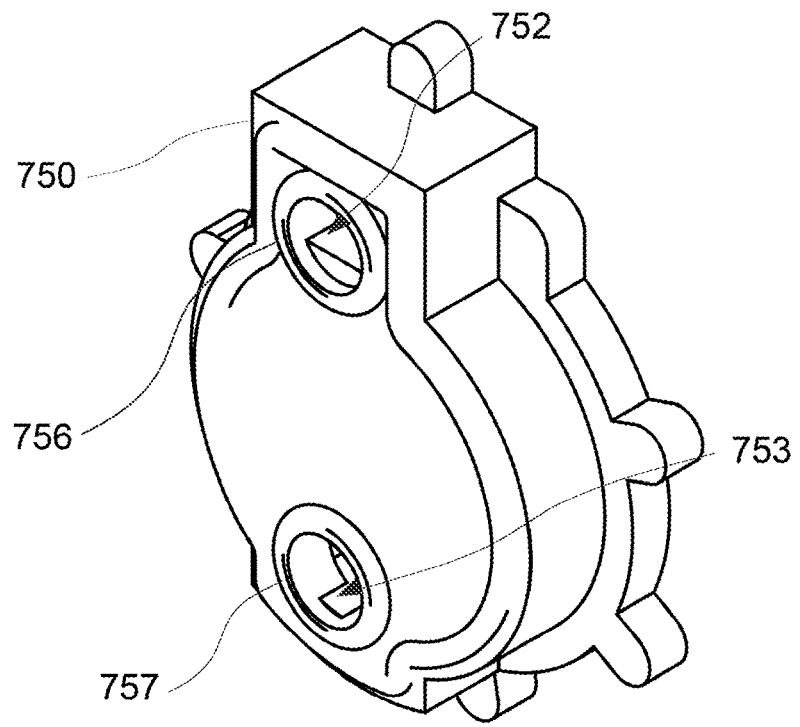
FIG. 19B depicts another representation of the embodiment of the alternative chamber body having the alternative flow adjusting disc of FIG. 19A.
Figure 20A:
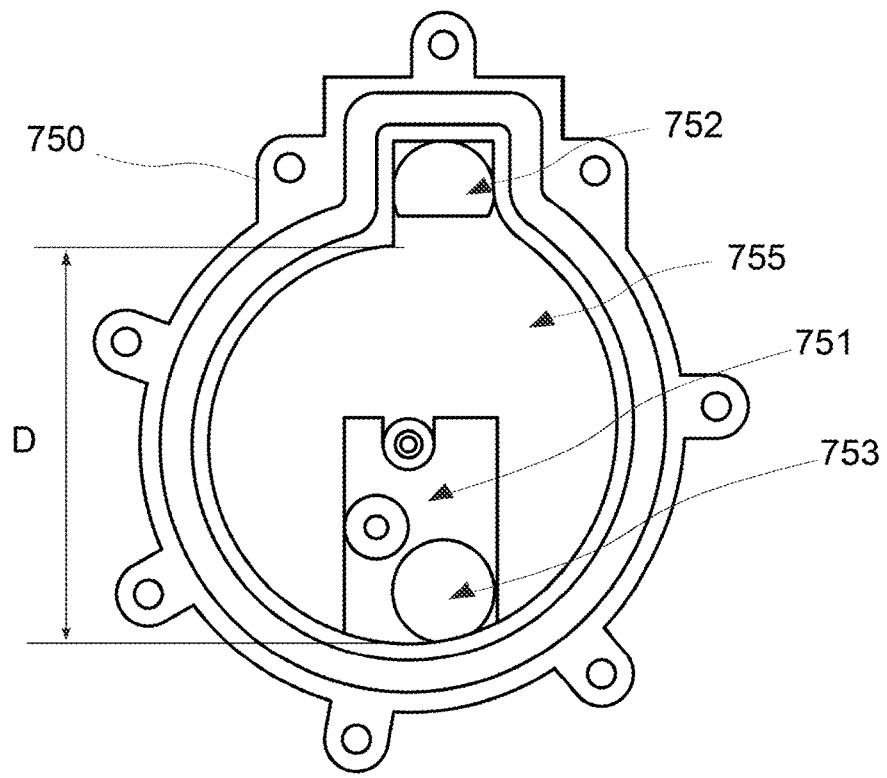
FIG. 20A depicts a representation of an embodiment of an alternative chamber body without an alternative flow adjusting disc of FIG. 17A.
Figure 20B:
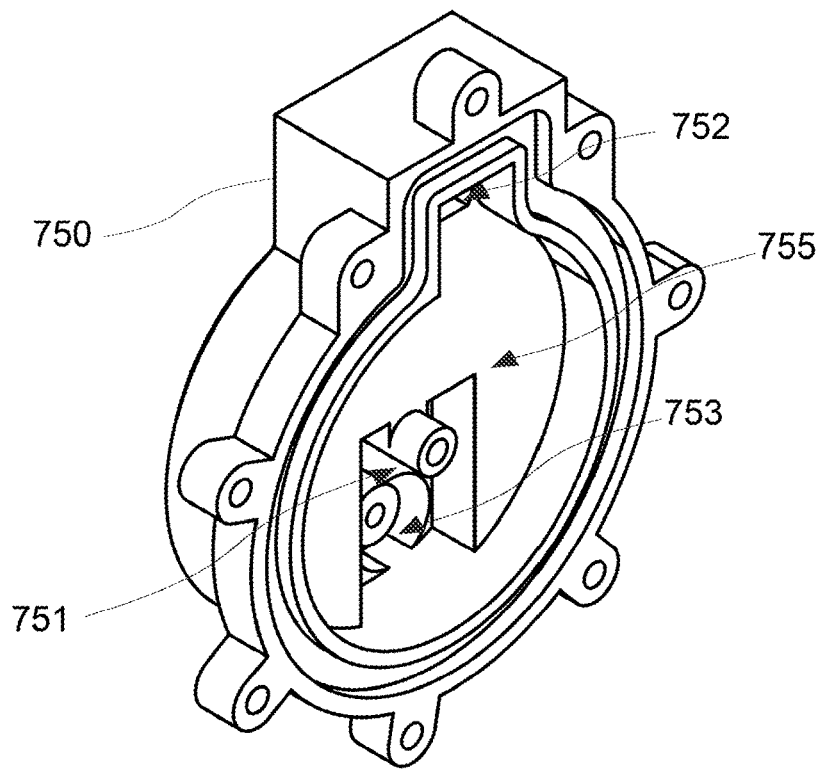
FIG. 20B depicts another representation of the embodiment of the alternative chamber body without the alternative flow adjusting disc of FIG. 20A.

FIGS. 17A and 17B depict representations of an embodiment of yet another alternative variable-part liquid cooling pumping unit 500 and FIG. 18A depicts a representation and FIG. 18B depicts an exploded view of an embodiment of an alternative pump housing assembly 750 mounted to a water block unit 600 of the yet another alternative variable-part liquid cooling pumping unit 500, respectively. In an embodiment, the pump housing assembly 400, 401, 700, 900 is a second pump housing assembly 700, whereby the inlet and outlet ports 791, 799 are integrally formed with the water block cover 720. The inlet and outlet ports 791, 799 are configured for mounting, as an example, with mounting clips 997, of at least one of a spout 991, 999, or conduit, or any combination of the foregoing thereto. The second pump housing assembly 700 is interchangeable with the first pump housing assembly 400. During operation, working fluid is sucked via the inlet port 791, into the impeller cavity 755, and through the chamber body 750, water block cover 720, and flow guiding plate 710, respectively, and into, throughout and out of the water block set 910, before exiting through the flow guiding plate 710, to the outlet port 799.

In certain embodiments of the second pump housing assembly 700, the chamber body 750 further comprises a water block cover surface 654 opposite the impeller cavity 755, an impeller cavity inlet opening 753, and an impeller cavity outlet opening 752. FIGS. 19A and 19B and 20A and 20B depict representations of an embodiment of an alternative chamber body 750 having and not having an alternative flow adjusting disc 789 of the yet another alternative variable-part liquid cooling pumping unit 500, respectively. The impeller cavity inlet opening 753 communicates with the water block cover 720 and impeller cavity 755, and the impeller cavity outlet opening 752 communicates with the impeller cavity 755 and water block cover 720. The impeller cavity 455 has a diameter D. During operation, working fluid is sucked via the inlet port 791 into the impeller cavity 755 via the impeller cavity inlet opening 753, and through the chamber body 750 via the impeller cavity outlet opening 752, and through the water block cover 720 and flow guiding plate 710, respectively, and into, throughout and out of the water block set 910, before exiting through the flow guiding plate 710, to the outlet port 799.

Figure 21A:
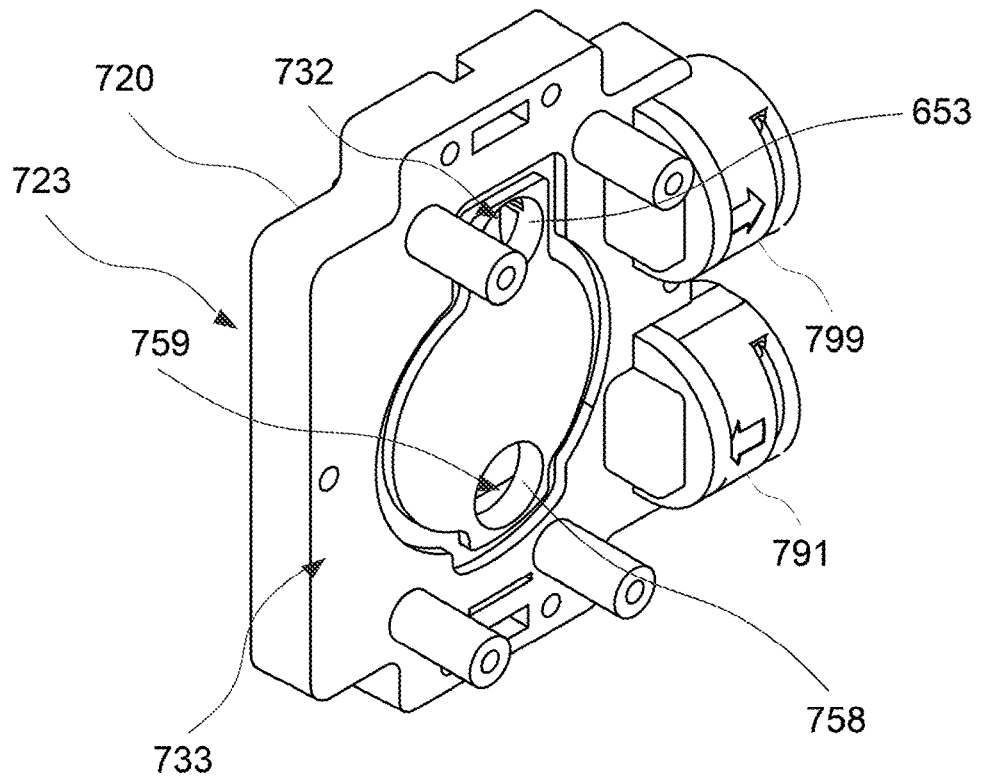
FIG. 21A depicts a representation of an embodiment of an alternative water block cover of FIG. 17A.
Figure 21B:
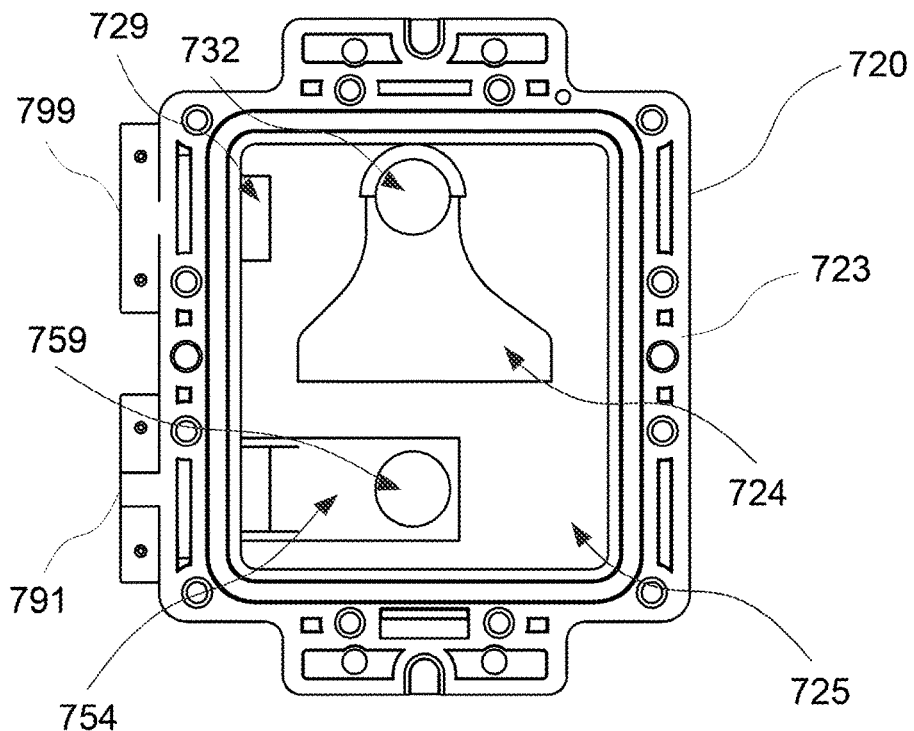
FIG. 21B depicts another representation of the embodiment of the alternative water block cover of FIG. 21A.
Figure 21C:
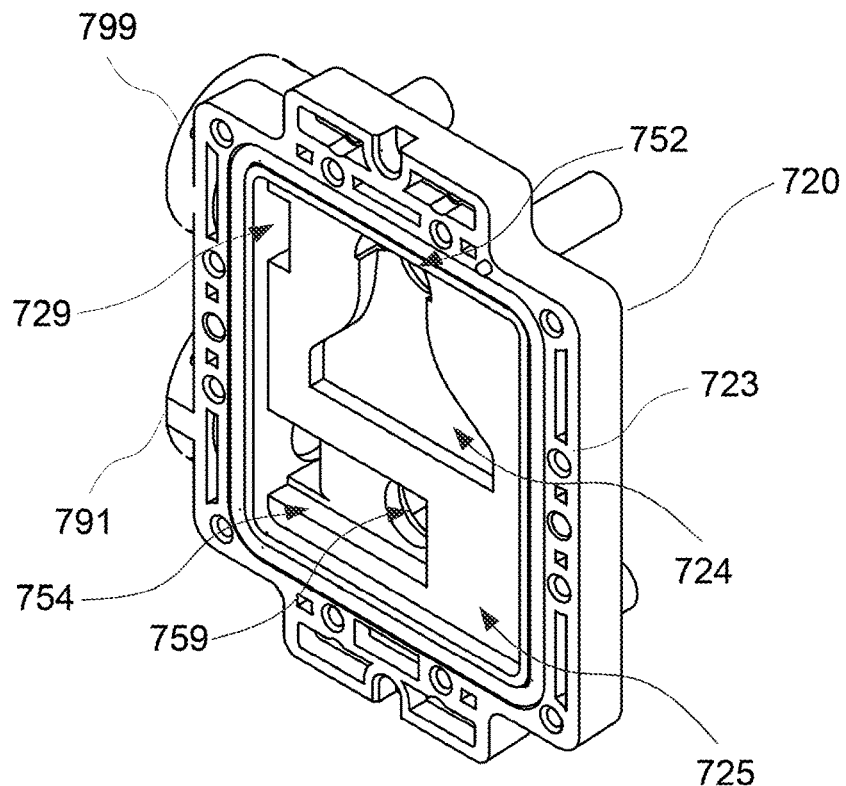
FIG. 21C depicts yet another representation of the embodiment of the alternative water block cover of FIG. 21A.

In certain embodiments of the second pump housing assembly 700, the water block cover 720 comprises a flow guiding plate surface 723 having a cover cavity 725 having a diversion indentation 754 and a funnel-shaped indentation 724 therein, respectively, a chamber body surface 733 opposite the flow guiding plate surface 723, a cover diversion opening 759, and a water block inlet through hole 732. FIGS. 21A, 21B and 21C depict representations of an embodiment of an alternative water block cover 720 of the alternative variable-part liquid cooling pumping unit 701, respectively. The cover diversion opening 759 communicates with the inlet port 791 and impeller cavity inlet opening 753, and the water block inlet through hole 732 communicates with the impeller cavity outlet opening 752 and flow guiding plate 710. The cover diversion opening 759 is disposed at a centric end of the diversion indention 754 near to the inlet port 791, and the water block inlet through hole 732 is disposed at a narrowest end of the funnel-shaped indentation 724 near to the outlet port 799. During operation, working fluid is sucked via the inlet port 791, into the impeller cavity 755 via the cover diversion opening 759, through the chamber body 750, and through the water block cover 720 via the water block inlet through hole 732, and through the flow guiding plate 710, and into, throughout and out of the water block set 910, before exiting through the flow guiding plate 710, to the outlet port 799.

In certain embodiments of the second pump housing assembly 700, the mounting of the impeller cavity outlet opening 752 and impeller cavity inlet opening 753 to the water block inlet through hole 732 and cover diversion opening 759, respectively, is via corresponding annular wall protrusions 756, 757 and shouldered indentations 653, 758, respectively.

Figure 22:
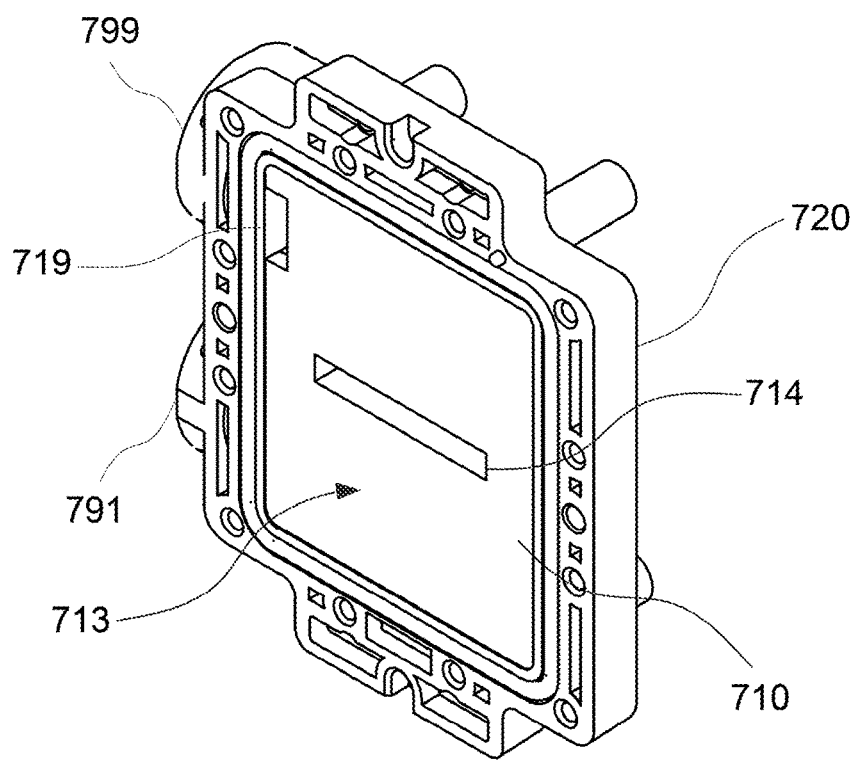
FIG. 22 depicts a representation of an embodiment of an alternative water block cover and an alternative flow guiding plate of FIG. 17A.
Figure 23:
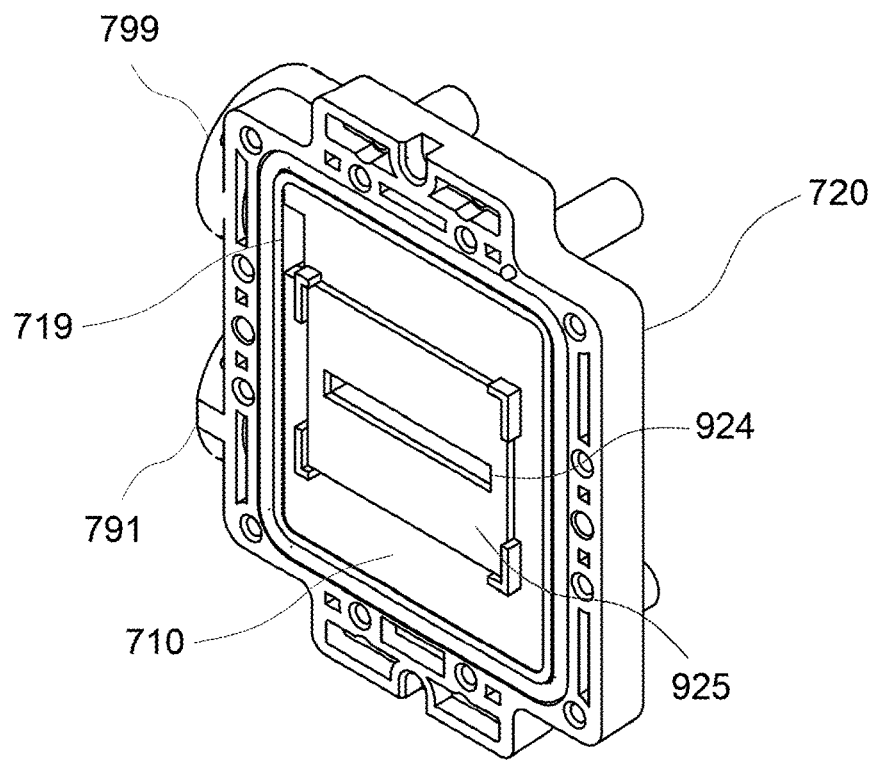
FIG. 23 depicts a representation of an embodiment of the alternative water block cover, alternative flow guiding plate, and alternative fin plate of FIG. 17A.
Figure 24:
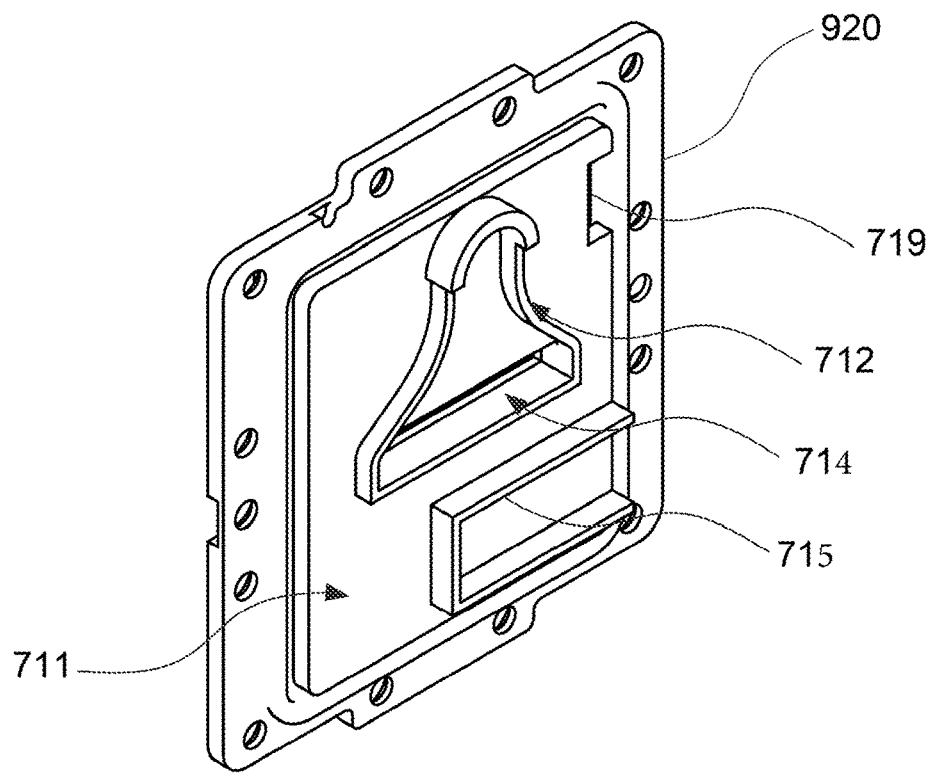
FIG. 24 depicts a representation of an embodiment of a water block set and alternative flow guiding plate of FIG. 17A.
Figure 25:
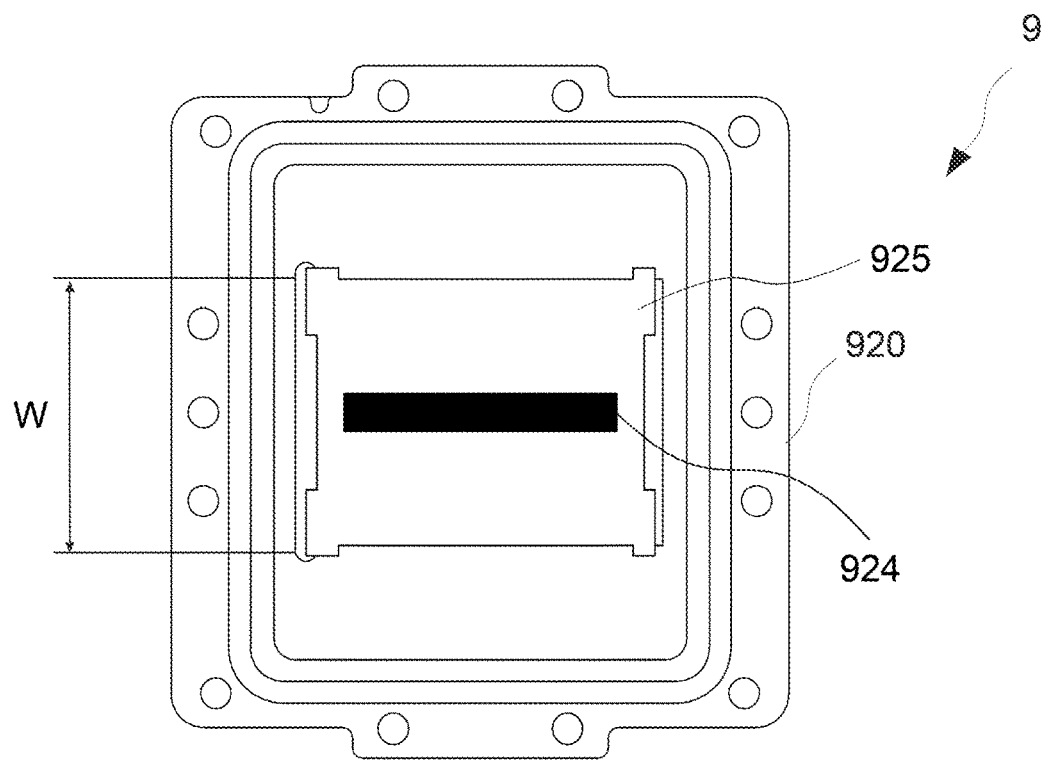
FIG. 25 depicts a representation of an embodiment of a water block set of FIG. 17A.

In certain embodiments of the second pump housing assembly 700, the flow guiding plate 710 comprises a water block surface 713, a water block cover mounting surface 711 having a diversion outlined wall 715 and a funnel-shaped outlined wall 712 protruding therefrom, respectively, opposite the water block surface 713, a longitudinal split through hole 714, disposed at a widest end of the funnel-shaped outlined wall 712, and a flow guiding plate outlet 719, disposed near to a narrowest end of the funnel-shaped outlined wall 712. FIGS. 22 and 23 depict representations of an embodiment of the alternative water block cover 720 and an alternative flow guiding plate 710, and the alternative water block cover 720, the alternative flow guiding plate 710, and a fin plate 925 of the alternative variable-part liquid cooling pumping unit 500, respectively. FIGS. 24 and 25 depict representations of an embodiment of a water block set 910 and the alternative flow guiding plate 710 and the water block set 710 of the alternative variable-part liquid cooling pumping unit 701, respectively. The diversion outlined wall 715 communicates with the inlet port 791 and impeller cavity inlet opening 753, the funnel-shaped outlined wall 712 communicates with the water block inlet through hole 752 and the water block set 910, and the flow guiding plate outlet 719 communicates with the water block set 910 and outlet port 799. The diversion outlined wall 715 corresponds to the diversion indentation 754 and the funnel-shaped outlined wall 712 corresponds to the funnel-shaped indentation 724. The longitudinal split through hole 714 corresponds to the longitudinal split fin opening 924. The base cavity 922 including heat transfer surface features 921 has a width W.

During operation, working fluid is sucked via the inlet port 791, into the impeller cavity 755 via the diversion outlined wall, through the chamber body 750 and water block cover 720, respectively, and through the flow guiding plate 710 via within the funnel-shaped outlined wall 712 through the longitudinal split through hole 714, and into, throughout and out of the water block set 910, before exiting through the flow guiding plate 710 via the flow guiding plate outlet 719, to the outlet port 799.

In certain embodiments, like elements and features of the variable-part liquid cooling pumping unit 500 comprising the water block unit 600 and pump unit 200, is as described previously in the embodiments of the variable-part liquid cooling pumping unit 100, 101, 102, 500, 701, 103 comprising the water block unit 300, 301, 600, 800 and a pump unit 400, 401, 200, 201, 202, as an example and not to be limiting, such as the water block set 910 and rotor assembly unit 200, and for sake of brevity, will not be repeated hereafter.

Figure 26A:
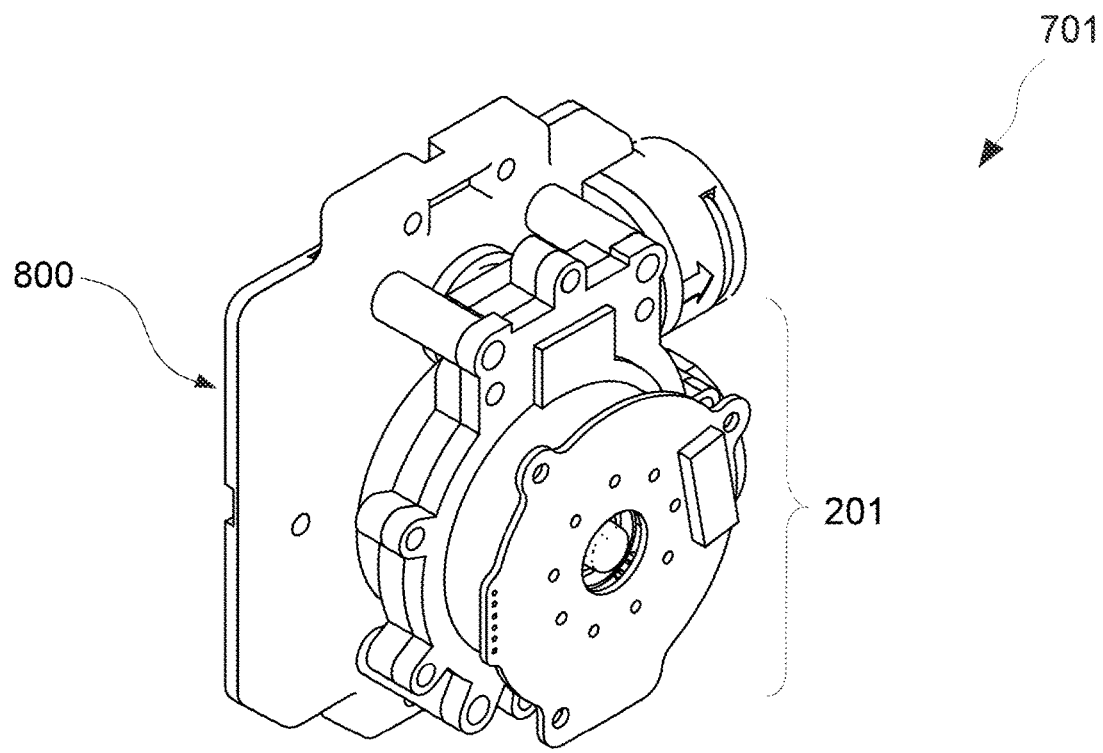
FIG. 26A depicts a representation of an embodiment of another alternative variable-part liquid cooling pumping unit.
Figure 26B:
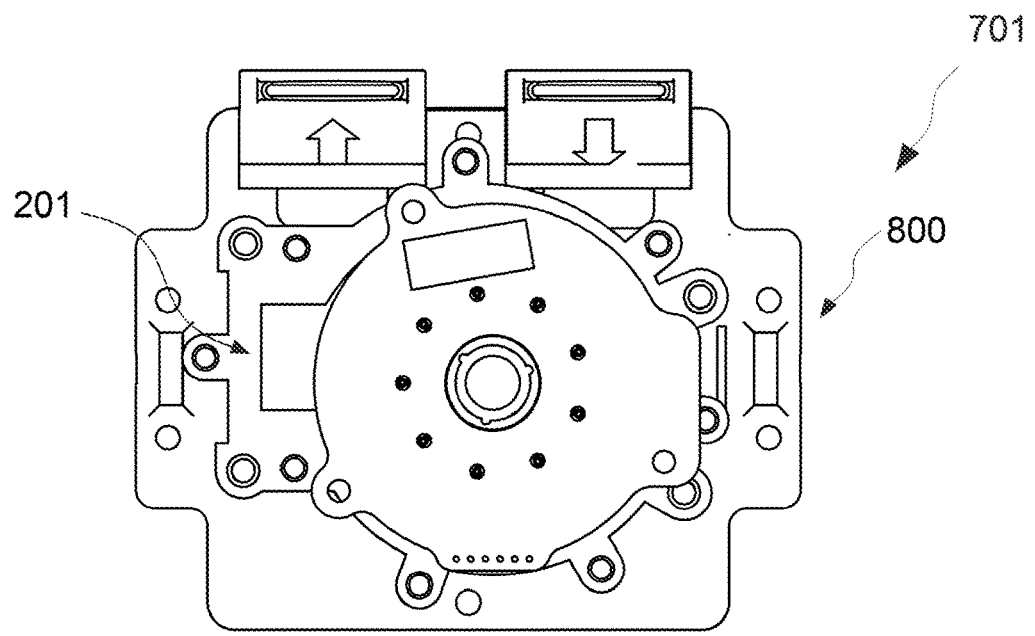
FIG. 26B depicts another representation of the embodiment of the another alternative variable-part liquid cooling pumping unit of FIG. 26A.
Figure 27A:
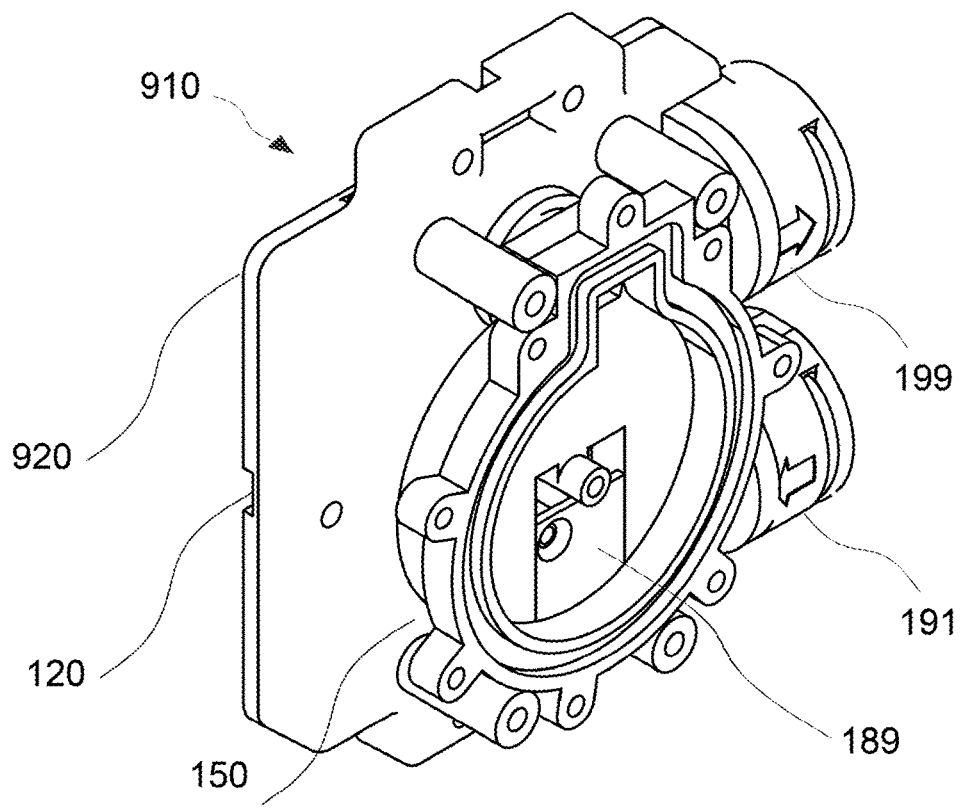
FIG. 27A depicts a representation of an embodiment of another alternative pump housing assembly mounted to a water block unit of FIG. 26A.
Figure 27B:
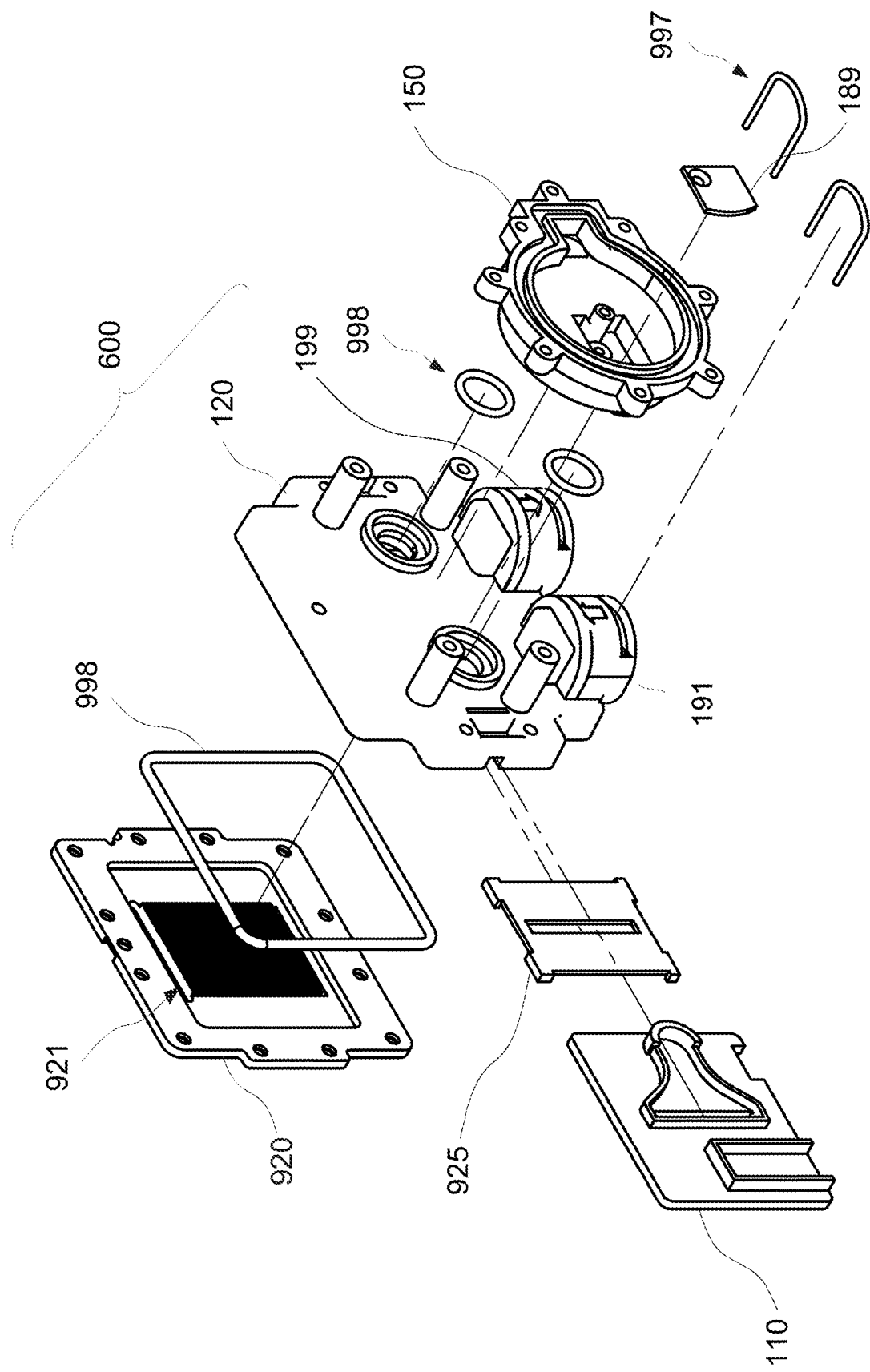
FIG. 27B depicts an exploded view of the embodiment of the another alternative pump housing assembly mounted to the water block unit of FIG. 27A.
Figure 28A:
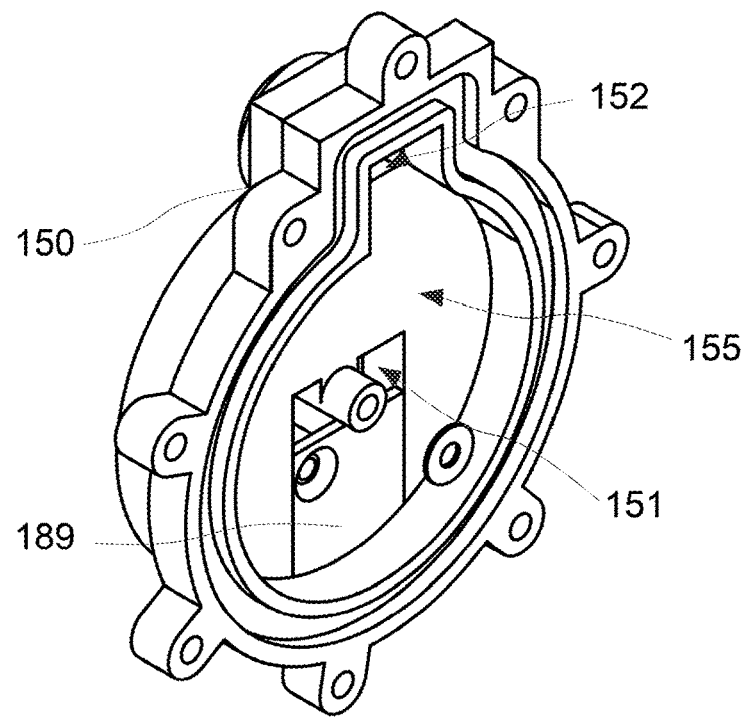
FIG. 28A depicts a representation of an embodiment of another alternative chamber body having another alternative flow adjusting disc of FIG. 26A.
Figure 28B:
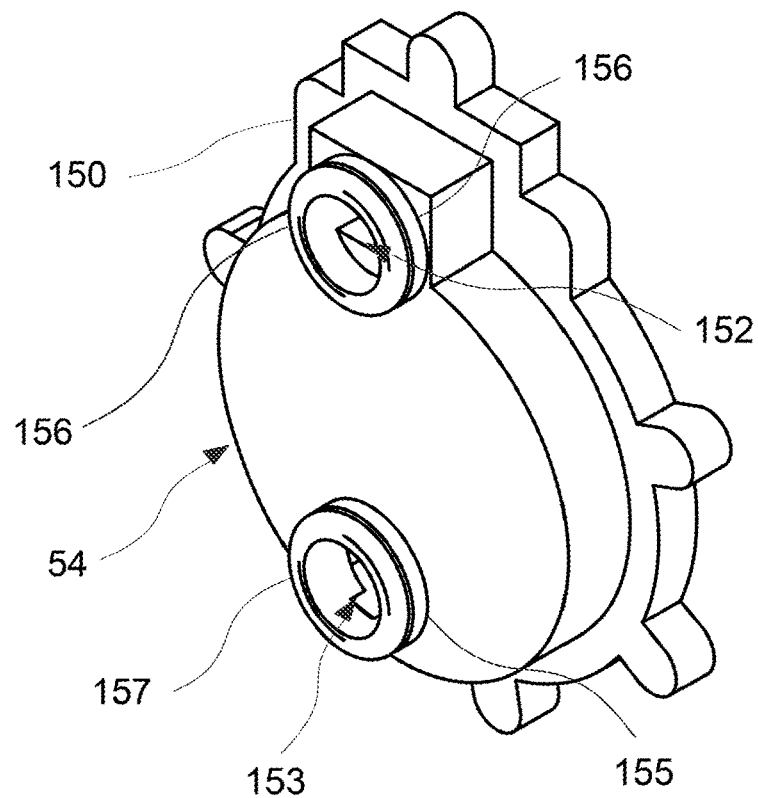
FIG. 28B depicts another representation of the embodiment of the another alternative chamber body having the another alternative flow adjusting disc of FIG. 29A.
Figure 29A:
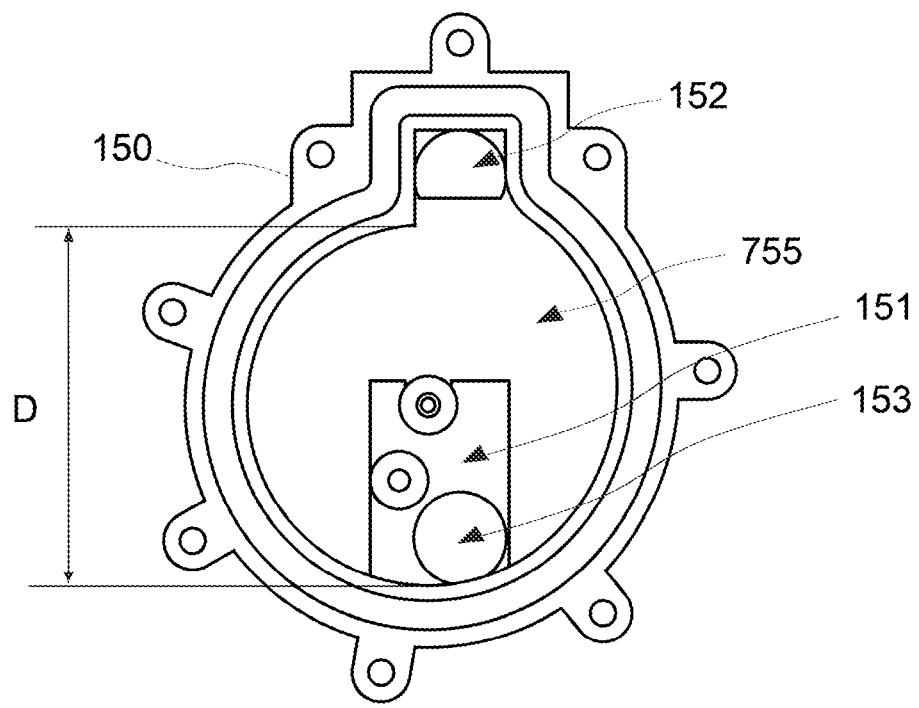
FIG. 29A depicts a representation of an embodiment of another alternative chamber body without another alternative flow adjusting disc of FIG. 26A.
Figure 29B:
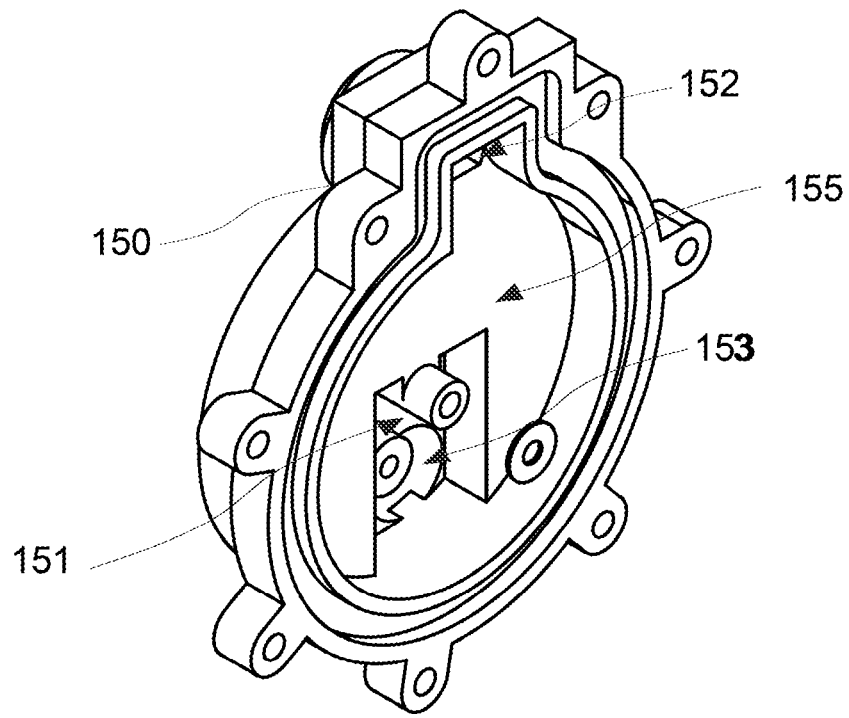
FIG. 29B depicts another representation of the embodiment of the another alternative chamber body without the another alternative flow adjusting disc of FIG. 29A.

FIGS. 26A and 26B depict representations of an embodiment of another alternative variable-part liquid cooling pumping unit 701 and FIGS. 27A and 27B depict a representation and an exploded view of an embodiment of another alternative pump housing assembly 150 mounted to a water block unit 800 of the another alternative variable-part liquid cooling pumping unit 701, respectively. In an embodiment, the pump housing assembly 400, 401, 700, 900 is a third pump housing assembly 900, whereby the inlet and outlet ports 191, 199 are integrally formed with the water block cover 120. The inlet and outlet ports 191, 199 are configured for mounting of at least one of a spout 991, 999, or conduit, or any combination of the foregoing thereto. The third pump housing assembly 900 is interchangeable with the first pump housing assembly 400 or the second pump housing assembly 700. During operation, working fluid is sucked via the inlet port 191, into the impeller cavity 155 and through the chamber body 150, water block cover 120, and flow guiding plate 110, respectively, and into, throughout and out of the water block set 910, before exiting through the flow guiding plate 110, to the outlet port 199.

In certain embodiments of the third pump housing assembly 900, the chamber body 150 further comprises a water block cover surface 54 opposite the impeller cavity 155, an impeller cavity inlet opening 153, and an impeller cavity outlet opening 152. FIGS. 28A and 28B and 29A and 29B depict representations of an embodiment of another alternative chamber body 150 having and not having another alternative flow adjusting disc 189 of the another alternative variable-part liquid cooling pumping unit 701, respectively. The impeller cavity inlet opening 153 communicates with the water block cover 120 and impeller cavity 155, and the impeller cavity outlet opening 152, communicates with the impeller cavity 155 and water block cover 120. The impeller cavity 155 has a diameter D. During operation, working fluid is sucked via the inlet port 191, into the impeller cavity 155 via the impeller cavity inlet opening 153 and through the chamber body 150 via the impeller cavity outlet opening 152, and through the water block cover 120, and flow guiding plate 110, respectively, and into, throughout and out of the water block set 910, before exiting through the flow guiding plate 110, to the outlet port 199.

Figure 30A:
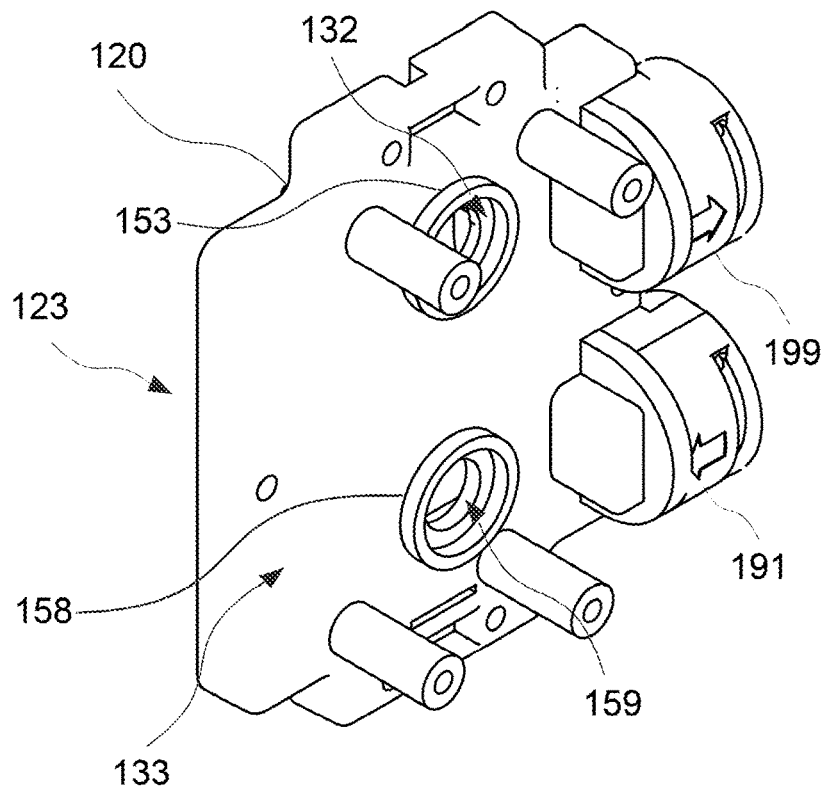
FIG. 30A depicts a representation of an embodiment of another alternative water block cover of FIG. 26A.
Figure 30B:
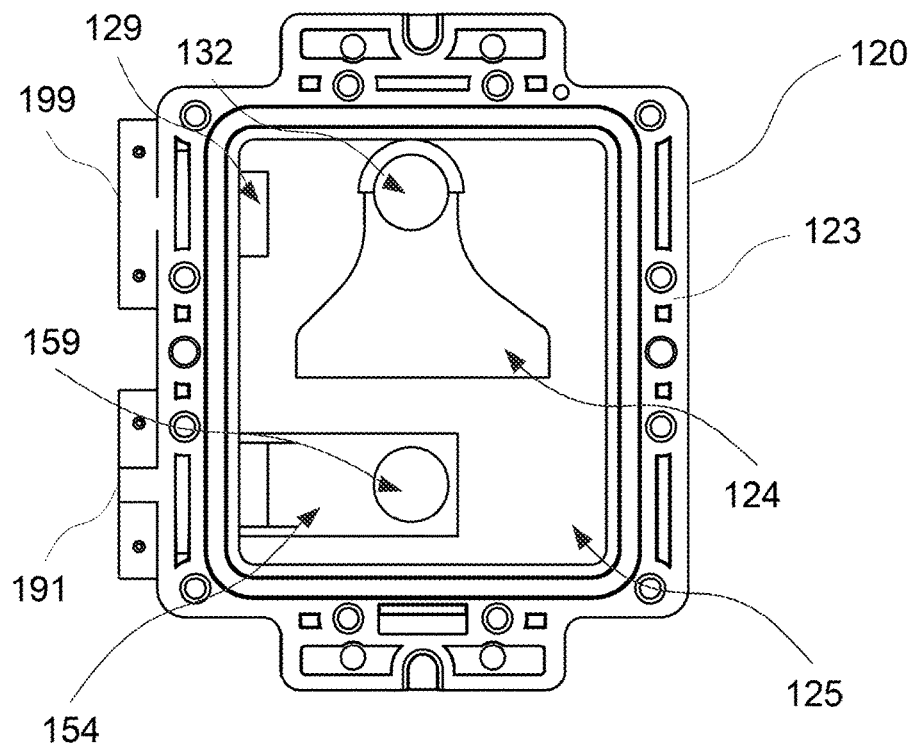
FIG. 30B depicts another representation of the embodiment of the another alternative water block cover of FIG. 30A.
Figure 30C:
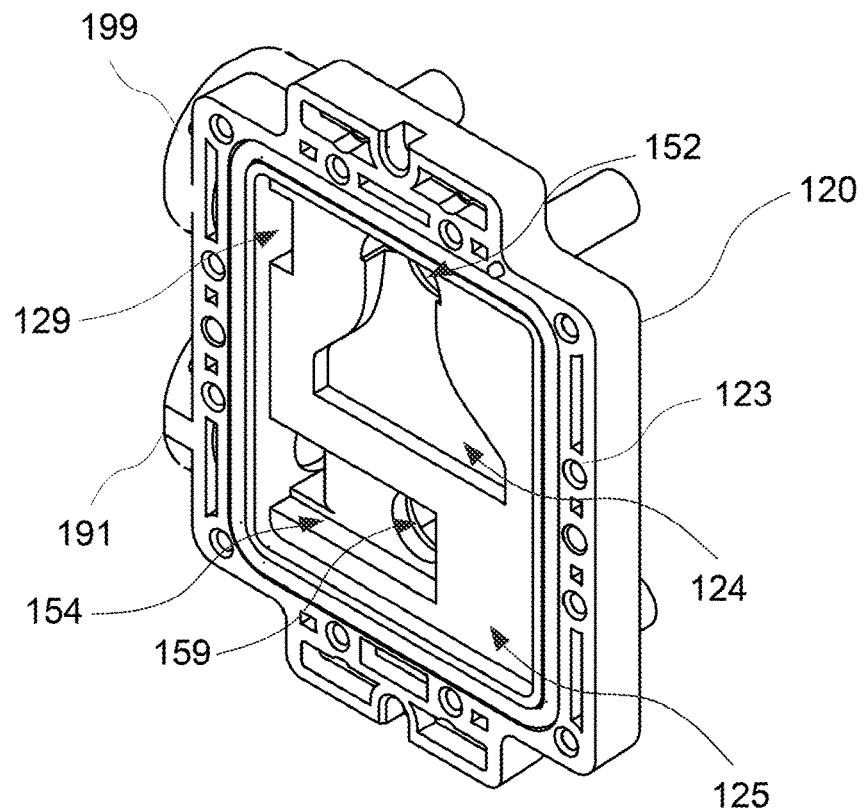
FIG. 30C depicts yet another representation of the embodiment of the another alternative water block cover of FIG. 30A.

In certain embodiments of the third pump housing assembly 900, the water block cover 120 comprises a flow guiding plate surface 123 having a cover cavity 125 having a diversion indentation 154 and a funnel-shaped indentation 124 therein, respectively, a chamber body surface 133 opposite the flow guiding plate surface 123, a cover diversion opening 159, and a water block inlet through hole 132. FIGS. 30A, 30B and 30C depict representations of an embodiment of another alternative water block cover 120 of the another alternative variable-part liquid cooling pumping unit 701, respectively. The cover diversion opening 159 communicates with the inlet port 191 and impeller cavity inlet opening 153, and the water block inlet through hole 132 communicates with the impeller cavity outlet opening 152 and flow guiding plate 110. The cover diversion opening 159 is disposed at a centric end of the diversion indention 154 near to the inlet port 191, and the water block inlet through hole 152 is disposed at a narrowest end of the funnel-shaped indentation 124 near to the outlet port 199. During operation, working fluid is sucked via the inlet port 191, into the impeller cavity 155 via the cover diversion opening 159, through the chamber body 150, and through the water block cover 120 via the water block inlet through hole 152, and through the flow guiding plate 110, and into, throughout and out of the water block set 910, 911, before exiting through the flow guiding plate 110, to the outlet port 199.

In certain embodiments of the third pump housing assembly 900, the mounting of the impeller cavity outlet opening 152 and impeller cavity inlet opening 153 to the water block inlet through hole 132 and cover diversion opening 159, respectively, is via corresponding annular wall and shouldered protrusions 156, 157 and 153, 158, respectively.

Figure 31:
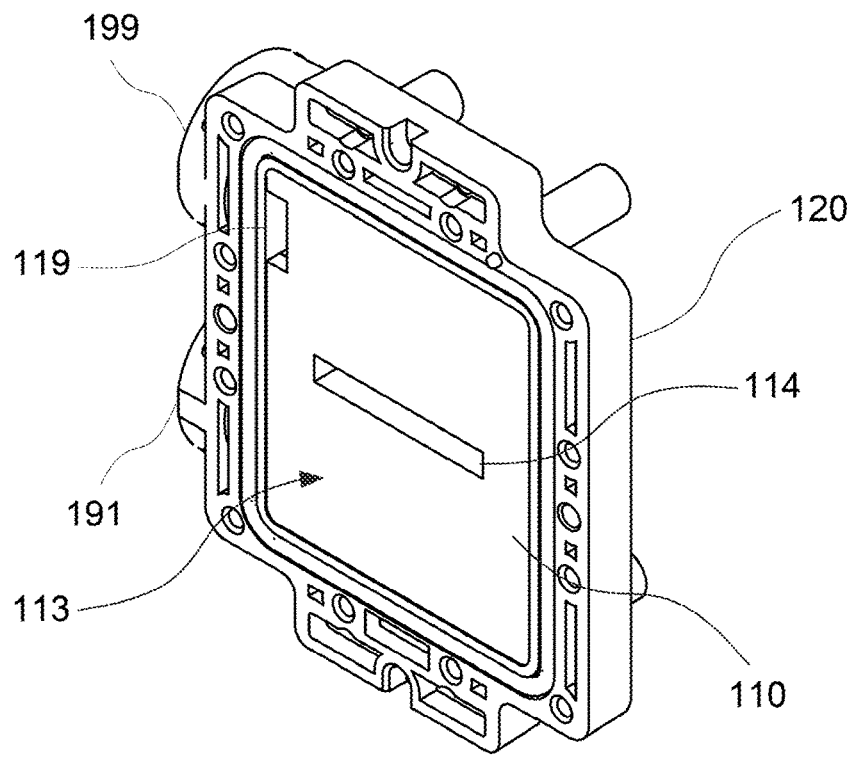
FIG. 31 depicts a representation of an embodiment of another alternative water block cover and another alternative flow guiding plate of FIG. 26A.
Figure 32:
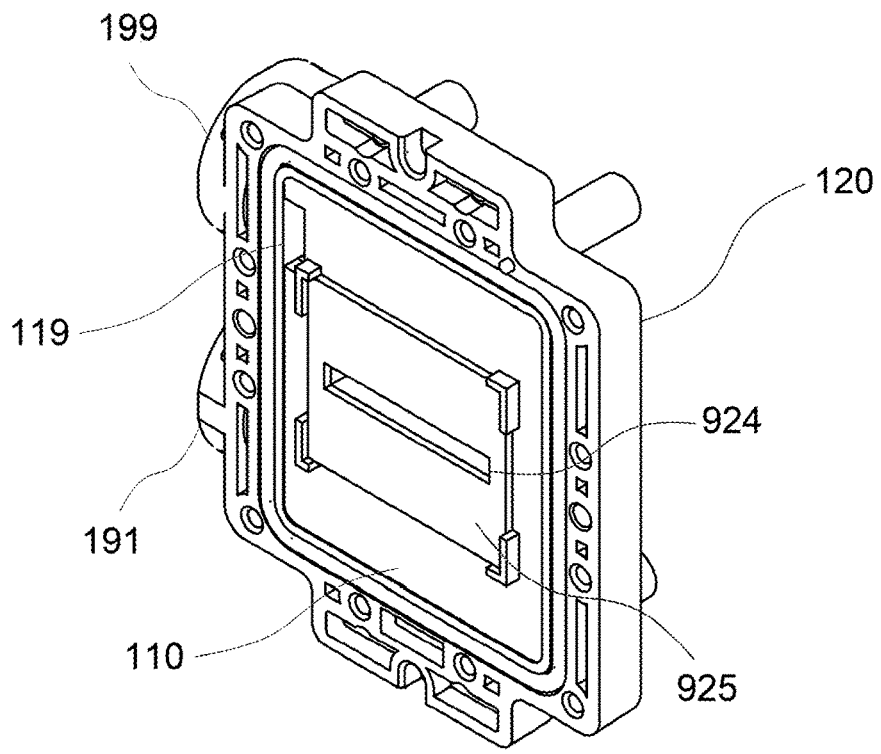
FIG. 32 depicts a representation of an embodiment of another alternative water block cover, another alternative flow guiding plate, and a fin plate of FIG. 26A.
Figure 33:
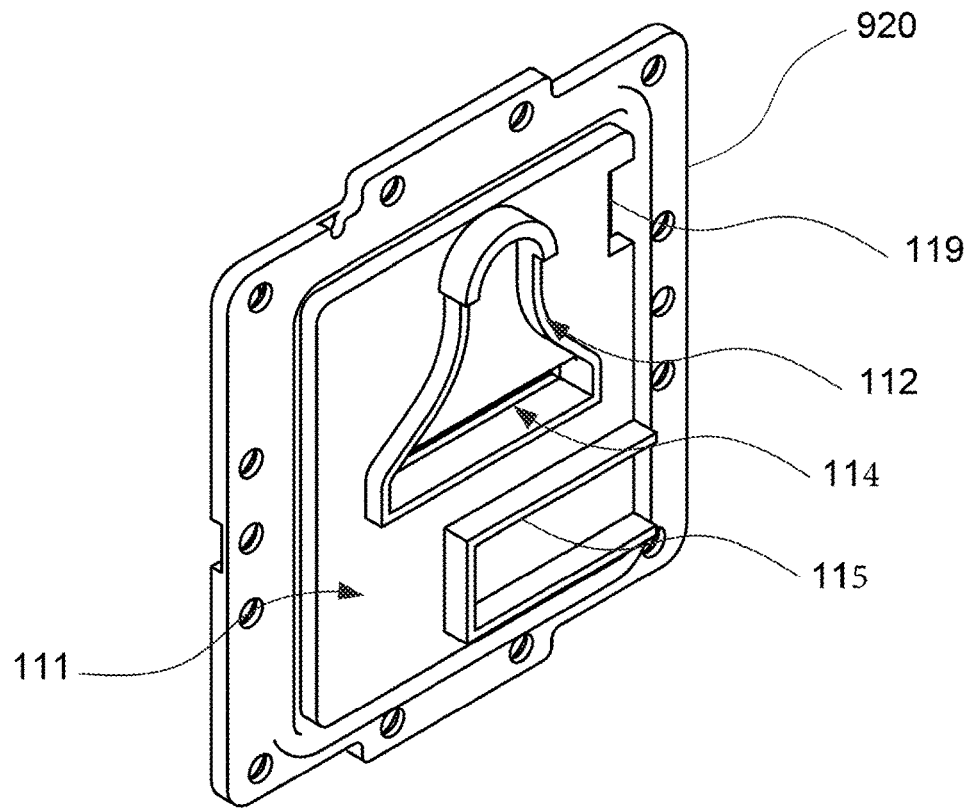
FIG. 33 depicts a representation of an embodiment of a water block set and another alternative flow guiding plate of FIG. 26A.
Figure 34:
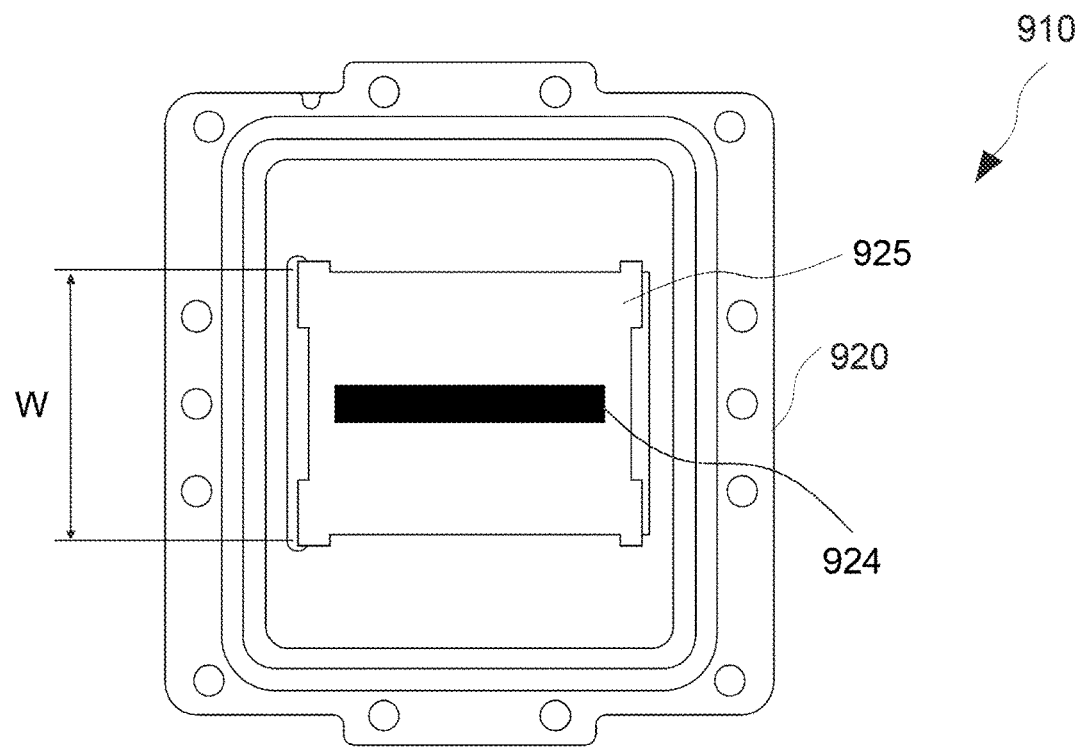
FIG. 34 depicts a representation of an embodiment of a water block set of FIG. 26A.

In certain embodiments of the third pump housing assembly 900, the flow guiding plate 110, comprises a water block surface 113, a water block cover mounting surface 111 having a diversion outlined wall 115 and a funnel-shaped outlined wall 112 protruding therefrom, respectively, opposite the water block surface 113, a longitudinal split through hole 114, disposed at a widest end of the funnel-shaped outlined wall 112, and a flow guiding plate outlet 119, disposed near to the outlet port 199. FIGS. 31 and 32 depict representations of an embodiment of the another alternative water block cover 120 and another alternative flow guiding plate 110, and the another alternative water block cover 120, the another alternative flow guiding plate 110, and a fin plate 925 of the another alternative variable-part liquid cooling pumping unit 701, respectively. FIGS. 33 and 34 depict representations of an embodiment of a water block set 910 and the another alternative flow guiding plate 110 and a water block set 910 of the another alternative variable-part liquid cooling pumping unit 701, respectively. The diversion outlined wall 115 communicates with the inlet port 191 and impeller cavity inlet opening 153, the funnel-shaped outlined wall 112 communicates with the water block inlet through hole 152 and the water block set 910, and the flow guiding plate outlet 119 communicates with the water block set 910 and outlet port 199. The diversion outlined wall 115 corresponds to the diversion indentation 154 and the funnel-shaped outlined wall 112 corresponds to the funnel-shaped indentation 124. The longitudinal split through hole 114 corresponds to the longitudinal split fin opening 924. The base cavity 922 including heat transfer surface features 921 has a width W.

During operation, working fluid is sucked via the inlet port 191, into the impeller cavity 155 via the diversion outlined wall 115, through the chamber body 150 and water block cover 120, respectively, and through the flow guiding plate 110 via within the funnel-shaped outlined wall 112 through the longitudinal split through hole 114, and into, throughout and out of the water block set 910, before exiting through the flow guiding plate 110 via the flow guiding plate outlet 119, to the outlet port 199.

In certain embodiments, like elements and features of the variable-part liquid cooling pumping unit 701 comprising the water block unit 800 and rotor assembly unit 200, is as described previously in the embodiments of the variable-part liquid cooling pumping unit 100, 101, 102, 500, 701, 103 comprising the water block unit 300, 301, 600, 800 and rotor assembly unit 200, as an example and not to be limiting, such as the water block set 910 and rotor assembly unit 200, and for sake of brevity, will not be repeated hereafter.

In certain embodiments, the water block unit 300, 301, 600, 800 is a third water block unit 800 and the width of the base cavity 922 is a third width (W) and the pump unit 400, 401, 200, 201, 202 is a third pump unit 202 and the diameter of the impeller cavity 155 is a third diameter (D), whereby the third width (W) is shorter than the third diameter (D).

Figure 35:
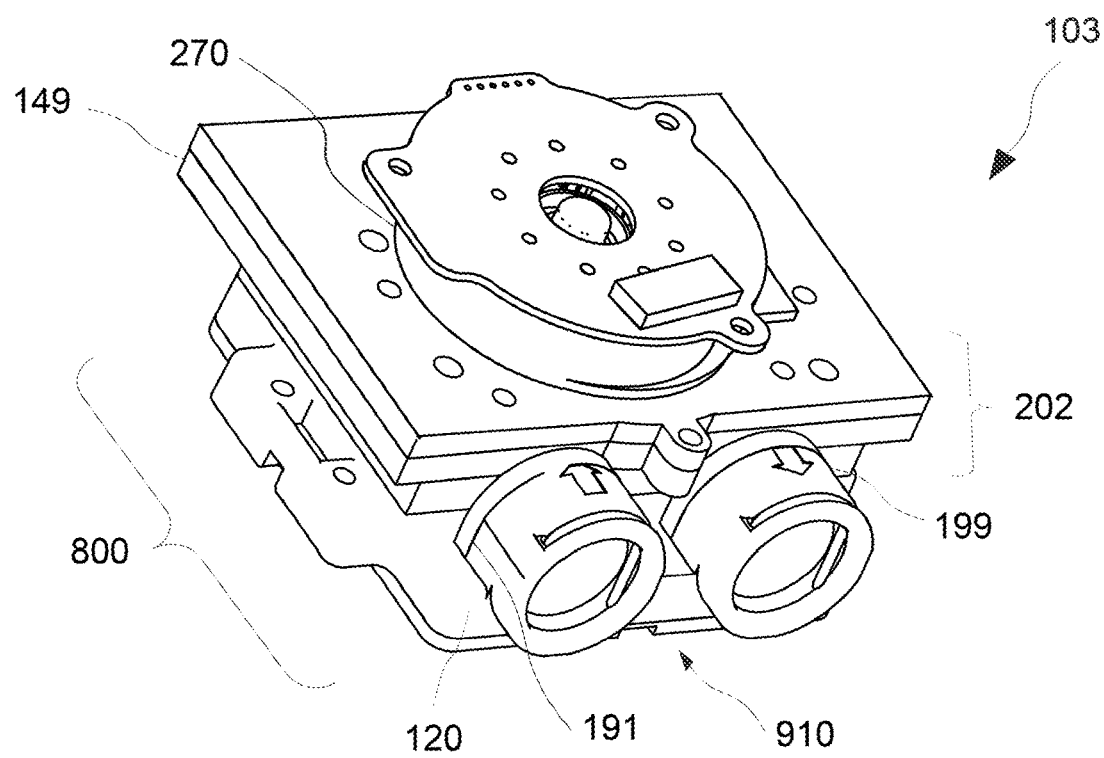
FIG. 35 depicts a representation of yet another alternative embodiment of a variable-part liquid cooling pumping unit.

FIG. 35 depicts a representation of yet another alternative embodiment of a variable-part liquid cooling pumping unit 103. Referring to FIG. 35, and referring to FIGS. 30A to 34, and FIGS. 27A to 29B, in yet another alternative embodiment, the pump unit 400, 401, 200, 201, 202 is a fourth pump unit 202, and the diameter of the impeller cavity (not shown) is a fourth diameter, whereby the dimension thereof is greater than the dimension of the pump unit 400, 200, 201, and the water block unit 300, 301, 600, 800 is a fourth water block unit 800, and the width of the base cavity (not shown) is a fourth width. In certain embodiments, the diameters of the rotor assembly unit 202 and chamber body 149 (diameter D) are proportionally enlarged from a center thereof in all directions. The diameters of the impeller cavity (not shown) of the chamber body 149 (fourth diameter D) and an impeller (not shown) of the rotor assembly unit 202, as an example, and not to be limiting, are thus increased, increasing a volume of working fluid which is sucked via the inlet port 191 into the impeller cavity (not shown) through the chamber body 149. The third pump unit 202 is interchangeable with the pump unit 200 and the pump unit 202 is mounted to the water block unit 800, whereby an angle of the inner channel of the impeller cavity outlet opening (not shown) and an angle of the inner channel of the chamber body outlet opening connector (not shown) are modified, respectively, such that the impeller cavity outlet opening (not shown) and chamber body outlet opening (not shown) are configured for mounting to the water block inlet through hole 432 and water block outlet through hole 429, respectively. Those of ordinary skill in the relevant art may readily appreciate that the modification may be designed and configured for smooth and efficient flowability and minimal turbulence and the embodiments are not limited thereto.

During operation, working fluid is sucked via the inlet port 191 into the impeller cavity (not shown) through the chamber body 149 and water block cover 120, respectively, and through the flow guiding plate 110 via within the funnel-shaped outlined wall 112 through the longitudinal split through hole 114, and into, throughout and out of the water block set 910, before exiting through the flow guiding plate 110, to the outlet port 199.

In certain embodiments, like elements and features of the variable-part liquid cooling pumping unit 103 comprising the water block unit 800 and pump unit 202, is as described previously in the embodiments of the variable-part liquid cooling pumping unit 100, 101, 102, 500, 701, 103 comprising the water block unit 300, 600, 800 and pump unit 400, 200, 201, as an example and not to be limiting, such as the water block cover 120, flow guiding plate 110 and water block set 910, and chamber body 150 and rotor assembly unit 200, and for sake of brevity, will not be repeated hereafter.

In certain embodiments, the chamber body 450, 448, 750, 150, 149, water block cover 420, 421, 720, 120, flow guiding plate 410, 710, 110, and rotor assembly unit 200 comprises at least one of a metal, plastic, or metal coated material, or any combination of the foregoing.

In the embodiments, the water block set 910, 911 comprises at least one of an aluminum, copper, aluminum-alloy, or copper-alloy material, or any combination of the foregoing. In some embodiments, the surface of the water block set 910, 911 in direct or indirect contact with the heat source, may comprise a flat surface for abutting a free surface of a heat generating component.

In the embodiments, the base cavity 922, including heat transfer surface features 921 thereon, is rectangular-shaped. Those of ordinary skill in the relevant art may readily appreciate that shape and dimension of the base cavity 922, including heat transfer surface features 921 thereon, may be non-rectangular-shaped and of different sizes and the embodiments are not limited thereto.

In the embodiments, the heat transfer surface features 921 comprise skived fins; however the embodiments are not limited thereto. Those of ordinary skill in the relevant art may readily appreciate that alternative forms of heat transfer surface features may also be provided within the base cavity 922, as an example and not to be limiting, such as one or more of fins, vanes, blades, channels, ducts, pins, posts, covers, slots, protrusions, recesses, perforations, holes, textured surfaces, segmented elements, staggered elements, and smooth surfaces.

In certain embodiments, the variable-part liquid cooling system is configured to cool each heat generating device included within a cover or electric or electronics system. In alternative embodiments, the variable-part liquid cooling system is configured to cool only selective heat generating devices, or only a single heat generating device, while other heat generating devices are left to be cooled by other or complimentary means.

The working fluid of the variable-part liquid cooling system may be any type of working fluid such as water, water with additives such as anti-fungicide, water with additives for improving heat conducting or other special compositions of working fluids such as electrically non-conductive liquids or liquids with lubricant additives or anti-corrosive additives.

Control of the variable-part liquid cooling pumping units, driven by an AC or DC electrical motor, preferably takes place by means of an operative system or like means or the electric and/or electronics system itself, wherein the electric and/or electronics system comprises a means for measuring load and/or temperature of one or more processors. Using the measurement performed by the operative system or a like system eliminates the need for special means for operating the variable-part liquid cooling pumping units. Communication between the operative system or a like system and a processor for operating the variable-part liquid cooling pumping units may take place along already established communication links in the system such as a USB-link. Thereby, a real-time communication between the variable-part liquid cooling system and variable-part liquid cooling pumping units may be provided without any special means for establishing the communication.

Further control strategies utilizing the operative system or a like system may involve balancing the rotational speed of each of the variable-part liquid cooling pumping units as a function of the cooling capacity needed. If a lower cooling capacity is needed, the rotational speed of each of the variable-part liquid cooling pumping units may be individually adjusted or limited, thereby limiting the noise generated by the motor driving the variable-part liquid cooling pumping units and wear and tear thereof.

In an embodiment, a variable-part liquid cooling pumping unit 100, 101, 102, 500, 701, 103 comprising a water block unit 300, 301, 600, 800 and a pump unit 400, 200, 201, 202 is provided. The water block unit 300, 301, 600, 800 comprises a water block set 910, 911, a water block cover 420, 421, 720, 120 assembled to the water block set 910, 911, and flow guiding plate 410, 710, 110. The pump unit 400, 200, 201, 202 comprises a chamber body 450, 448, 750, 150, 149 mounted to and communicating with the water block cover 420, 421, 720, 120 opposite the water block set 910, 911. The chamber body 450, 448, 750, 150, 149 comprises an impeller cavity inlet 451, 751, 151, flow adjusting disc 489, 789, 189, impeller cavity 455, 755, 155 having a diameter, and impeller cavity outlet opening 452, 752, 152. Inlet and outlet ports 491, 499 and 791, 799, and 191, 199 are positioned on a same side and plane as the pump housing assembly 400, 401, 700, 900. More than one pump housing assembly 400, 401, 700, 900, more than one water block unit 300, 301, 600, 800, and more than one pump unit 400, 200, 201, 202 are provided and interchangeable. During operation, working fluid is sucked via the inlet port 491, 490, 791, 191 through the impeller cavity inlet 451, 751, 151 pass the flow adjusting disc 489, 789, 189 into the impeller cavity 455, 755, 155 to a plurality of curved blades 263 of an impeller 264 of the rotor assembly unit 200. From there, the working fluid travels through the impeller cavity outlet opening 452, 752, 152, flow guiding plate 410, 710, 110, and water block set 910, 911, before exiting through the flow guiding plate 410, 710, 110, and outlet port 499, 498, 799, 199.

The disposition, design and functional efficiency of the impeller cavity inlet 451, 751, 151, impeller cavity 455, 755, 155, and impeller cavity outlet opening 452, 752, 152, along with the flow adjusting disc 489, 789, 189 being configured to decrease turbulence of the working liquid flowing into the impeller cavity 455, 755, 155 and the interrelated features of the water block cover 420, 421, 720, 120, contribute to the positional ability of the inlet and outlet ports 491, 499 and 791, 799, and 191, 199 to be on the same side and plane as the pump housing assembly 400, 401, 700, 900, while concurrently, provide sufficient head pressure and working liquid flow throughout the variable-part liquid cooling pumping unit 100, 101, 102, 500, 701, 103. More than one pump housing assembly 400, 401, 700, 900, more than one water block unit 300, 301, 600, 800, and more than one pump unit 400, 200, 201, 202 can be interchangeably mounted within the variable-part liquid cooling pumping unit 100, 101, 102, 500, 701, 103. Thus, one or more new pumps are not required when a required head is beyond the specifications of one pump and/or a required heat source area changes. Also, pump efficiency is not negatively influenced by horizontal or vertical positioning of a pump via the selectivity of choosing the most efficient pump housing assembly 400, 401, 700, 900 based on the disposition of the water block inlet through hole 432 and water block outlet through hole 429 or cover diversion opening 759, 159 and water block inlet through hole 732, 132, respectively, and the mounting of the impeller cavity outlet opening 452 and chamber body outlet opening 459 to the water block inlet through hole 432 and water block outlet through hole 429, respectively, or the impeller cavity inlet opening 753, 153 and impeller cavity outlet opening 752, 152 to the cover diversion opening 759, 159 and water block inlet through hole 732, 132, respectively, via corresponding annular wall and shouldered protrusions 456, 457 and 453, 458 453, 456, 458, 457 and 153, 156, 158, 157, respectively, or corresponding annular wall protrusions 756, 757 and shouldered indentations 653, 758, respectively. Pump specification variability through convenient interchangeability of the pump housing assembly 400, 401, 700, 900 in relation to time and mounting parts required, and availability for customization is provided. Variations between the pump housing assemblies may comprise, as an example, and not to be limiting, a variation in working liquid flow rate via increased volume of the impeller cavity 455, 755, 155 and/or via corresponding annular wall and shouldered protrusions 456, 457 and 453, 458 453, 456, 458, 457 and 153, 156, 158, 157, respectively, or corresponding annular wall protrusions 756, 757 and shouldered indentations 653, 758, respectively.

The presently disclosed inventive concepts are not intended to be limited to the embodiments shown herein, but are to be accorded their full scope consistent with the principles underlying the disclosed concepts herein. Directions and references to an element, such as "up," "down,", "upper," "lower," "horizontal," "vertical," "left," "right," and the like, do not imply absolute relationships, positions, and/or orientations. Terms of an element, such as "first" and "second" are not literal, but, distinguishing terms. As used herein, terms "comprises" or "comprising" encompass the notions of "including" and "having" and specify the presence of elements, operations, and/or groups or combinations thereof and do not imply preclusion of the presence or addition of one or more other elements, operations and/or groups or combinations thereof. Sequence of operations do not imply absoluteness unless specifically so stated. Reference to an element in the singular, such as by use of the article "a" or "an", is not intended to mean "one and only one" unless specifically so stated, but rather "one or more". As used herein, "and/or" means "and" or "or", as well as "and" and "or." As used herein, ranges and subranges mean all ranges including whole and/or fractional values therein and language which defines or modifies ranges and subranges, such as "at least," "greater than," "less than," "no more than," and the like, mean subranges and/or an upper or lower limit. All structural and functional equivalents to the elements of the various embodiments described throughout the disclosure that are known or later come to be known to those of ordinary skill in the relevant art are intended to be encompassed by the features described and claimed herein. Moreover, nothing disclosed herein is intended to be dedicated to the public regardless of whether such disclosure may ultimately explicitly be recited in the claims. No element or concept disclosed herein or hereafter presented shall be construed under the provisions of 35 USC 112f unless the element or concept is expressly recited using the phrase "means for" or "step for".

In view of the many possible embodiments to which the disclosed principles can be applied, we reserve the right to claim any and all combinations of features and acts described herein, including the right to claim all that comes within the scope and spirit of the foregoing description, as well as the combinations recited, literally and equivalently, in the following claims and any claims presented anytime throughout prosecution of this application or any application claiming benefit of or priority from this application.

What is claimed is:

1. A liquid cooling pumping unit, comprising:
   a water block unit comprising:
      a water block set;
      a water block cover assembled to the water block set, the water block cover comprising a flow guiding plate surface having a funnel-shaped indentation therein, a chamber body surface opposite the flow guiding plate surface, a water block inlet through hole disposed at a narrowest end of the funnel-shaped indentation, and a water block outlet through hole disposed near to the water block inlet through hole; and
      a flow guiding plate, assembled to and communicating with and between the water block set and water block cover; and
   a pump unit comprising:
      a pump housing assembly having a chamber body mounted to and communicating with the water block cover opposite the water block set, the chamber body comprising an impeller cavity having a diameter, an impeller cavity outlet opening communicating with the impeller cavity and water block cover, and a flow adjusting disc opposite the water block cover; and
      a rotor assembly unit, assembled to the chamber body opposite the water block cover, configured to increase a pressure and a flow of a working liquid flowing through the water block unit,
   wherein an inlet port and an outlet port of the liquid cooling pumping unit is positioned on a same side of the pump housing assembly,
   wherein the flow adjusting disc is configured to decrease turbulence of the working liquid flowing into the impeller cavity, and
   wherein the water block inlet through hole communicates with the impeller cavity outlet opening and flow guiding plate, and the water block outlet through hole communicates with the flow guiding plate and outlet port, and
   whereby a working fluid flows through the inlet port, into the impeller cavity, through the chamber body, and through the water block cover via the water block inlet through hole, and through the flow guiding plate, and into, throughout and out of the water block set, and through the flow guiding plate, and through the water block cover via the water block outlet through hole, and through the chamber body, to the outlet port.

2. The liquid cooling pumping unit of claim 1, wherein the water block set comprises a water block base and a fin plate, the water block base having a base cavity comprising a width, including heat transfer surface features thereon, the fin plate having a longitudinal split fin opening therethrough, positioned longitudinally on the heat transfer surface features, wherein the working fluid flows through the longitudinal split fin opening and through the heat transfer surface features, and wherein the water block set is in direct or indirect contact with a heat source opposite the base cavity.

3. The liquid cooling pumping unit of claim 1, wherein the rotor assembly unit comprises a stator assembly, an impeller having a plurality of curved blades, mounted to a shaft, and a rotor housing having a stator cavity and an impeller annular cavity opposite the stator cavity, the stator assembly drives the impeller, the stator assembly is mounted in the stator cavity, and the impeller is mounted in the impeller annular cavity with the plurality of curved blades, whereby when the rotor assembly unit is assembled to the chamber body, the plurality of curved blades is assembled and rotatable in the impeller cavity.

4. The liquid cooling pumping unit of claim 2, wherein the pump housing assembly is a first pump housing assembly, and the inlet port and the outlet port are integrally formed with the chamber body, and configured for mounting of at least one of a spout, or conduit, or any combination of the foregoing thereto, whereby the working fluid flows through the inlet port, into the impeller cavity and through the chamber body, water block cover, and flow guiding plate, respectively, and into, throughout and out of the water block set, and through the flow guiding plate, water block cover and outlet port, respectively.

5. The liquid cooling pumping unit of claim 4, wherein the chamber body further comprises a water block cover surface opposite the impeller cavity, an impeller cavity inlet communicating with the inlet port and impeller cavity, and a chamber body outlet opening communicating with the water block cover and outlet port, whereby the working fluid flows through the inlet port, into the impeller cavity via the impeller cavity inlet and through the chamber body via the impeller cavity outlet opening, and through the water block cover, and flow guiding plate, respectively, and into, throughout and out of the water block set, and through the flow guiding plate and water block cover, respectively, and through the chamber body via the chamber body outlet opening, to the outlet port.

6. The liquid cooling pumping unit of claim 2, wherein the flow guiding plate comprises a water block surface, a water block cover mounting surface having a funnel-shaped outlined wall protruding therefrom, opposite the water block surface, communicating with the water block inlet through hole, a longitudinal split through hole, disposed at a widest end of the funnel-shaped outlined wall, communicating with the water block set and water block inlet through hole, and a flow guiding plate outlet, disposed near to a narrowest end of the funnel-shaped outlined wall, communicating with the water block set and water block outlet through hole, the funnel-shaped outlined wall corresponding to the funnel-shaped indentation, and the longitudinal split through hole corresponding to the longitudinal split fin opening, whereby the working fluid flows through the inlet port, into the impeller cavity, through the chamber body, and water block cover, respectively, and through the flow guiding plate via within the funnel-shaped outlined wall through the longitudinal split through hole, and into, throughout and out of the water block set, and through the flow guiding plate via the flow guiding plate outlet, and through the water block cover, and through the chamber body, to the outlet port.

7. The liquid cooling pumping unit of claim 6, wherein the water block unit is a first water block unit and the width of the base cavity is a first width and the pump unit is a first pump unit and the diameter of the impeller cavity is a first diameter, whereby the first width is shorter than the first diameter.

8. The liquid cooling pumping unit of claim 1, wherein the chamber body, water block cover, flow guiding plate, and rotor assembly unit comprises at least one of a metal, plastic, or metal coated material, or any combination of the foregoing, and the water block set comprises at least one of an aluminum, copper, aluminum-alloy, or copper-alloy material, or any combination of the foregoing.

* * * * *